US008051772B2

(12) United States Patent
Bourrières et al.

(10) Patent No.: US 8,051,772 B2
(45) Date of Patent: Nov. 8, 2011

(54) SUPPORT SYSTEM AND METHOD FOR A SCREEN PRINTING UNIT

(75) Inventors: Francis Bourrières, Montauban (FR); Clément Kaiser, Montauban (FR); Richard Andre Piatek, Dorset (GB); Andrew Dean Ure, Dorset (GB); Mark Alfred Whitmore, Dorset (GB)

(73) Assignee: Novatec SA, Montauban (FR)

( * ) Notice: Subject to any disclaimer, the term of this patent is extended or adjusted under 35 U.S.C. 154(b) by 23 days.

(21) Appl. No.: 12/371,949

(22) Filed: Feb. 17, 2009

(65) Prior Publication Data
US 2009/0211471 A1  Aug. 27, 2009

(51) Int. Cl.
*B05C 17/06* (2006.01)
(52) U.S. Cl. ............ 101/127.1; 101/123; 101/129
(58) Field of Classification Search .......... 101/114, 101/115, 123, 124, 126, 127.1, 129; 38/102, 38/102.1, 102.4, 102.5, 102.7, 102.91
See application file for complete search history.

(56) References Cited

U.S. PATENT DOCUMENTS

| | | | |
|---|---|---|---|
| 2,818,803 A | 1/1958 | Levorson | |
| 3,381,820 A | 5/1968 | Cecka | |
| 4,254,707 A | 3/1981 | Lambert et al. | |
| 4,267,773 A | 5/1981 | Scherp et al. | |
| 4,957,044 A * | 9/1990 | Cronin | 101/35 |
| 5,111,743 A | 5/1992 | Umaba et al. | |
| 5,152,219 A | 10/1992 | Adachi et al. | |
| 5,174,201 A | 12/1992 | Andris et al. | |
| 5,271,171 A * | 12/1993 | Smith | 38/102.5 |
| 5,463,948 A | 11/1995 | Newman | |
| 5,623,872 A | 4/1997 | Tomomatsu | |
| 6,053,101 A | 4/2000 | Hix | |
| 6,067,903 A | 5/2000 | Williams | |
| 6,129,014 A | 10/2000 | Tani | |

FOREIGN PATENT DOCUMENTS

| | | |
|---|---|---|
| GB | 2364961 | 2/2002 |
| JP | 01-278347 | 11/1989 |
| JP | U-2-19532 | 2/1990 |
| JP | 03-075148 | 3/1991 |
| JP | 07-214748 | 8/1995 |
| JP | 10-193560 | 7/1998 |
| JP | 10-284829 A | 10/1998 |
| JP | 11-245375 | 9/1999 |
| JP | 11-320821 A | 11/1999 |
| WO | 93-25061 | 12/1993 |
| WO | 9325061 | 12/1993 |

OTHER PUBLICATIONS

International Search Report for corresponding application No. PCT/GB2003/02561 completed Oct. 29, 2003.

\* cited by examiner

*Primary Examiner* — Ren Yan
(74) *Attorney, Agent, or Firm* — Renner, Otto, Boisselle & Sklar, LLP

(57) ABSTRACT

A support system and method for supporting a printing screen unit in a screen printing machine. The support system includes a support assembly comprising a support unit for supporting a printing screen unit comprising a printing screen including printing apertures through which printing medium is printed onto a workpiece; and a tensioning mechanism for tensioning the printing screen in a screen printing operation, wherein the tensioning mechanism is configured to tension the printing screen to a first tension in a printing phase in printing printing medium onto a workpiece and a second tension, which is lower than the first tension, in a separation phase in separating the printing screen unit and the workpiece. Other aspects also are disclosed.

32 Claims, 42 Drawing Sheets

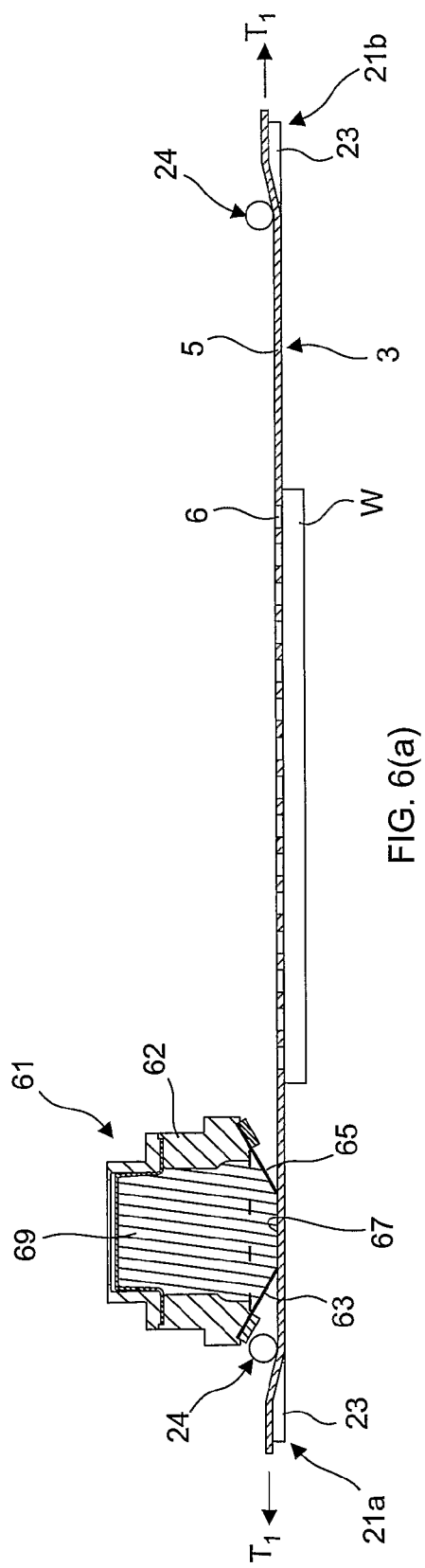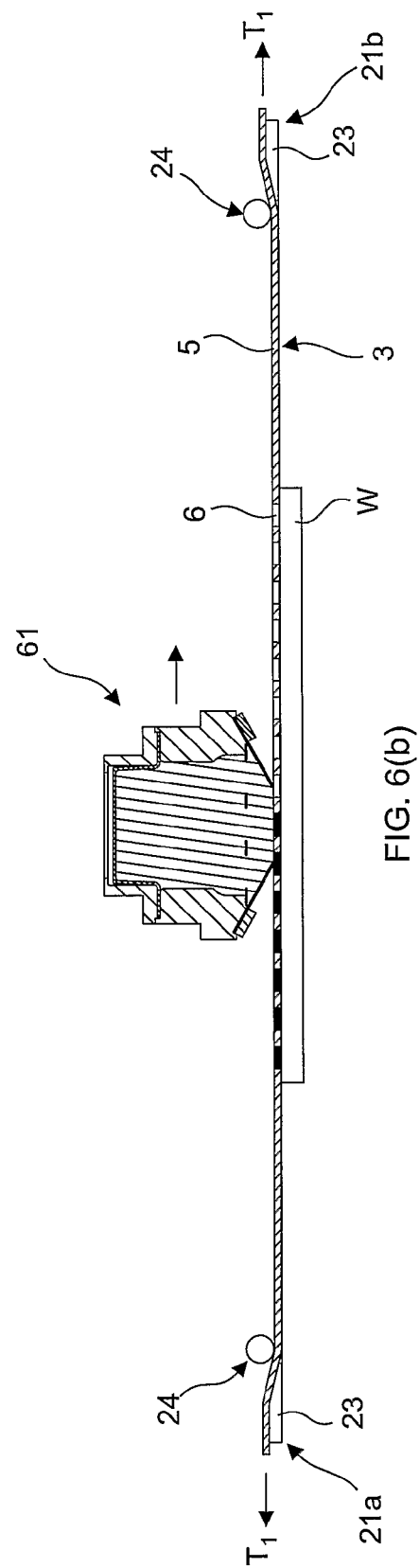
FIG. 6(a)
FIG. 6(b)

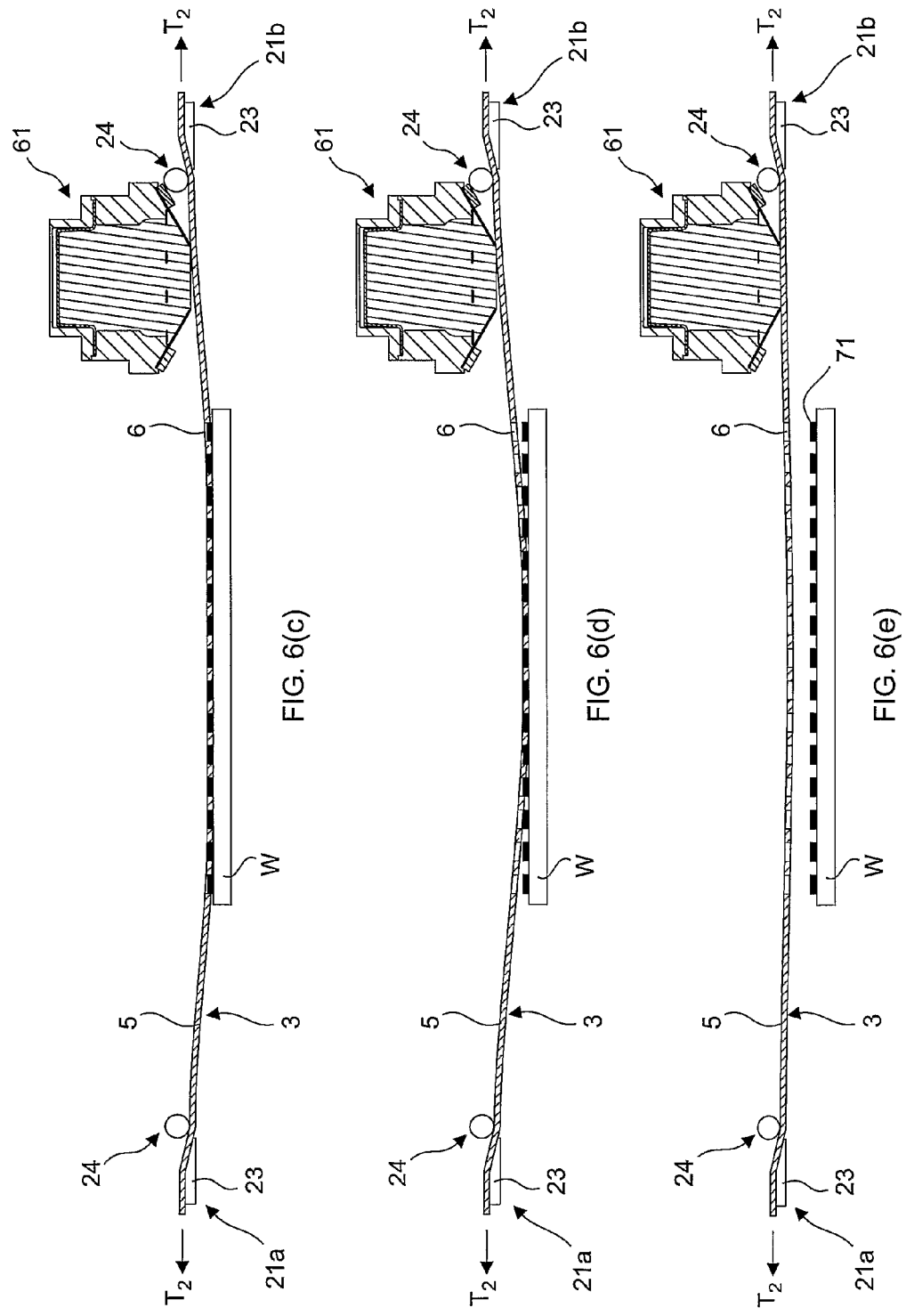

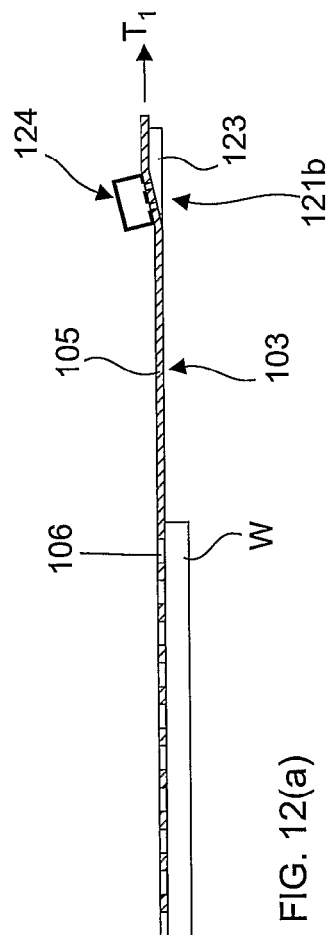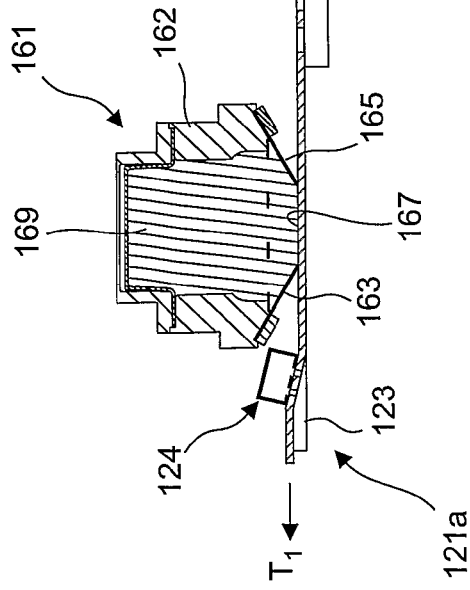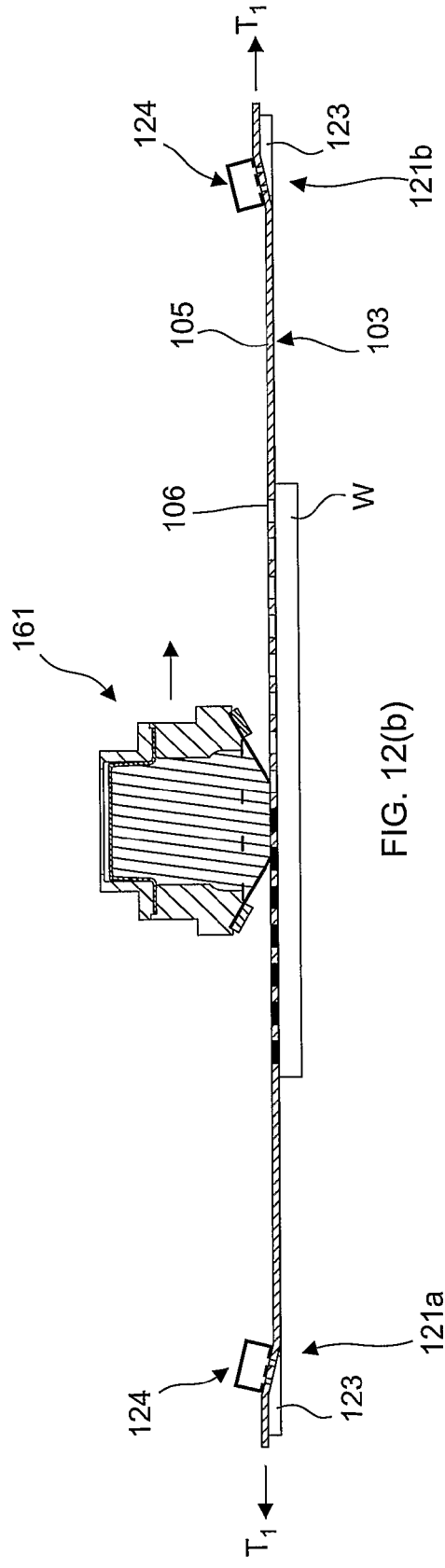
FIG. 12(a)
FIG. 12(b)

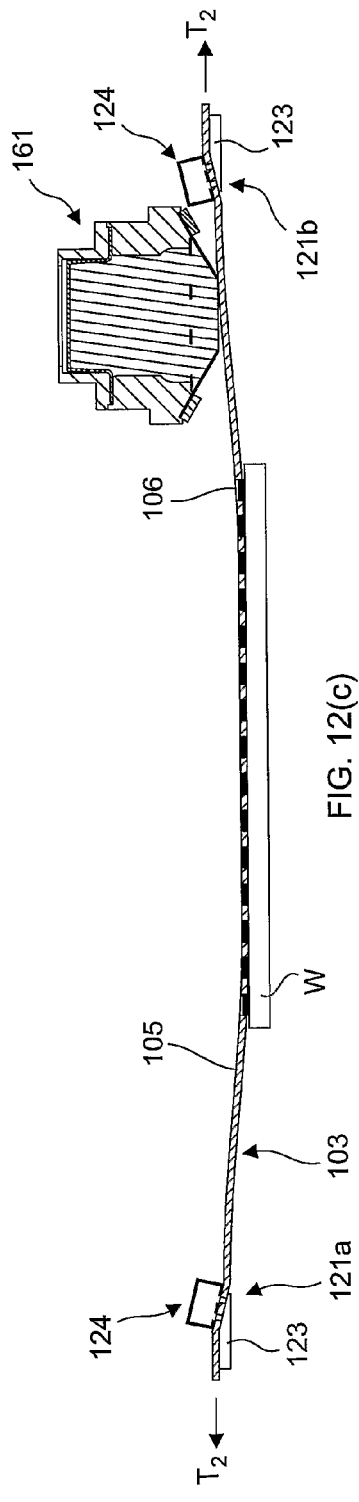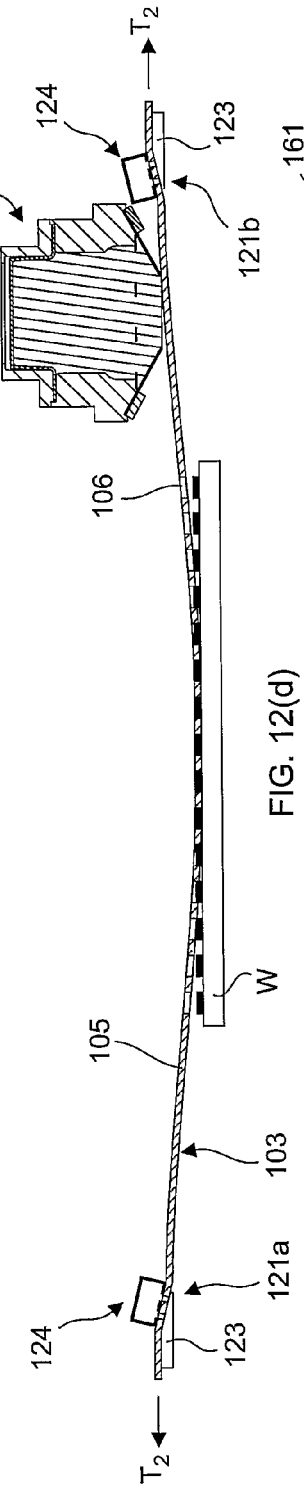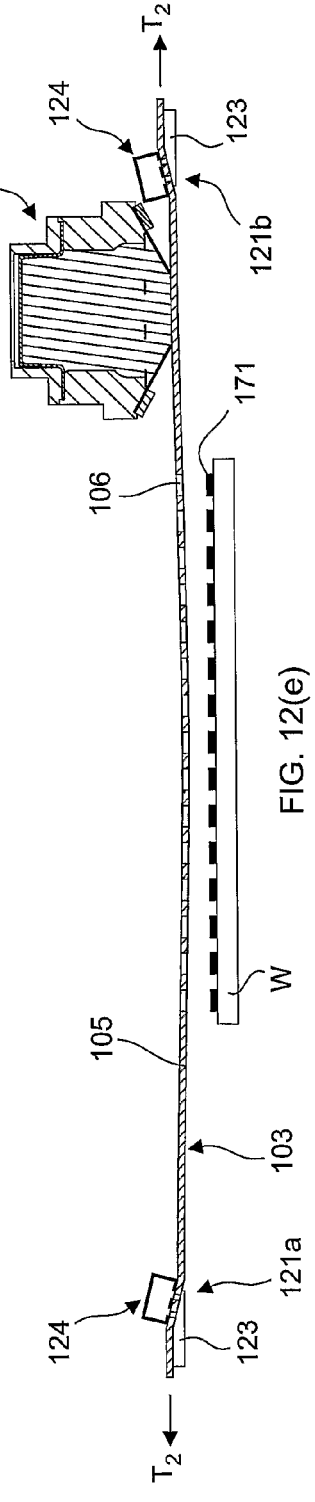

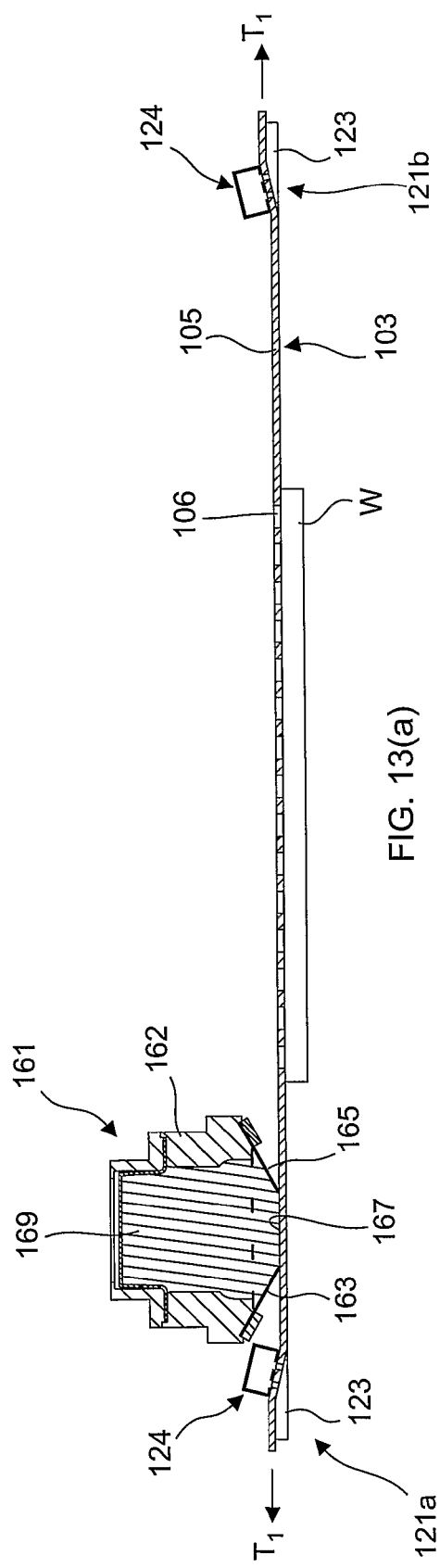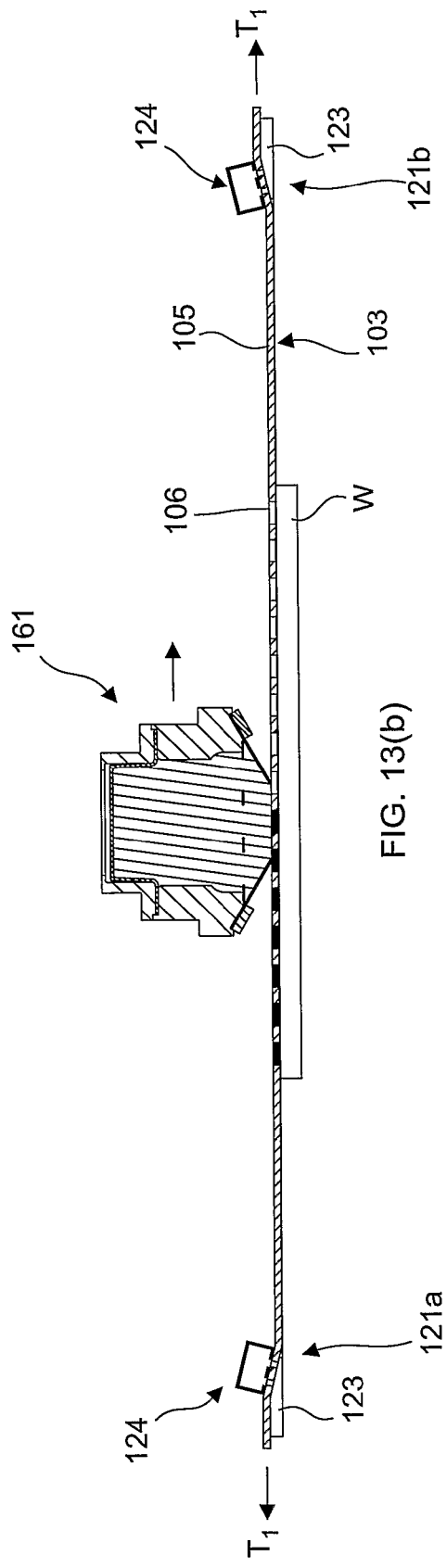

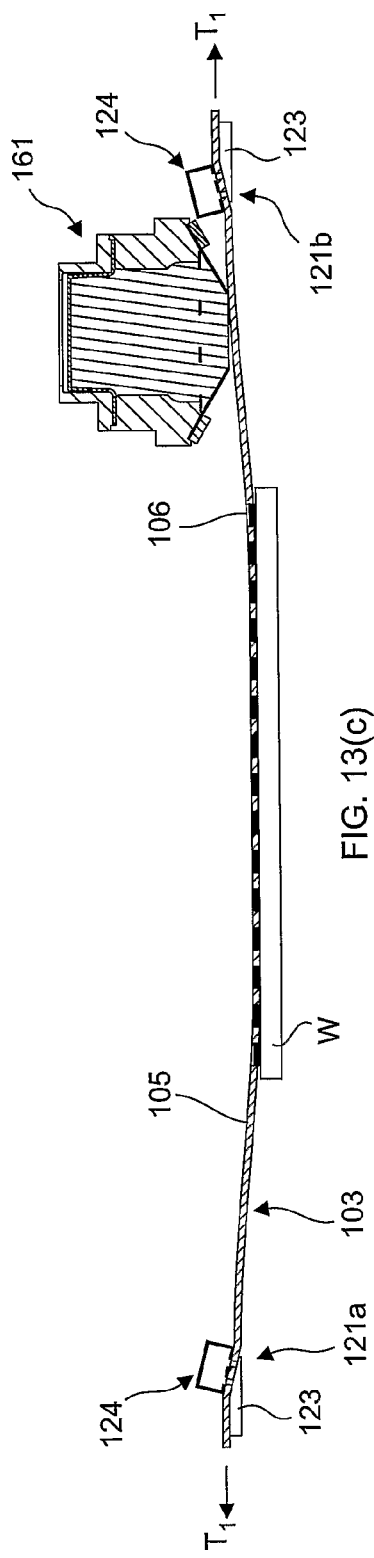
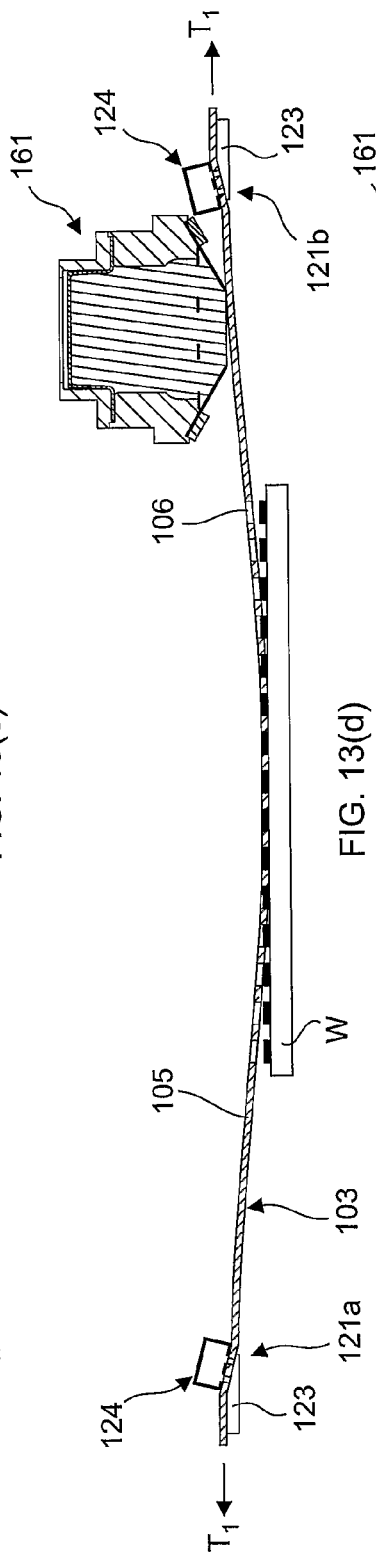
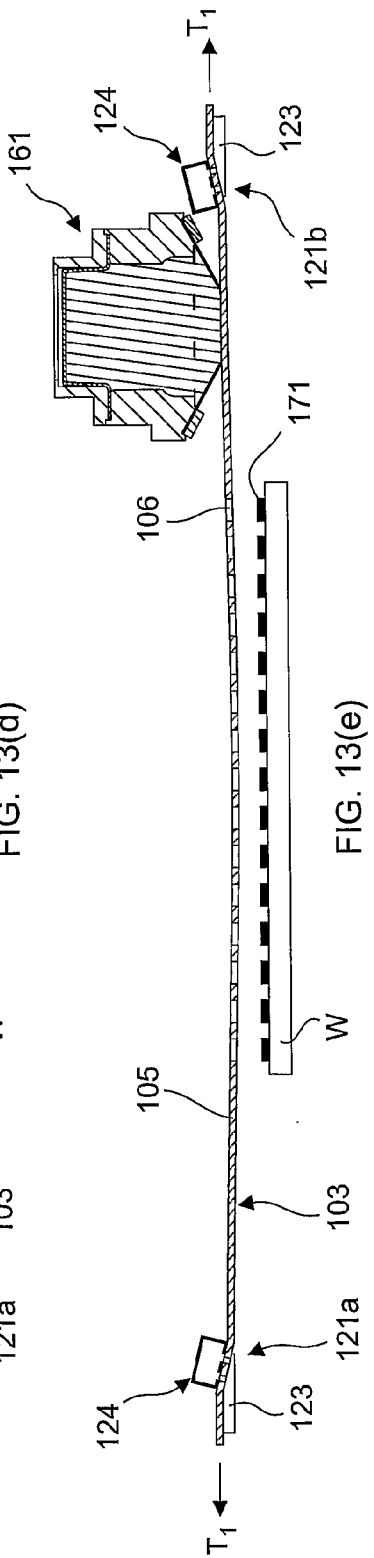
FIG. 13(c)
FIG. 13(d)
FIG. 13(e)

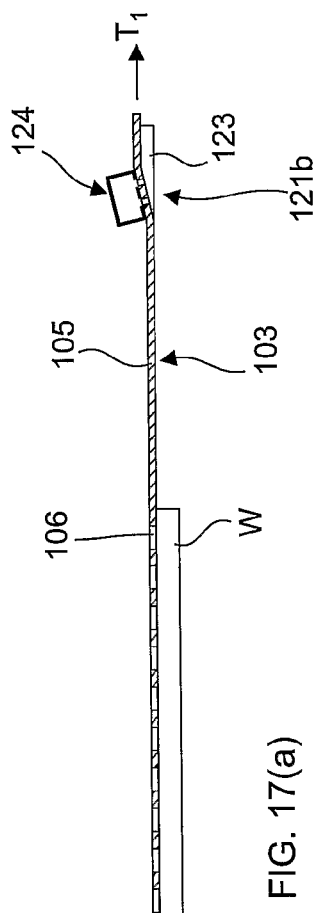
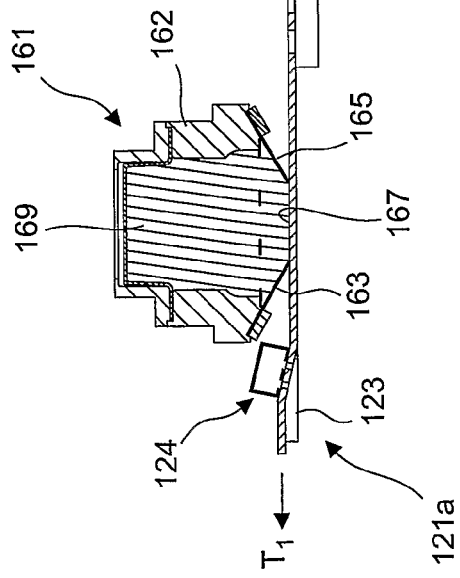
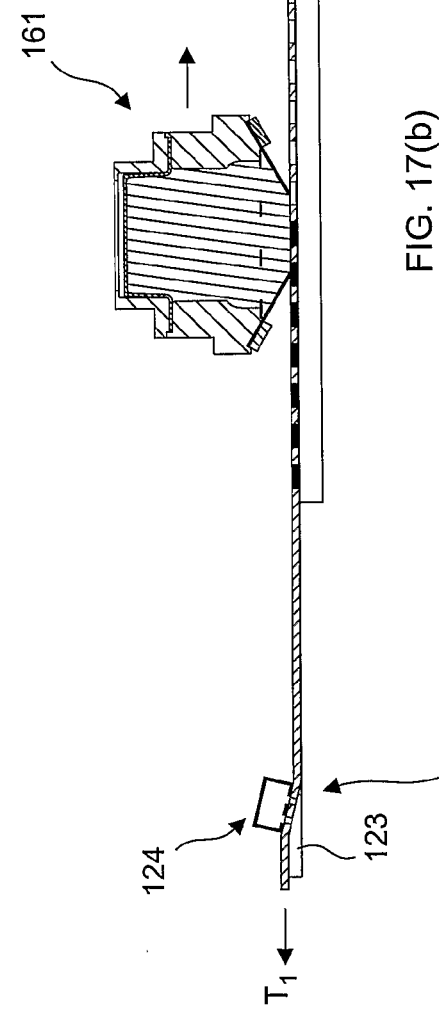
FIG. 17(a)
FIG. 17(b)

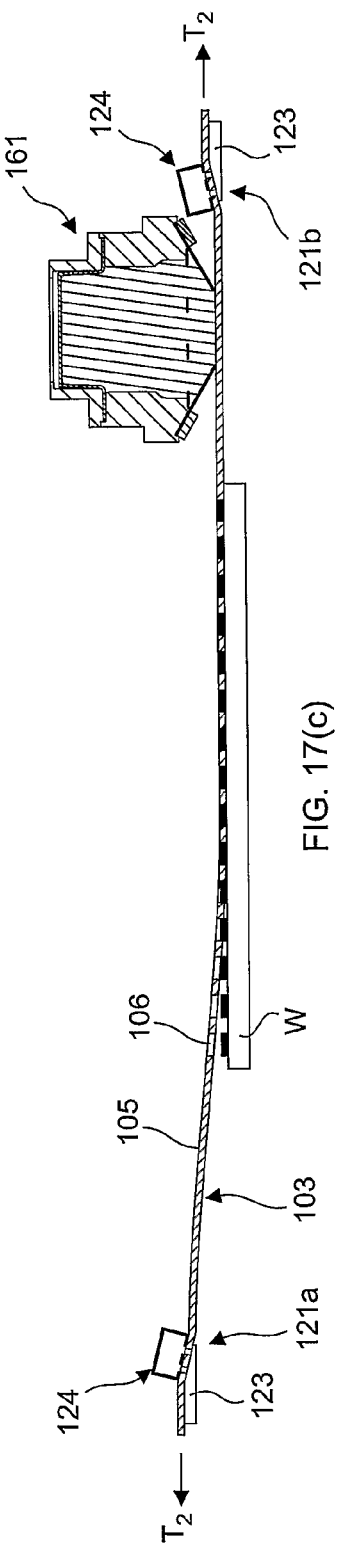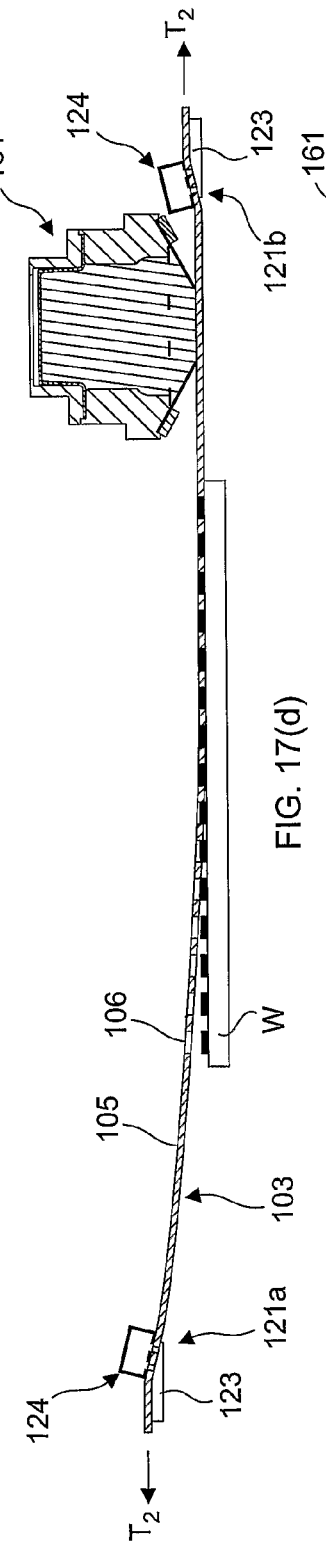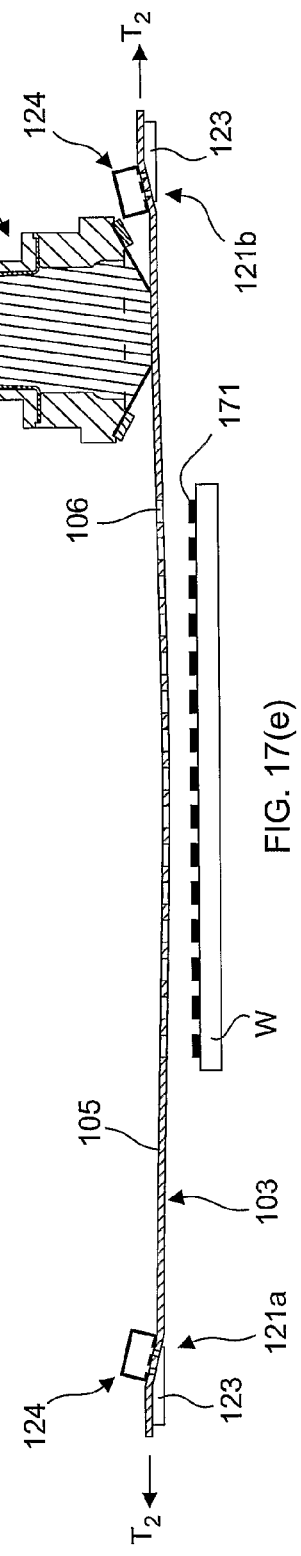

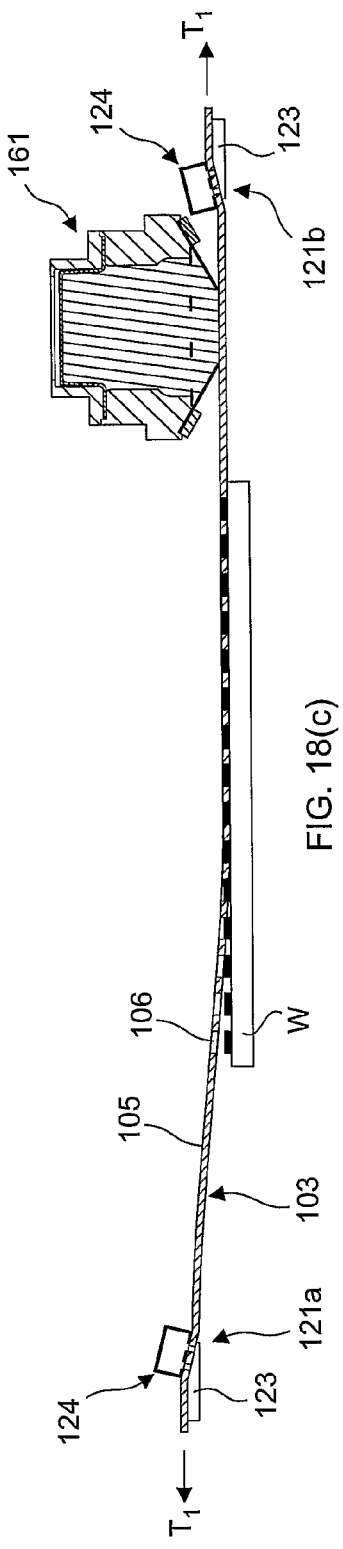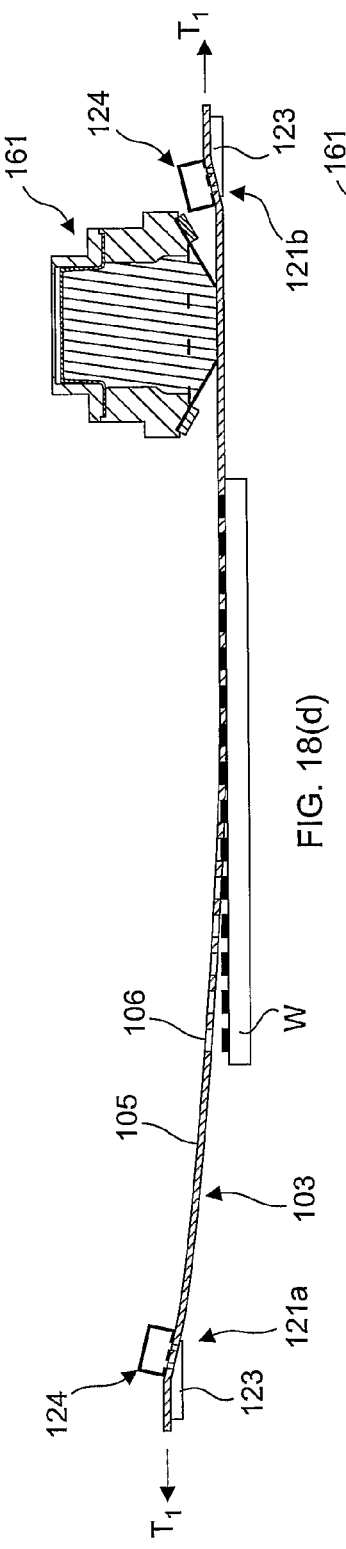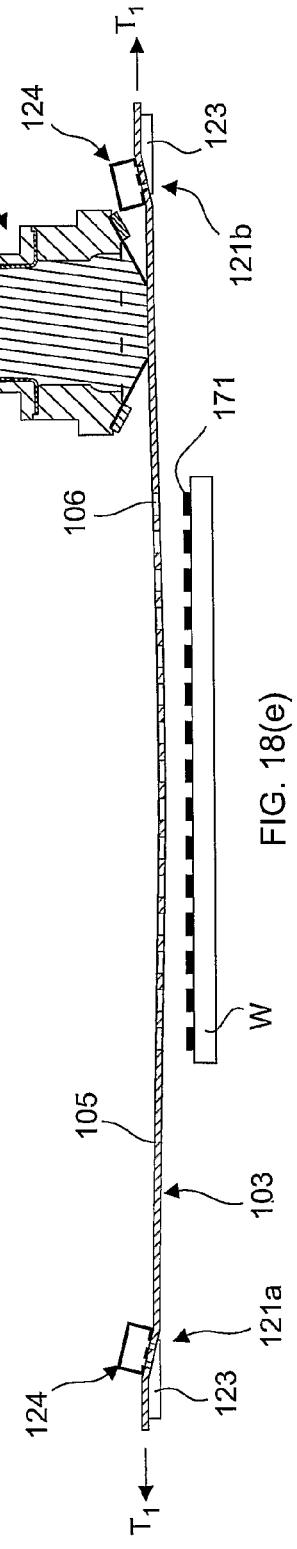

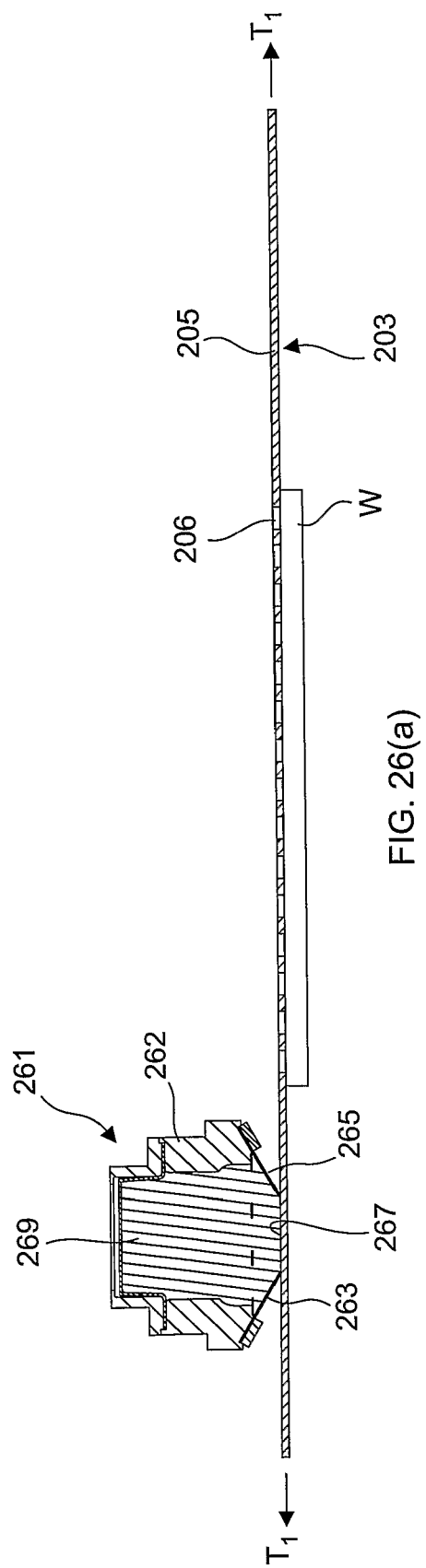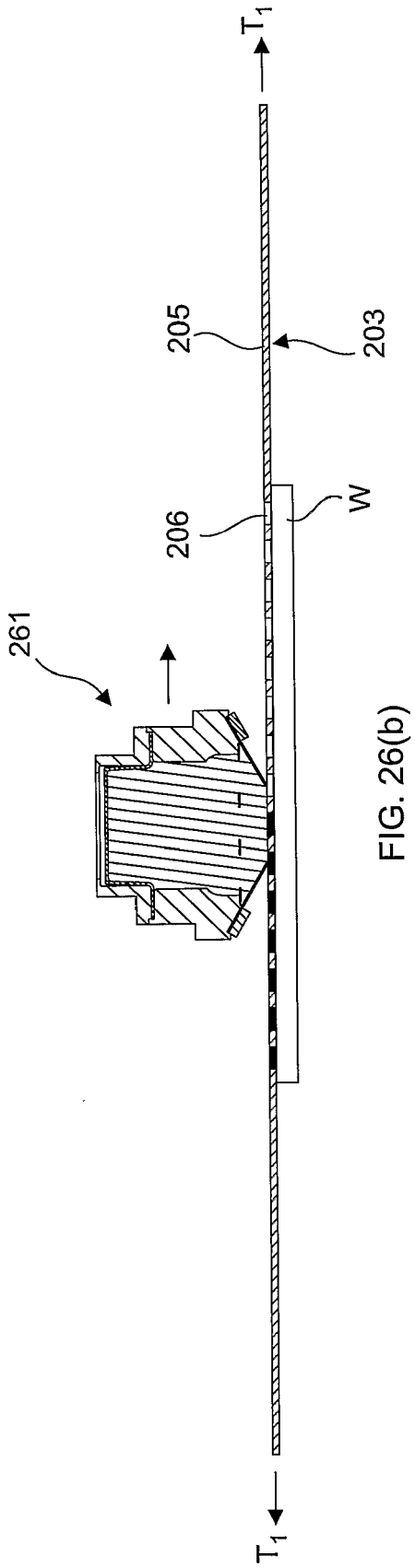

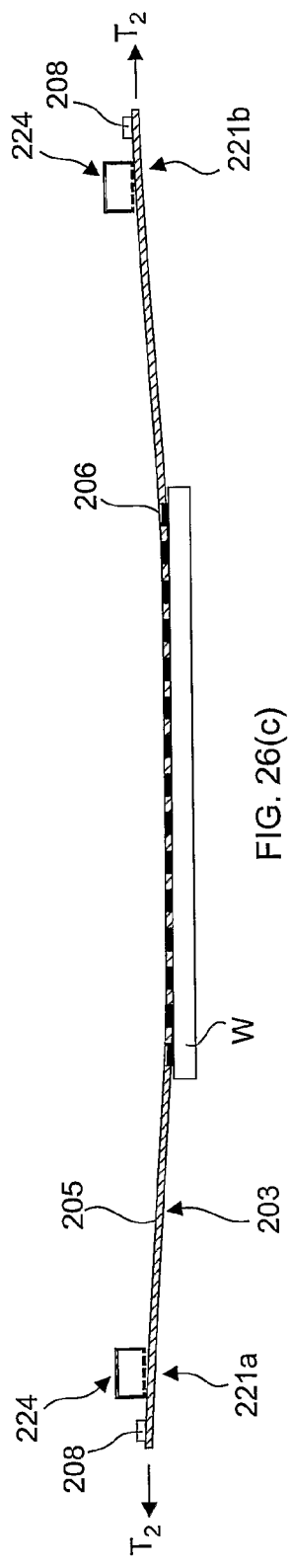
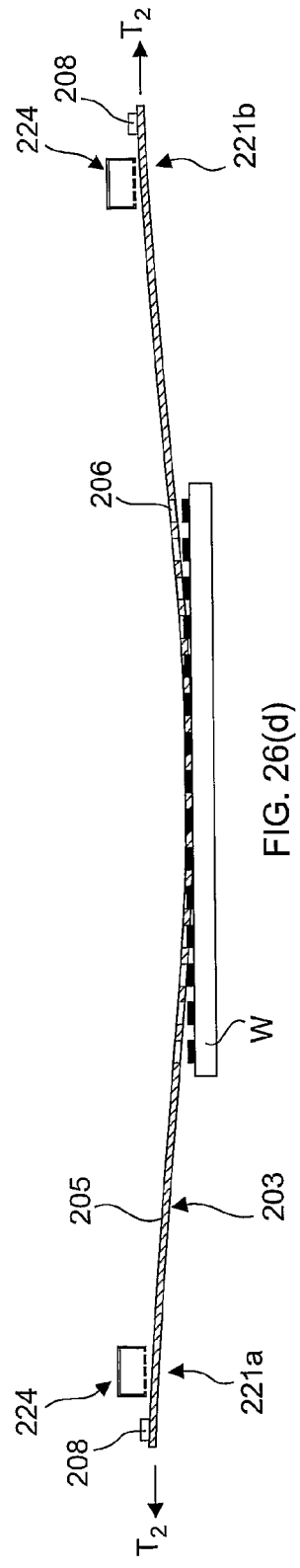
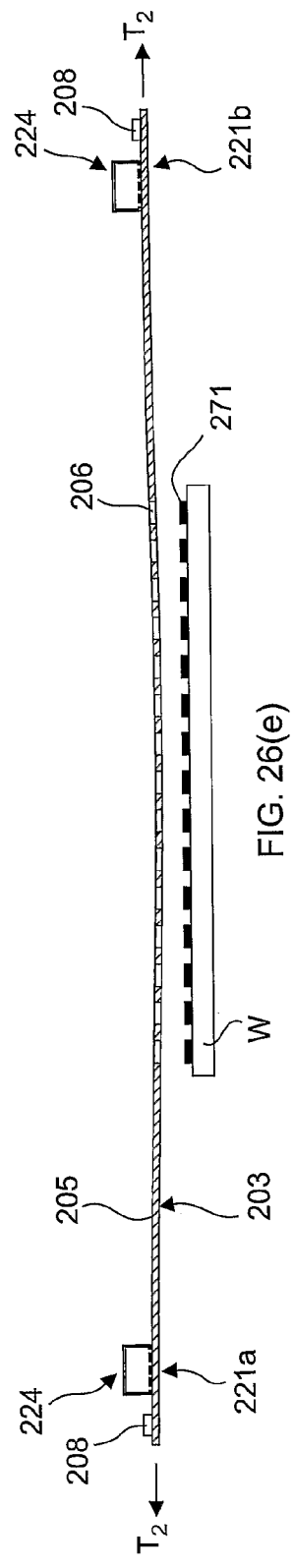

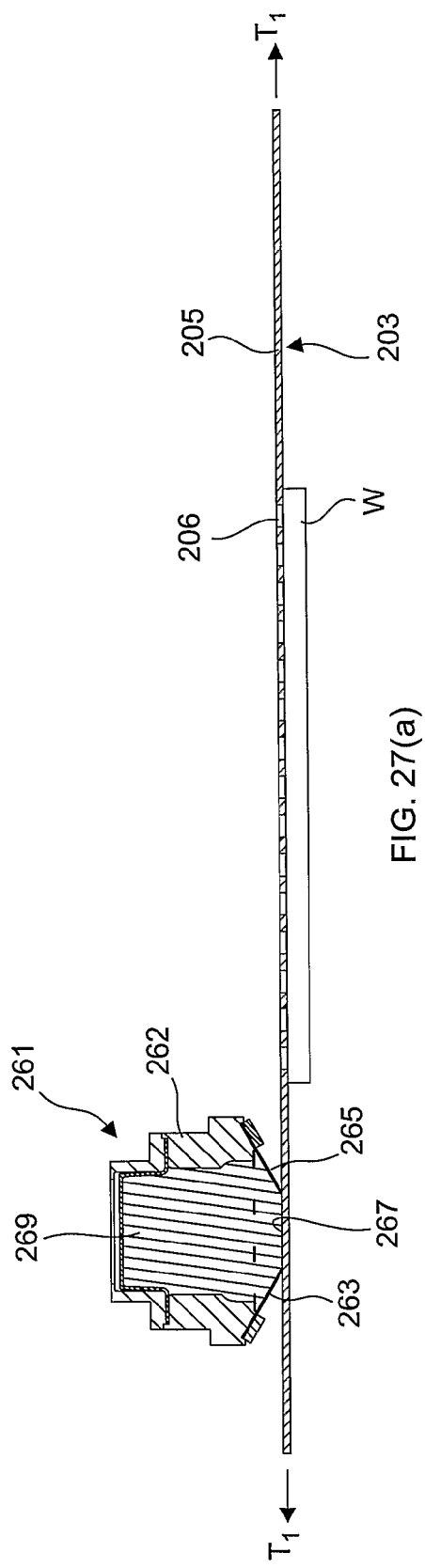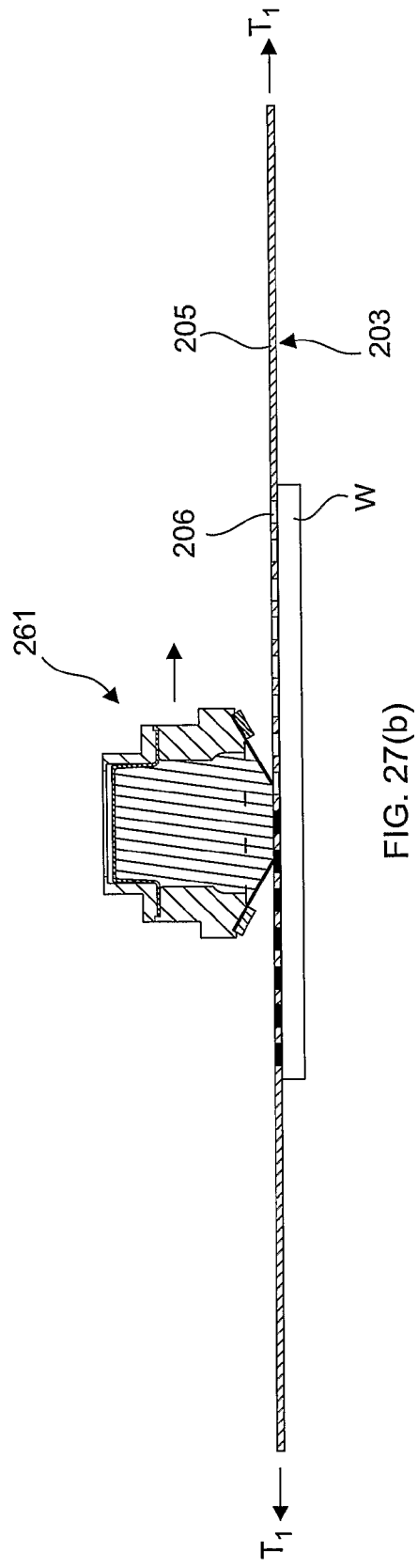

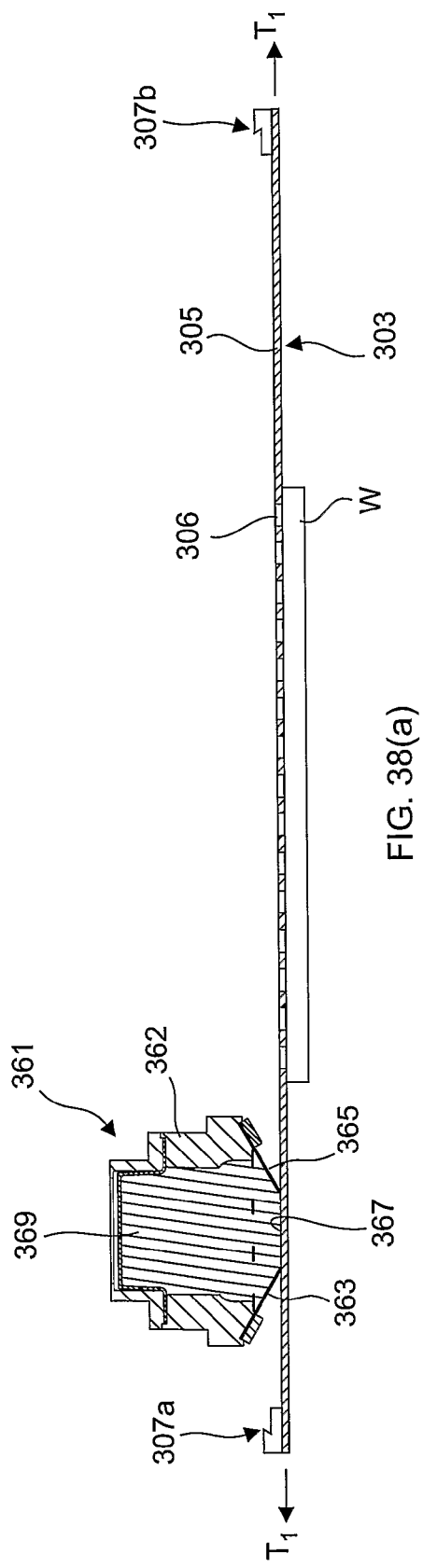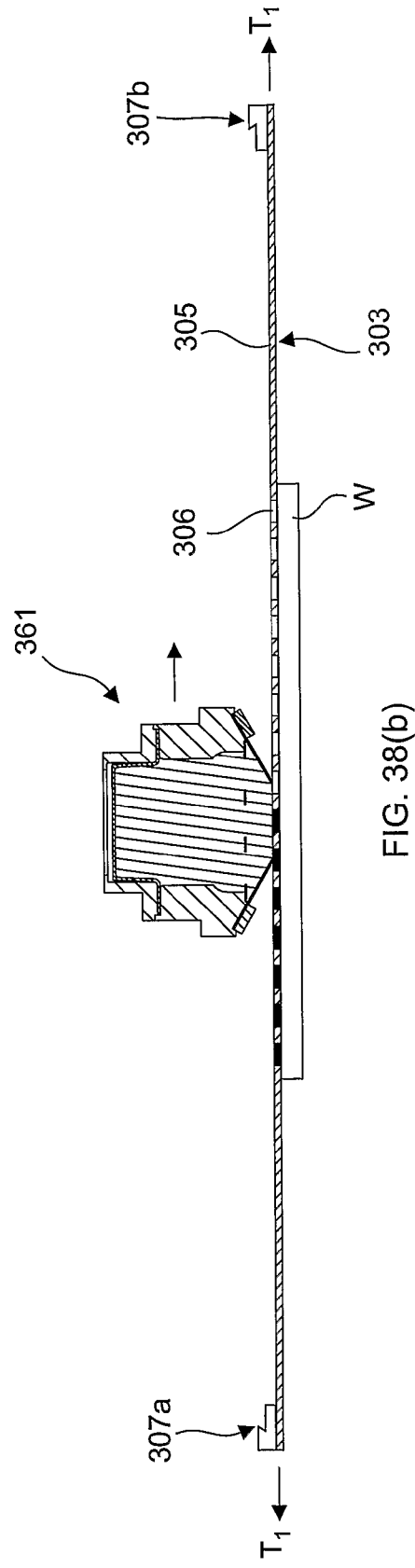

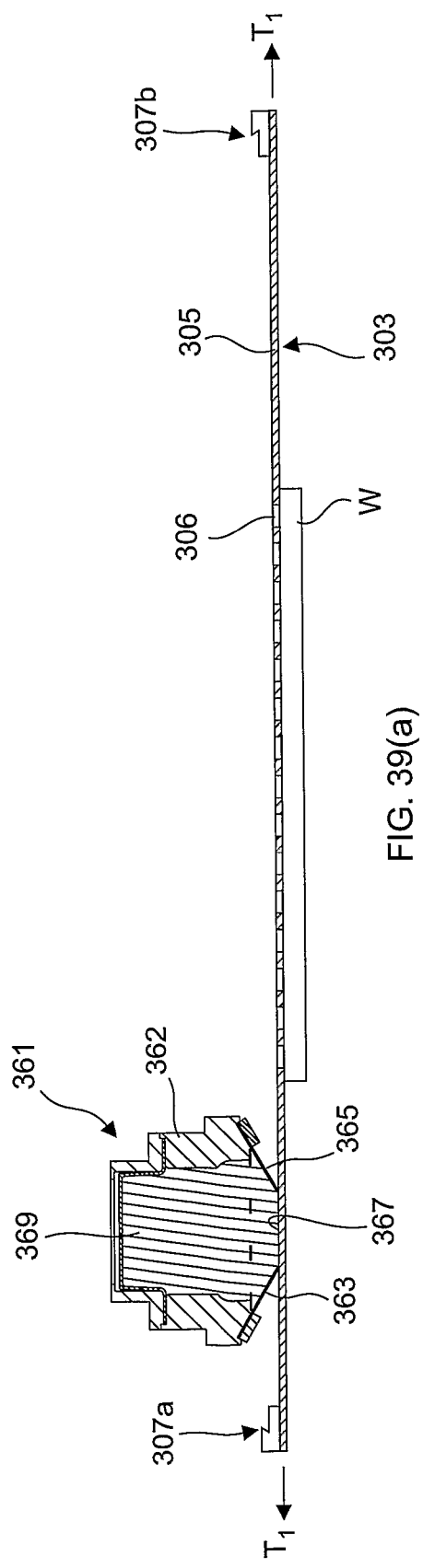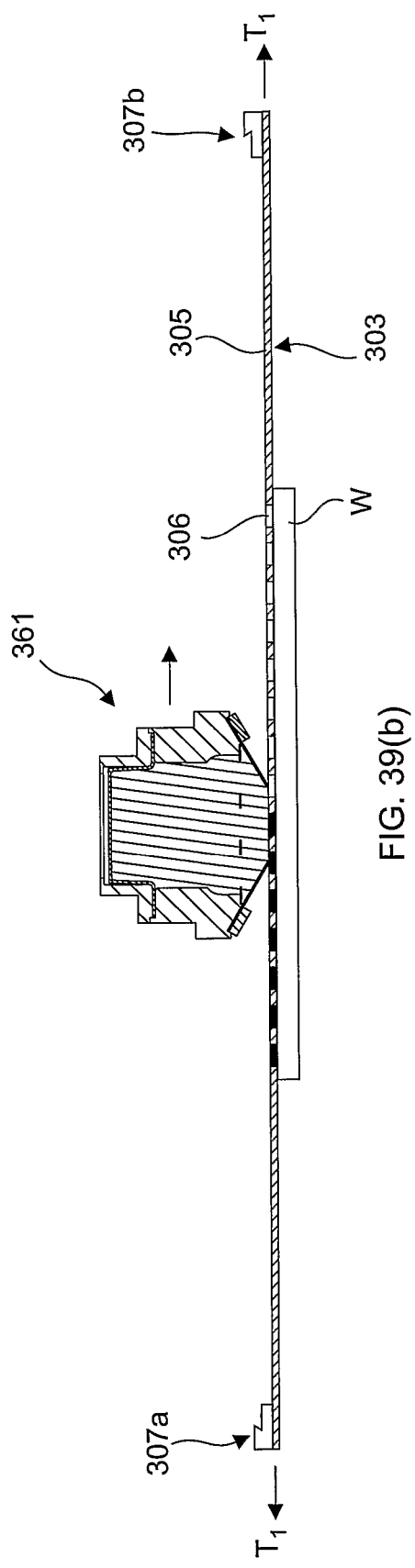
FIG. 39(a)
FIG. 39(b)

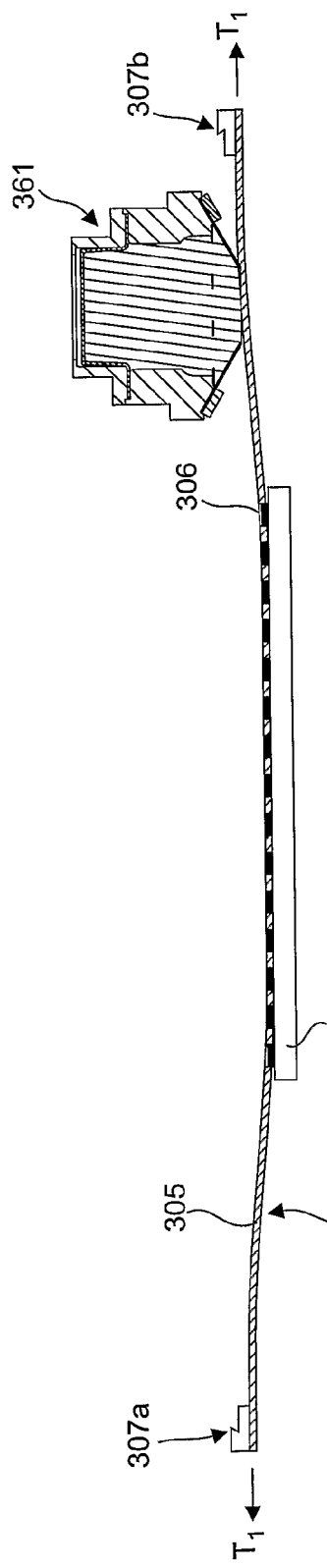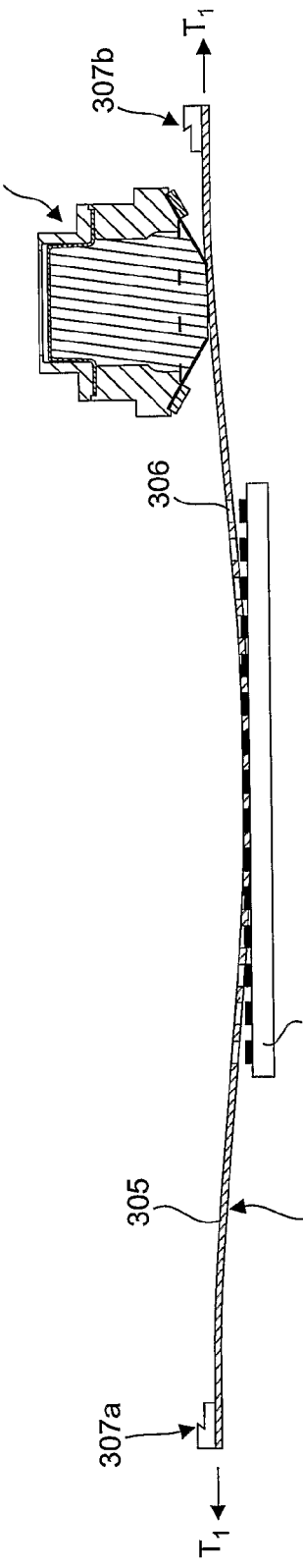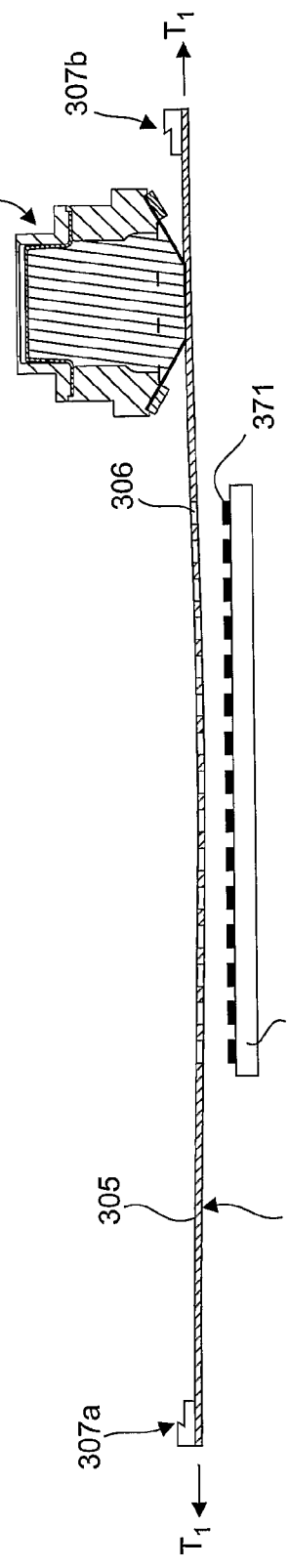

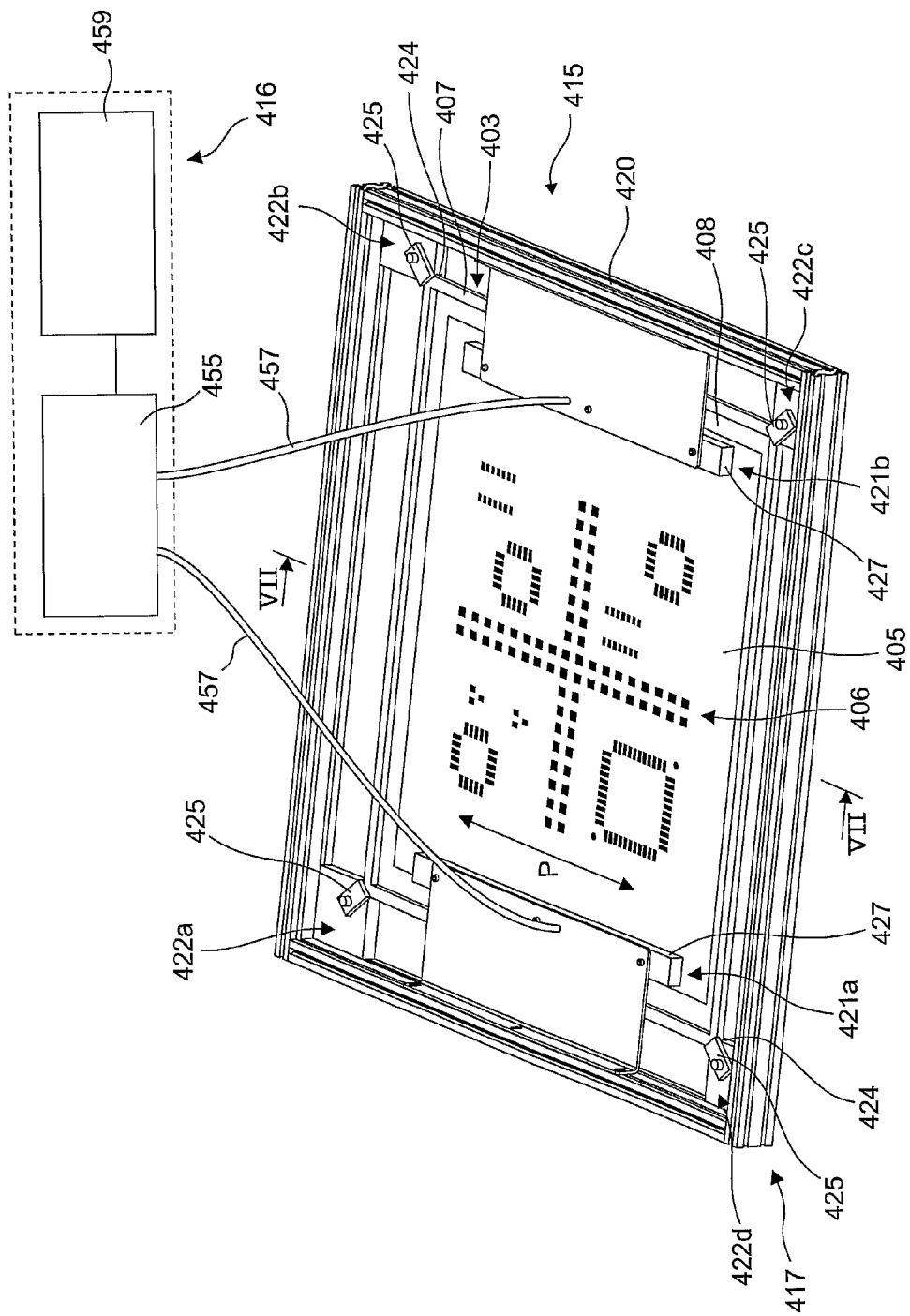

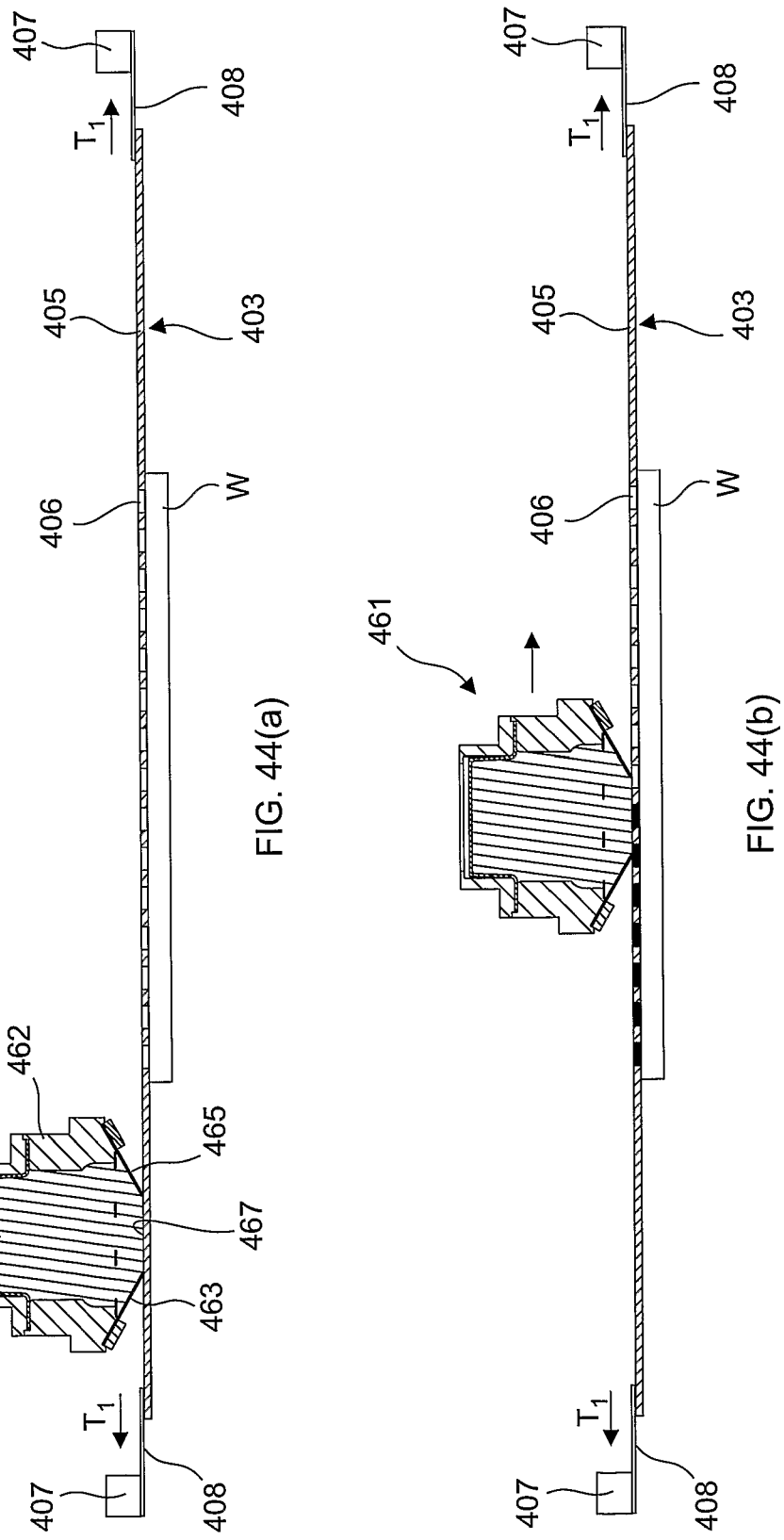

SUPPORT SYSTEM AND METHOD FOR A SCREEN PRINTING UNIT

RELATED APPLICATION DATA

This application claims priority of U.S. Non Provisional application Ser. No. 10/517,550 filed Dec. 10, 2004, which is hereby incorporated herein by reference in it's entirety.

The present invention relates to a support system for and a method of supporting a printing screen unit comprising a printing screen, often alternatively referred to as a printing stencil, in a screen printing operation.

A printing screen includes a pattern of printing apertures which defines the pattern of deposits to be printed in a screen printing operation, with the printing screen being located over a workpiece to be printed and printing medium being forced through the printing apertures to provide the required print.

For many printing applications, typically in printing workpieces with viscous printing materials, such as electronic circuit boards with solder paste, the printing screen comprises a thin sheet, typically a metal or plastics sheet, which includes a plurality of printing apertures which define a pattern for the printing of deposits of a printing medium.

In existing screen printing machines, the printing screens are tensioned to a very high tension to prevent lateral, that is, in-plane, movement during the printing phase of a screen printing operation.

In one existing tensioning system, the printing screen is mounted to a rigid frame by a woven fabric which acts to tension the printing screen to the required high tension. In mounting the printing screen, a woven fabric is stretched to the required high tension over a rigid frame and bonded thereto, and the periphery of the printing screen is bonded to the stretched fabric which is then removed in the operative region of the printing screen to maintain the printing screen under the required tension.

In another tensioning system, the printing screen is mounted to a rigid frame by mechanical tensioning mechanisms which engage fixing apertures at the periphery of the printing screen and act to tension the printing screen to the required high tension, with the tensioning force typically being provided by hydraulic, pneumatic or spring means.

WO-A-93/25061 discloses one tensioning system in which the printing screen includes a plurality of elongate slots, as the fixing apertures, along each of opposite edges thereof, and the tensioning mechanisms each include a set of teeth which engage the slots at respective ones of the opposite edges of the printing screen to tension the printing screen to the required high tension, with the tensioning mechanisms being configured to draw respective ones of the opposite edges of the printing screen over respective supporting edges of the frame and thereby maintain the printing screen at the required high tension.

GB-A-2364961 discloses another tensioning system in which the printing screen includes a plurality of first, fixing apertures along each of opposite edges thereof which are engaged by respective tensioning mechanisms, and a plurality of second, flexing apertures along each of the opposite edges thereof which extend inwardly of the respective fixing apertures and provide for regions of increased flexibility, with the tensioning mechanisms being configured to draw respective ones of the opposite edges of the printing screen over respective supporting edges of the frame and thereby maintain the printing screen at the required high tension.

The printing of workpieces using printing screens tensioned by the existing tensioning systems can, however, be problematic as a result of requiring a high separation force to separate a workpiece from a printing screen, and the consequential out-of-plane deflection of the printing screen.

A high separation force is required to separate a printing screen from a workpiece because of the adhesive effect of the printing medium, with the printing medium in the printing apertures adhering both to the underlying workpiece and the edges of the printing apertures. This is particularly the case for printing screens which include increased numbers of printing apertures, and especially where the printing apertures are of smaller size and hence have an increased edge-to-area ratio, as is the current trend.

Notwithstanding that the printing screens are very highly tensioned for the purpose of maintaining the printing screens in a planar configuration, the separation force required to separate a printing screen from a workpiece is so great as to cause the printing screen to flex, with the separation of the printing screen from the workpiece being effected in part as a peeling action from the periphery to the center of the printing screen.

This out-of-plane deflection of the printing screen creates localized stresses in the printing screen at the peeling fronts. These stresses cause micro-displacement of the printing screen, which acts to cause deformation, notably shearing, of the printed deposits at the peeling fronts in separating the printing screen from the workpiece. In addition, these stresses can act to cause localized deformation of the printing screen, particularly the very thin printing screens as used in wafer bumping, with this deformation acting to wrinkle the printing screen. As will be understood, wrinkled printing screens cannot provide for high-quality prints; printing screens being required to present an essentially flat surface to workpieces.

Furthermore, as a result of the very high tension applied to the printing screens, the separation of a printing screen from a workpiece is uncontrolled over the separation phase, and thereby does not provide for efficient transfer of printing medium from printing apertures over the entire area of the printing screen. Indeed, at the point where peeling of the printing screen has occurred to such an extent that the separation force, which is acting to separate the printing screen from the workpiece, exceeds the adhesive effect of the remaining printing medium in contact with both the printing screen and the workpiece, the central region of the printing screen, which is still in contact with the workpiece, is separated instantly and violently from the workpiece. Such uncontrolled, instant separation leads to poor transfer of printing medium from the printing apertures in the central region of the printing screen. In addition, such instantaneous separation can cause vibration of the printing screen, in the manner of a drumskin, which can cause the printing screen to contact ones of the printed deposits and damage the same.

By way of attempting to overcome the problems associated with such out-of-plane deflection of highly-tensioned printing screens, tensioning systems have been proposed which provide for an increased speed of separation. Such systems do provide for the instantaneous separation of a larger area of a printing screen, and thereby diminishes the out-of-plane effect, which causes shearing of the printed deposits, but such separation is even more uncontrolled.

It is thus an aim of the present invention to provide a support system for and a method of supporting a printing screen unit comprising a printing screen in a screen printing operation which provides for improved printing of a workpiece, in particular improved separation of a printing screen from a workpiece following the printing phase of a screen printing operation.

In one aspect the present invention provides a support system for supporting a printing screen unit in a screen printing machine, the support system including a support assembly comprising: a support unit for supporting a printing screen unit comprising a printing screen including printing apertures through which printing medium is in use printed onto a workpiece; and a tensioning mechanism for tensioning the printing screen in a screen printing operation, wherein the tensioning mechanism is configured to tension the printing screen to a first tension in a printing phase in printing printing medium onto a workpiece and a second tension, which is lower than the first tension, in a separation phase in separating the printing screen unit and the workpiece.

In one embodiment the second tension is substantially a zero tension.

Preferably, the tensioning mechanism comprises at least first and second tensioning units for tensioning the printing screen.

In one embodiment the tensioning units are configured to apply a tensioning force to opposite edges of the printing screen.

In another embodiment the tensioning units are configured to apply tensioning forces to adjacent corners of the printing screen.

Preferably, the tensioning units are configured to apply the tensioning forces along intersecting axes.

More preferably, the axes intersect at the center of the printing screen.

Preferably, the tensioning mechanism comprises four tensioning units each for applying a tensioning force to a respective corner of the printing screen.

More preferably, the tensioning units are configured to apply tensioning forces along intersecting axes.

Yet more preferably, the axes intersect at the center of the printing screen.

In one embodiment the support unit comprises first and second screen guiding units for guiding the printing screen which are disposed to opposite edges of the printing screen.

Preferably, the screen guiding units act to constrain deflection of the printing screen in the separation phase.

In one embodiment the screen guiding units are disposed to ends of the printing screen in the direction of screen printing.

In another embodiment the screen guiding units are disposed to sides of the printing screen in the direction of screen printing.

In one embodiment the support assembly comprises a clamping mechanism for clamping the printing screen in the printing phase so as to fix the lateral, in-plane position of the printing screen.

Preferably, the clamping mechanism comprises first and second screen clamping units disposed to opposite edges of the printing screen.

In one embodiment the screen clamping units are disposed to opposite ends of the printing screen in the direction of screen printing.

In another embodiment the screen clamping units are disposed to opposite sides of the printing screen in the direction of screen printing.

Preferably, the screen clamping units comprise elongate units which extend along the respective ones of the edges of the printing screen.

Preferably, the screen clamping units comprise vacuum clamping units.

Preferably, the support system further comprises: a printing screen unit, the printing screen unit including a pattern of apertures through which printing medium is in use printed onto a workpiece in a printing phase.

In one embodiment the printing screen unit includes first and second attachment members attached to opposite edges of the printing screen.

Preferably, the attachment members each extend along a length of the respective edge of the printing screen.

In one embodiment the attachment members are attached to opposite ends of the printing screen in the direction of printing.

In another embodiment the attachment members are attached to opposite sides of the printing screen in the direction of printing.

In one embodiment the printing screen unit includes first and second support elements disposed to one pair of opposite edges of the printing screen such as to constrain deflection of the printing screen in the separation phase.

Preferably, the support elements each extend along a length of a respective edge of the printing screen.

In one embodiment the support elements are disposed to opposite ends of the printing screen in the direction of screen printing.

In another embodiment the support elements are disposed to opposite sides of the printing screen in the direction of screen printing.

In another aspect the present invention provides a support system for supporting a printing screen unit, the support system including a support assembly comprising: a support unit for supporting a printing screen unit, the printing screen unit comprising a printing screen including printing apertures through which printing medium is in use printed onto a workpiece; and a clamping mechanism for clamping the printing screen in a printing phase in printing printing medium onto a workpiece so as to fix the lateral, in-plane position of the printing screen.

In one embodiment the support assembly further comprises: a tensioning mechanism for tensioning the printing screen.

In one embodiment the tensioning mechanism is configured to tension the printing screen to one predeterminable tension in a screen printing operation.

In another embodiment the tensioning mechanism is configured to tension the printing screen to a first tension in a printing phase in printing printing medium onto a workpiece, and a second tension, which is lower than the first tension, in a separation phase in separating the printing screen unit and a workpiece.

In one embodiment the second tension is substantially a zero tension.

Preferably, the tensioning mechanism comprises at least first and second tensioning units for tensioning the printing screen.

In one embodiment the tensioning units are configured to apply a tensioning force to opposite edges of the printing screen.

In another embodiment the tensioning units are configured to apply tensioning forces to adjacent corners of the printing screen.

Preferably, the tensioning units are configured to apply the tensioning forces along intersecting axes.

More preferably, the axes intersect at a center of the printing screen.

In a preferred embodiment the tensioning mechanism comprises four tensioning units each for applying a tensioning force to a respective corner of the printing screen.

Preferably, the tensioning units are configured to apply tensioning forces along intersecting axes.

Preferably, the axes intersect at a center of the printing screen.

In another embodiment the printing screen unit comprises a screen frame to which the printing screen is tensioned to one predeterminable tension.

In one embodiment the support unit comprises first and second screen guiding units for guiding the printing screen which are disposed to opposite edges of the printing screen.

Preferably, the screen guiding units act to constrain deflection of the printing screen in a separation phase in separating the printing screen and a workpiece.

In one embodiment the screen guiding units are disposed to ends of the printing screen in the direction of screen printing.

In a preferred embodiment the screen guiding units are disposed to sides of the printing screen in the direction of screen printing.

Preferably, the clamping mechanism comprises first and second screen clamping units disposed to opposite edges of the printing screen.

In one embodiment the screen clamping units are disposed to opposite ends of the printing screen in the direction of screen printing.

In another embodiment the screen clamping units are disposed to opposite sides of the printing screen in the direction of screen printing.

In one embodiment the screen clamping units comprise elongate units which extend along the respective ones of the opposite edges of the printing screen.

Preferably, the screen clamping units comprise vacuum clamping units.

Preferably, the support system further comprises: a printing screen unit, the printing screen unit including a pattern of apertures through which printing medium is in use printed onto a workpiece in a printing phase.

In one embodiment the printing screen unit includes first and second attachment members attached to opposite edges of the printing screen.

More preferably, the attachment members each extend along a length of the respective edge of the printing screen.

In one embodiment the attachment members are attached to opposite ends of the printing screen in the direction of screen printing.

In another embodiment the attachment members are attached to opposite sides of the printing screen in the direction of screen printing.

In one embodiment the printing screen unit includes first and second support elements disposed to opposed edges of the printing screen such as to constrain deflection of the printing screen in a separation phase in separating the printing screen and a workpiece.

Preferably, the support elements each extend along a length of a respective edge of the printing screen.

In one embodiment the support elements are disposed to opposite ends of the printing screen in the direction of screen printing.

In another embodiment the support elements are disposed to opposite sides of the printing screen in the direction of screen printing.

In a further aspect the present invention provides a method of supporting a printing screen unit in a screen printing machine, the method comprising the steps of: providing a printing screen unit comprising a printing screen including a pattern of printing apertures through which printing medium is printed onto a workpiece; tensioning the printing screen to a first tension; printing printing medium onto a workpiece through the pattern of apertures in the printing screen; tensioning the printing screen to a second tension, which is lower than the first tension; and separating the printing screen unit from the workpiece.

In one embodiment the second tension is substantially a zero tension.

In one embodiment the tensioning forces are applied to opposite edges of the printing screen.

In another embodiment the tensioning forces are applied to adjacent corners of the printing screen.

Preferably, the tensioning forces are applied along intersecting axes.

More preferably, the axes intersect at a center of the printing screen.

In a further embodiment the tensioning forces are applied to the respective corners of the printing screen.

Preferably, the tensioning forces are applied along intersecting axes.

More preferably, the axes intersect at a center of the printing screen.

In one embodiment the method further comprises the step of: clamping the printing screen in the printing phase so as to fix the lateral, in-plane position of the printing screen.

Preferably, the printing screen is clamped at opposite edges thereof.

In one embodiment the printing screen is clamped at opposite ends thereof in the direction of screen printing.

In another embodiment the printing screen is clamped at opposite sides thereof in the direction of screen printing.

In a yet further aspect the present invention provides a method of supporting a printing screen unit, comprising the steps of: providing a printing screen unit, the printing screen unit comprising a printing screen including a pattern of printing apertures through which printing medium is printed onto a workpiece; clamping the printing screen so as to fix the lateral, in-plane position of the printing screen; printing printing medium through the pattern of apertures in the printing screen; releasing the printing screen; and separating the printing screen unit and the workpiece.

In one embodiment the method further comprises the step of: tensioning the printing screen to one predeterminable tension in a screen printing operation.

In another embodiment the method further comprises the steps of: tensioning the printing screen to a first tension prior to the step of printing printing medium onto the workpiece; and tensioning the printing screen to a second tension, which is lower than the first tension, prior to separating the printing screen unit from the workpiece.

In one embodiment the second tension is substantially a zero tension.

Preferably, the tensioning forces are applied to opposite edges of the printing screen.

In one embodiment the tensioning forces are applied to adjacent corners of the printing screen.

Preferably, the tensioning forces are applied along intersecting axes.

More preferably, the axes intersect at a center of the printing screen.

In another embodiment the tensioning forces are applied to the respective corners of the printing screen.

Preferably, the tensioning forces are applied along intersecting axes.

More preferably, the axes intersect at a center of the printing screen.

In a further embodiment the printing screen unit comprises a screen frame to which the printing screen is tensioned to one predeterminable tension.

Preferably, the step of clamping the printing screen comprises the step of: clamping the printing screen at opposite edges of the printing screen.

In one embodiment the printing screen is clamped at opposite ends in the direction of screen printing.

In another embodiment the printing screen is clamped at opposite sides in the direction of screen printing.

In one embodiment the printing screen is clamped along the respective ones of the edges of the printing screen.

In a still further aspect the present invention provides a printing screen unit, comprising: a substantially rectangular printing screen including a pattern of printing apertures through which printing medium is in use printed onto a workpiece; and attachment means at each of the respective corners of the printing screen for attachment to a tensioning mechanism.

In one embodiment the attachment means each comprise an aperture in the respective corner of the printing screen for attachment to a tensioning mechanism.

In another embodiment the attachment means each comprise an attachment member comprising a reinforcing element attached to the respective corner of the printing screen and a connector element for connection to a tensioning mechanism.

In one embodiment the reinforcing element comprises a plate disposed to one surface of the printing screen.

In another embodiment the reinforcing element comprises first and second plates between which the printing screen is sandwiched.

In one embodiment at least one attachment means defines at least one reference surface for enabling referencing of the position of the printing screen.

Preferably, the at least one attachment means defines first and second reference surfaces for enabling referencing of the position of the printing screen.

In another embodiment first and second attachment means each define at least one reference surface for enabling referencing of the position of the printing screen.

Preferably, at least one of the first and second attachment means defines first and second reference surfaces for enabling referencing of the printing screen.

In one embodiment the connector element comprises a rod which is located on a tensioning axis extending through a central region of the printing screen and an enlarged head providing an engagement surface for engaging an attachment member of a tensioning mechanism.

Preferably, the engagement surface is a part-spherical surface.

In another embodiment the connector element comprises a hook element which defines a recess providing an engagement surface for engaging an attachment member of a tensioning mechanism.

Preferably, the engagement surface is a part-cylindrical surface.

Preferably, the hook element includes a slot which is located on a tensioning axis extending through a central region of the printing screen and through which a respective attachment member of the tensioning mechanism extends, whereby the hook element defines first and second hook element parts which are in use engaged by the respective attachment member of the tensioning mechanism.

In one embodiment the printing screen unit further comprises: first and second support elements disposed to opposite edges of the printing screen such as to constrain deflection of the printing screen.

Preferably, the support elements each extend along a length of the respective edge of the printing screen.

In one embodiment the support elements are disposed to opposite ends of the printing screen in the direction of screen printing.

In another embodiment the support elements are disposed to opposite sides of the printing screen in the direction of screen printing.

Preferred embodiments of the present invention will now be described hereinbelow by way of example only with reference to the accompanying drawings, in which.

Figure 1:
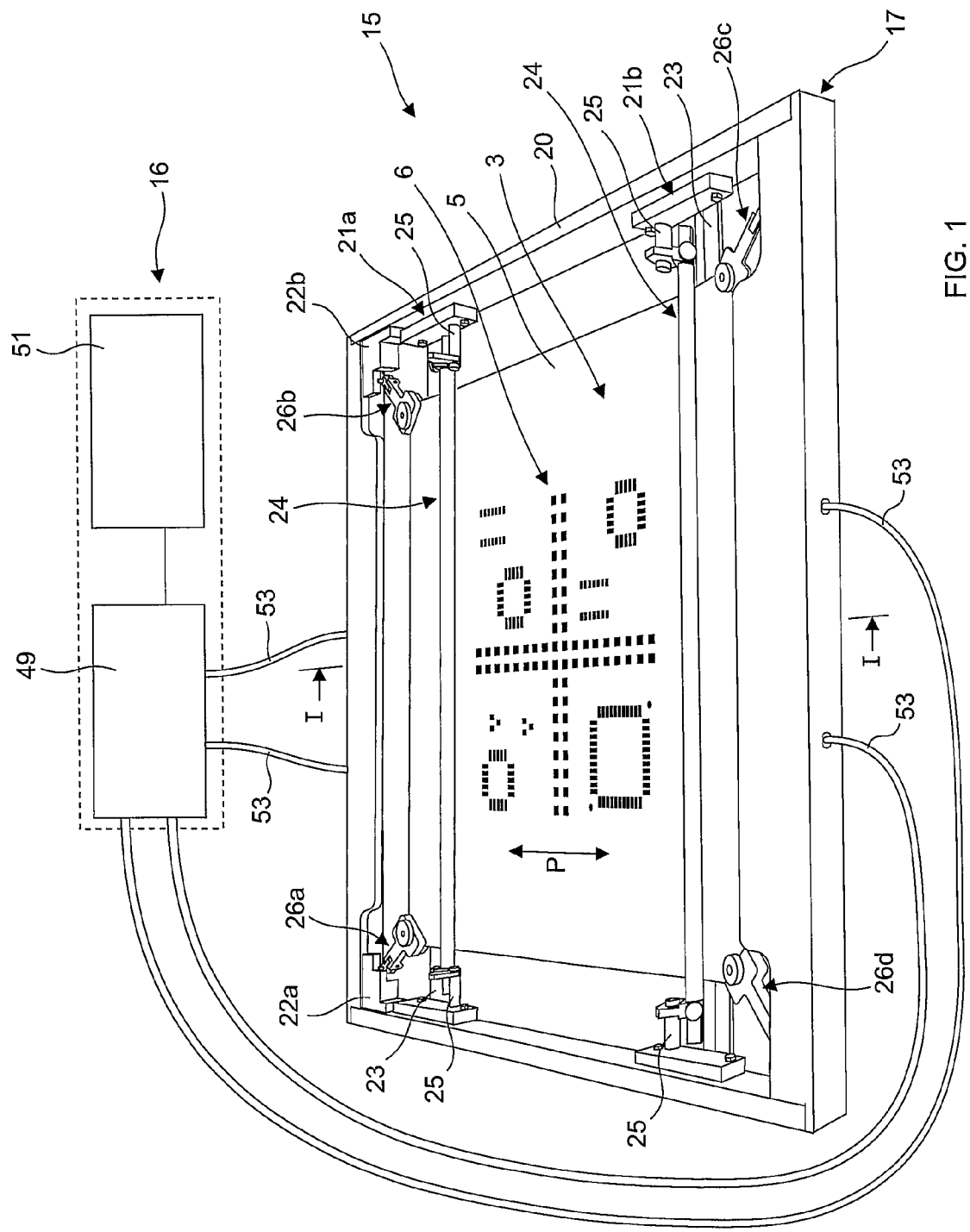
FIG. 1 illustrates a support system in accordance with a first embodiment of the present invention.
Figure 2:
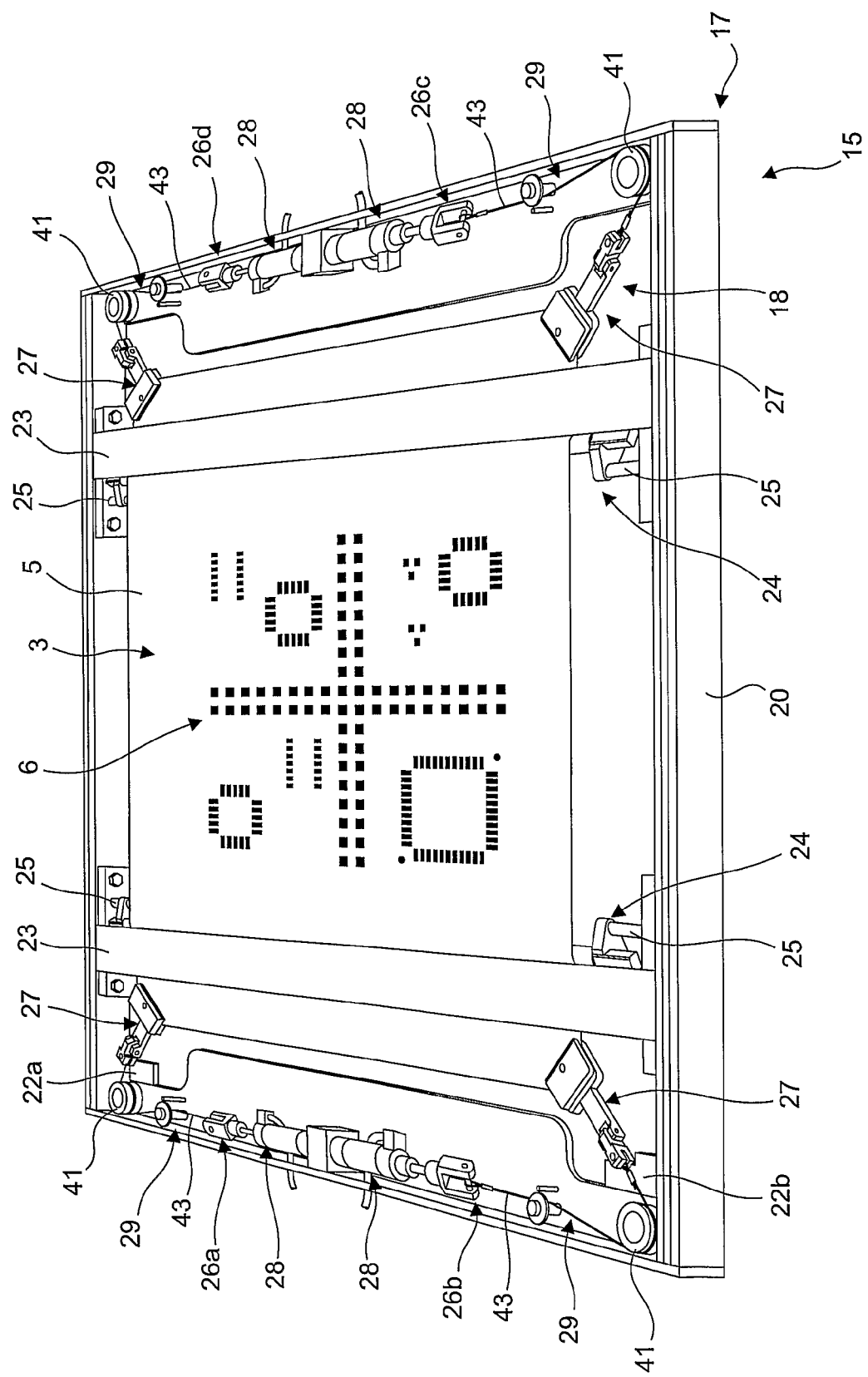
FIG. 2 illustrates the underside of the support assembly of the support system of FIG. 1.
Figure 7:
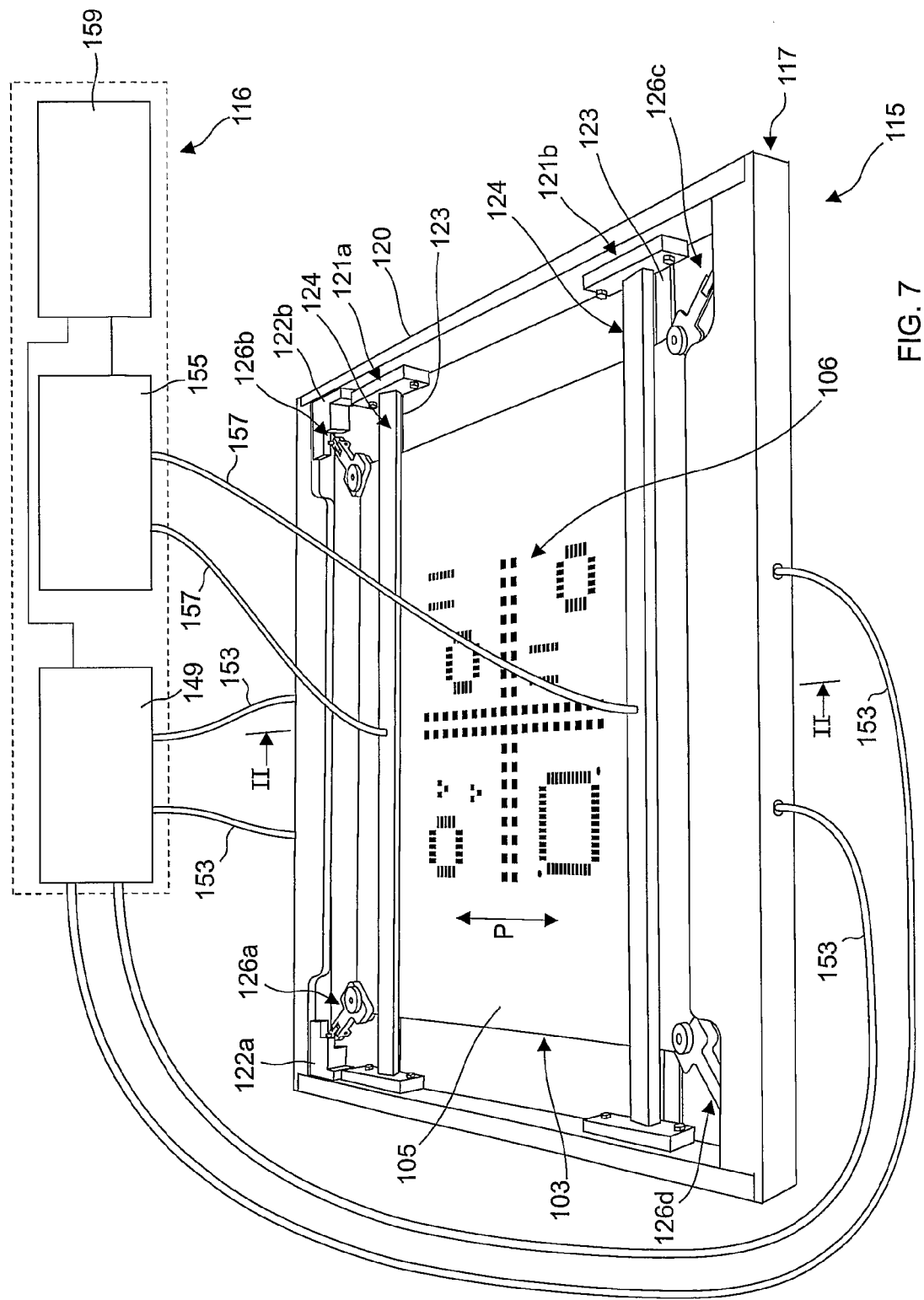
Figure 8:
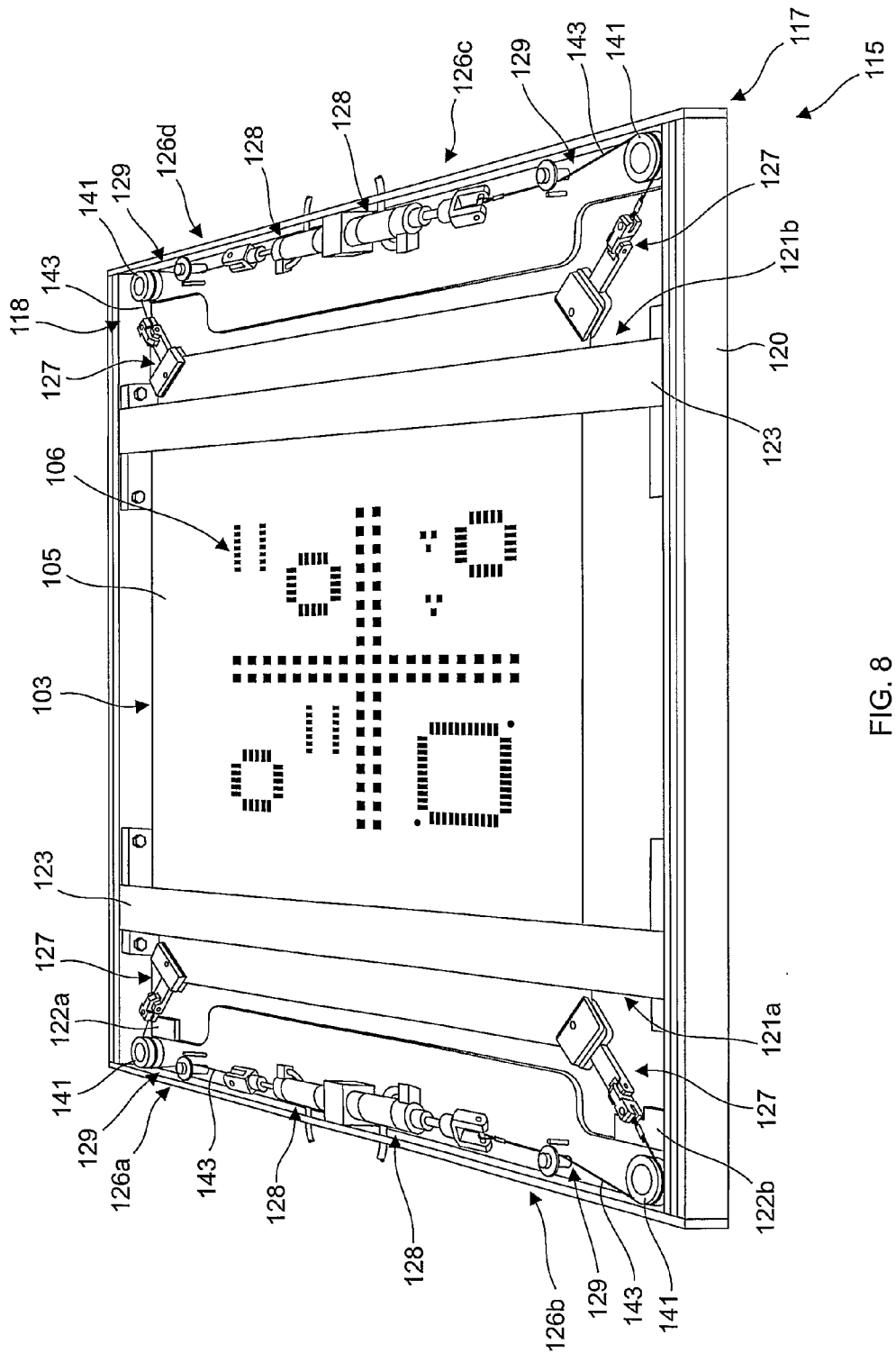
Figure 9:
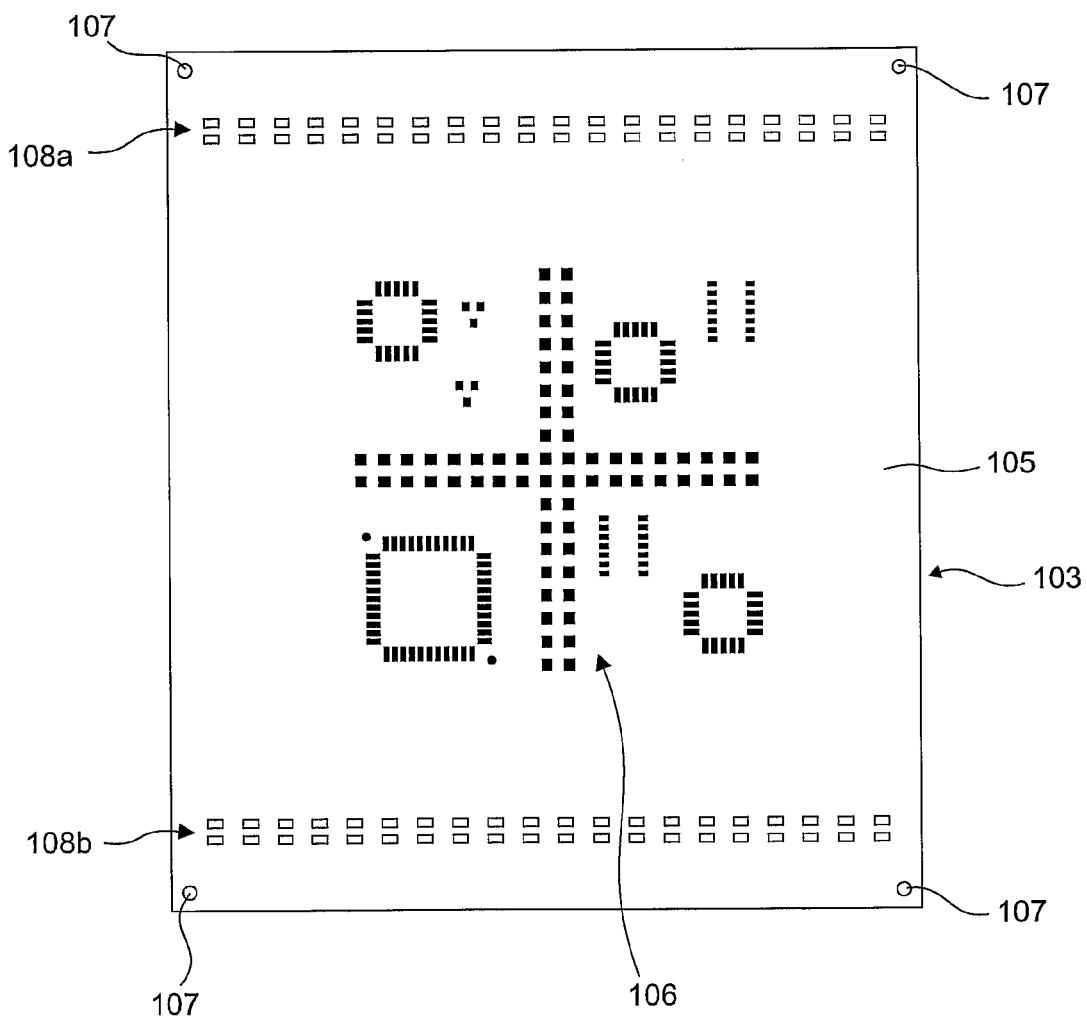
Figure 10:
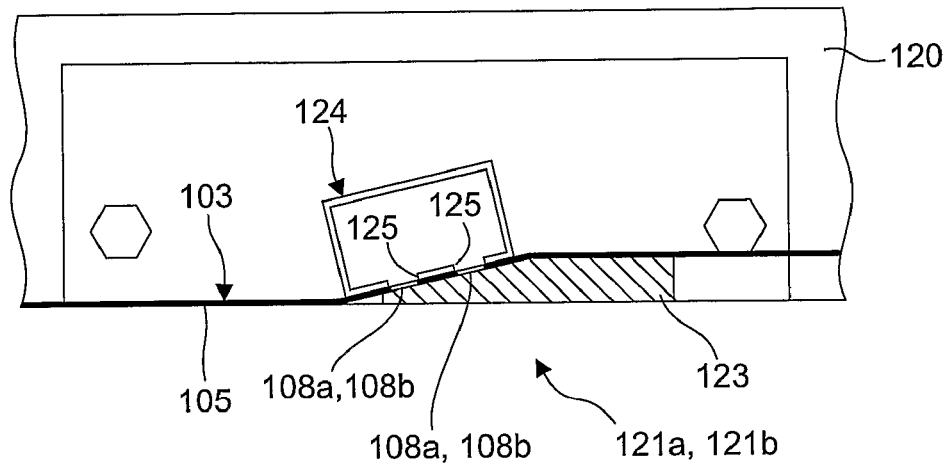
Figure 11:
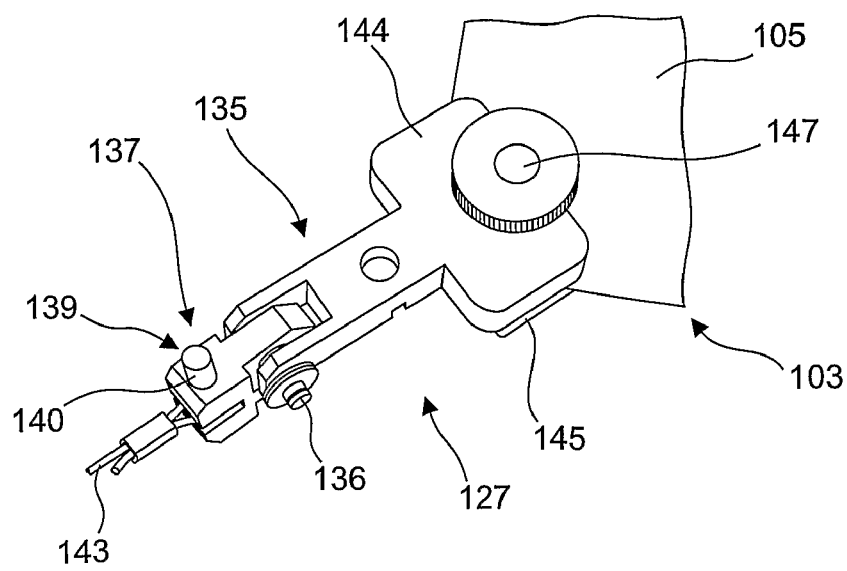
Figure 14:
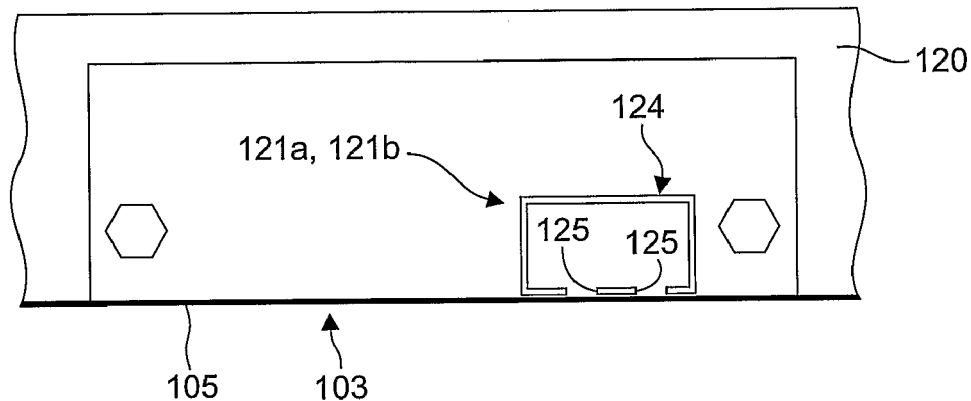
Figure 15:
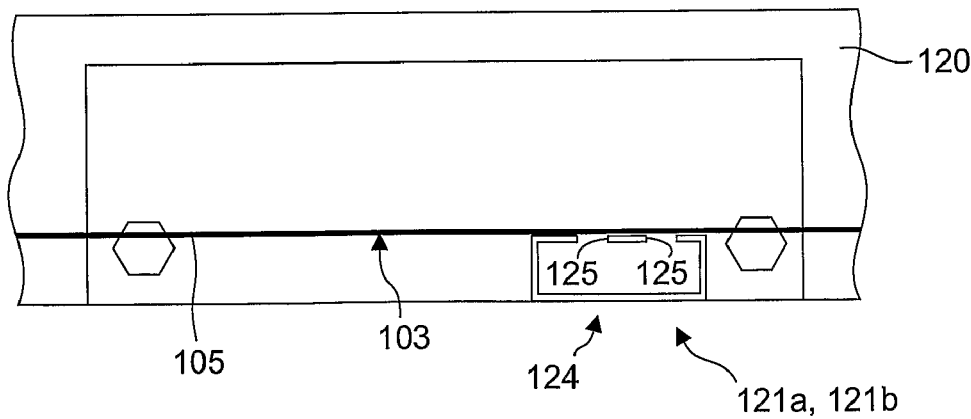
Figure 16:
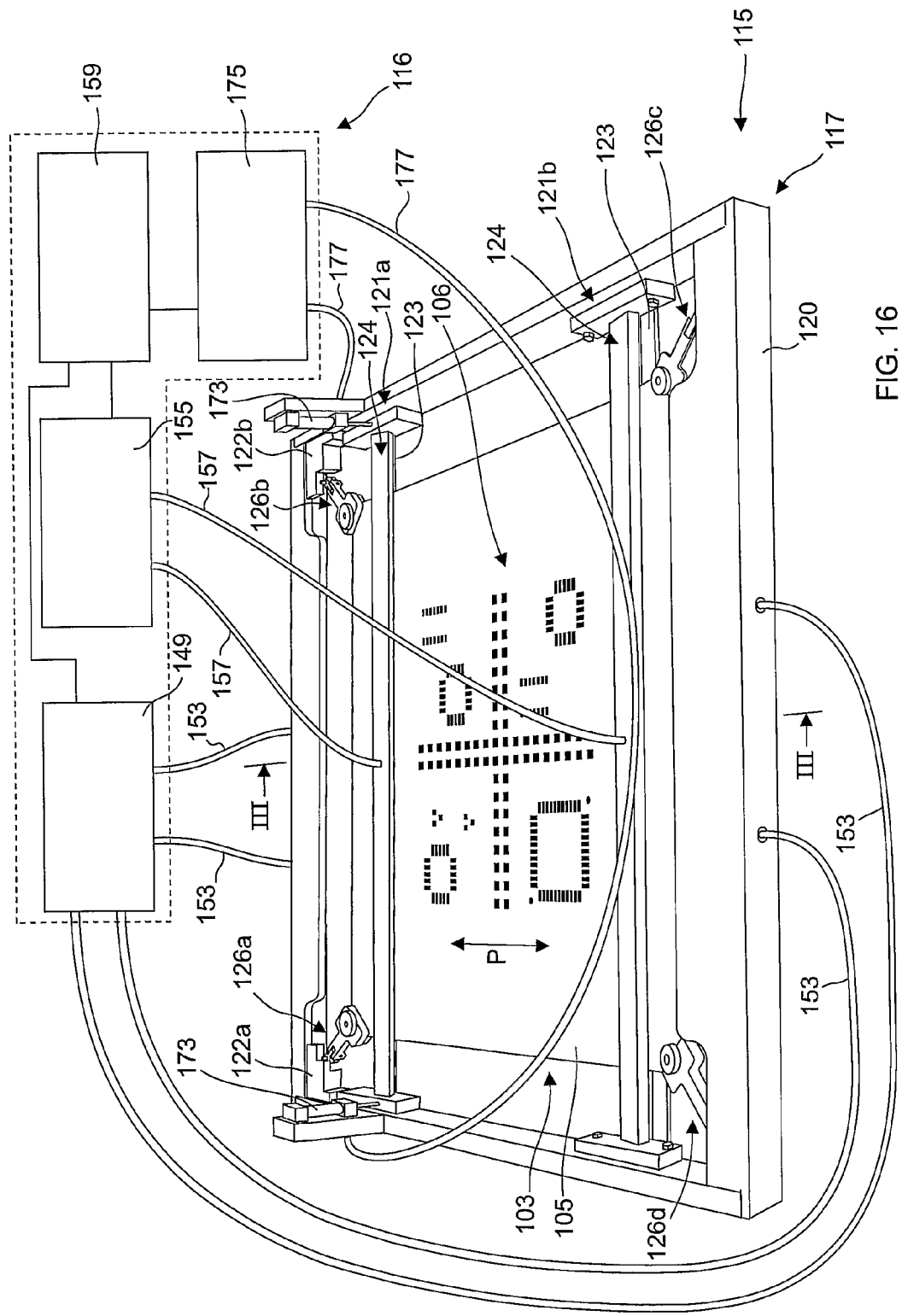
Figure 19:
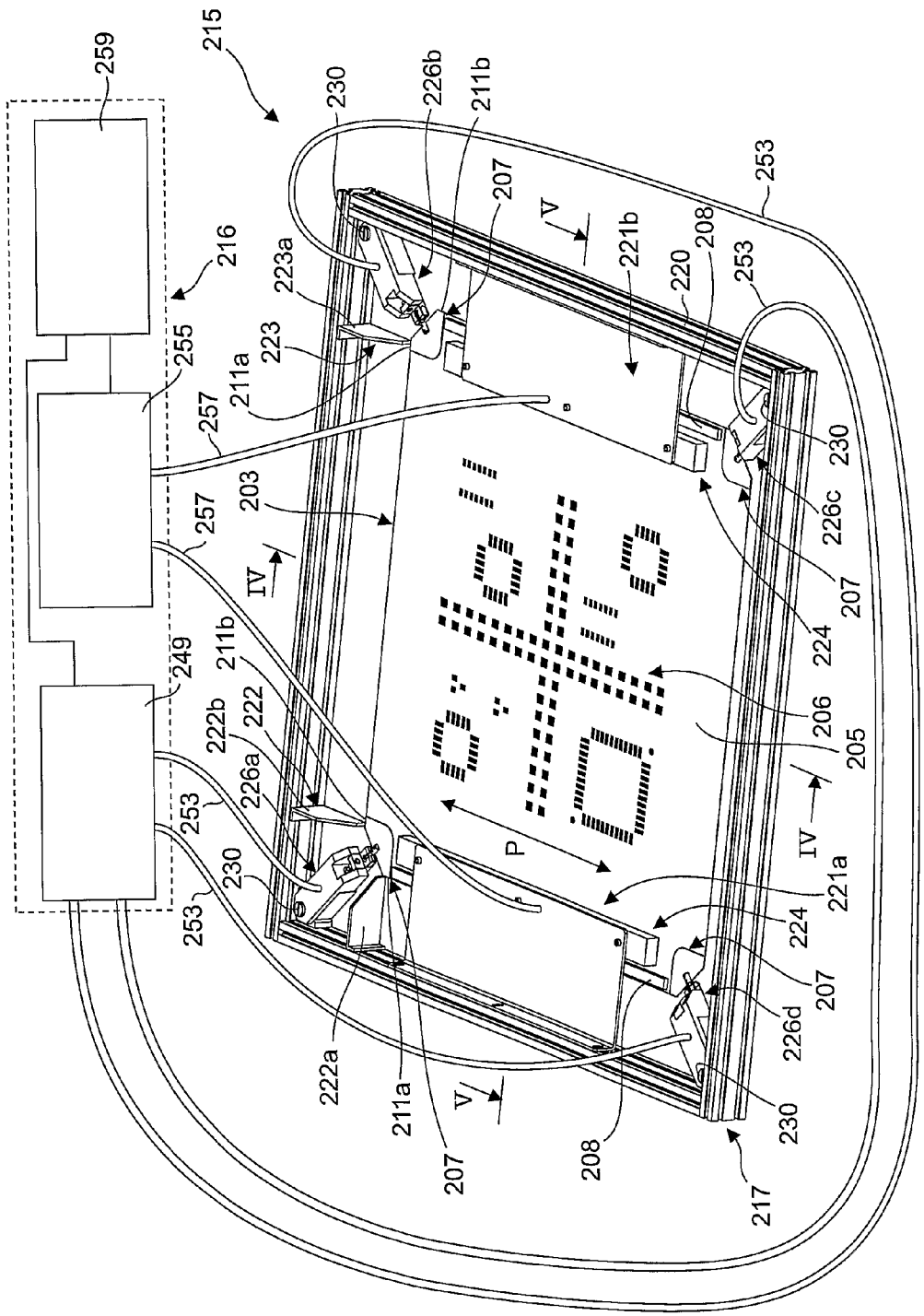
Figure 20:
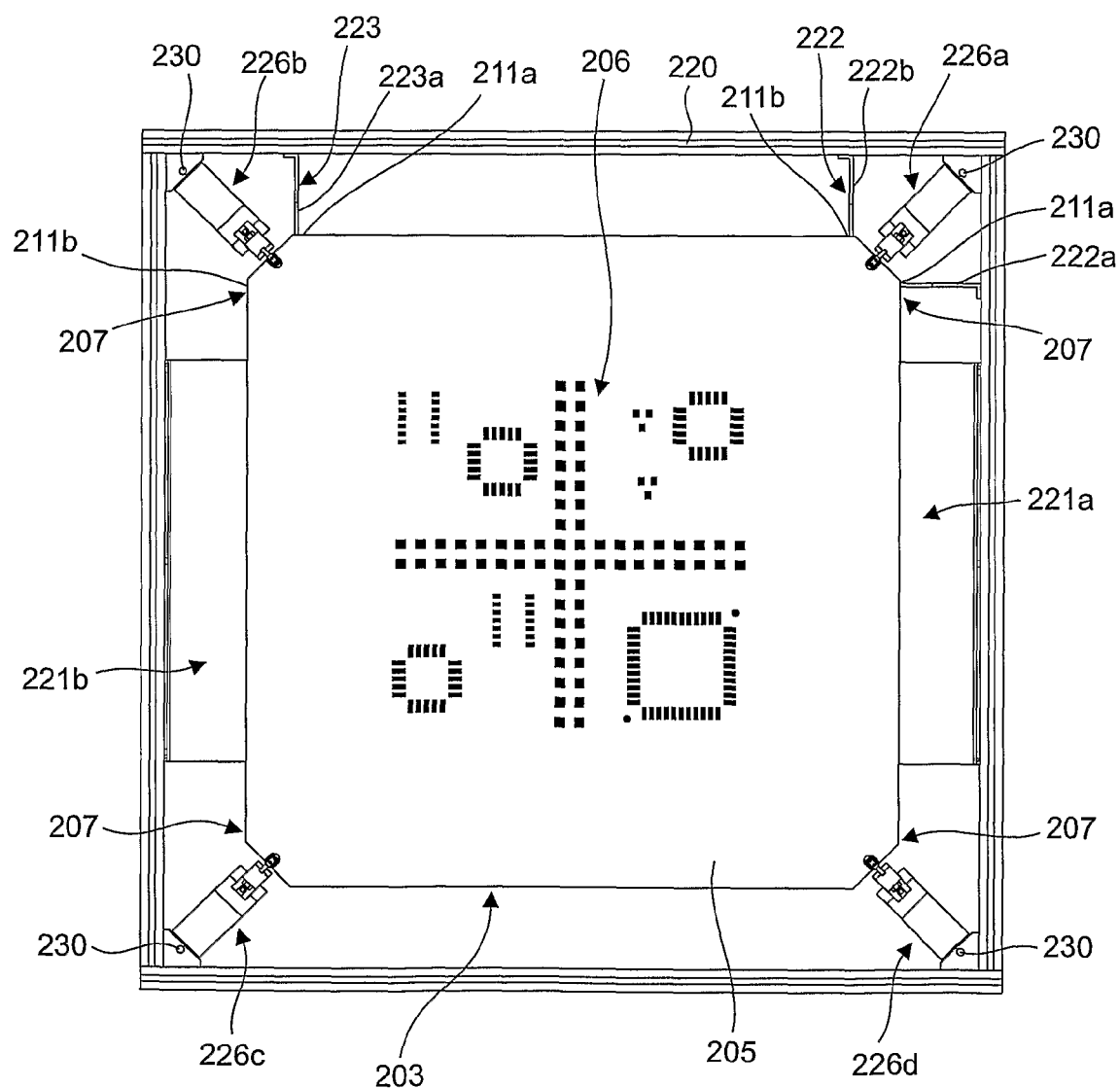
Figure 21:
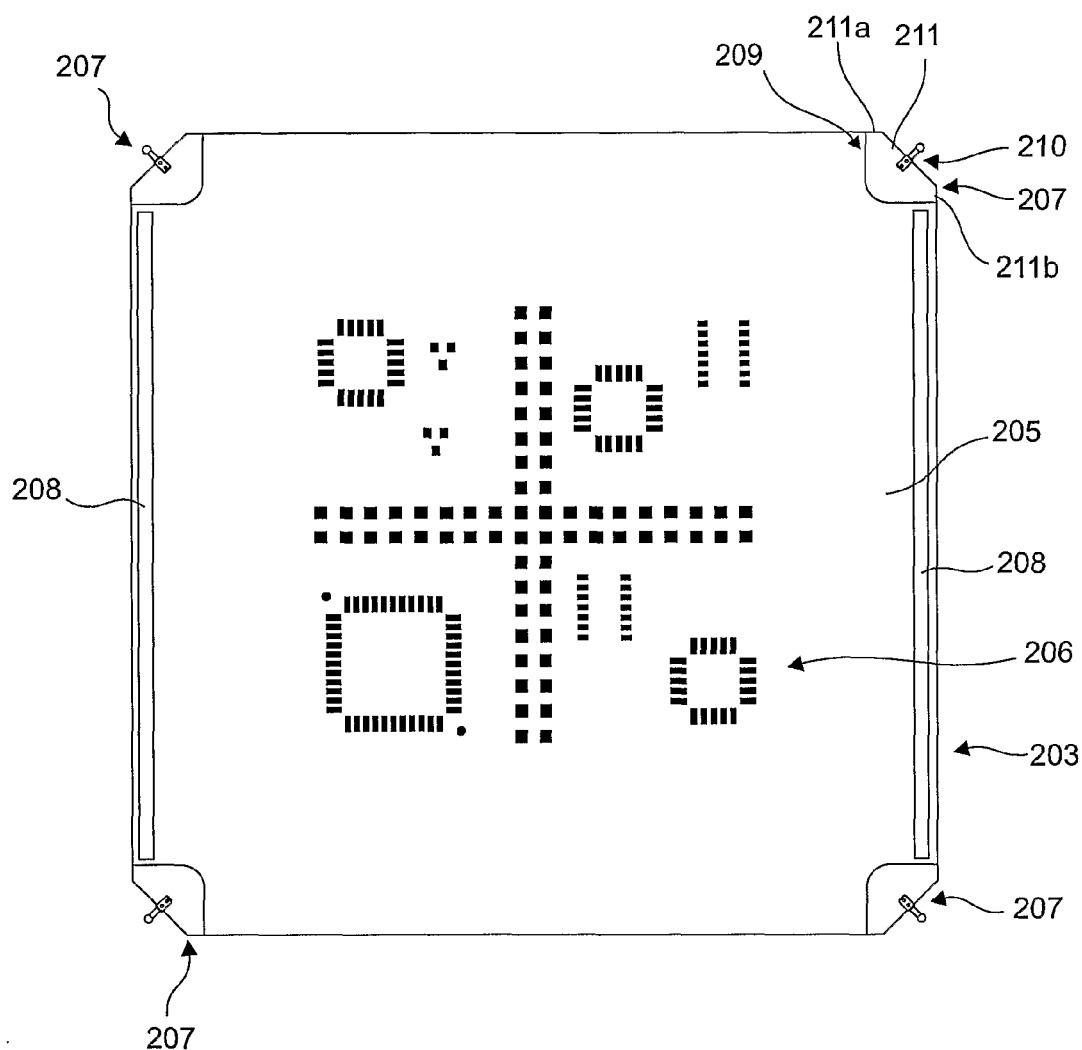
Figure 22:
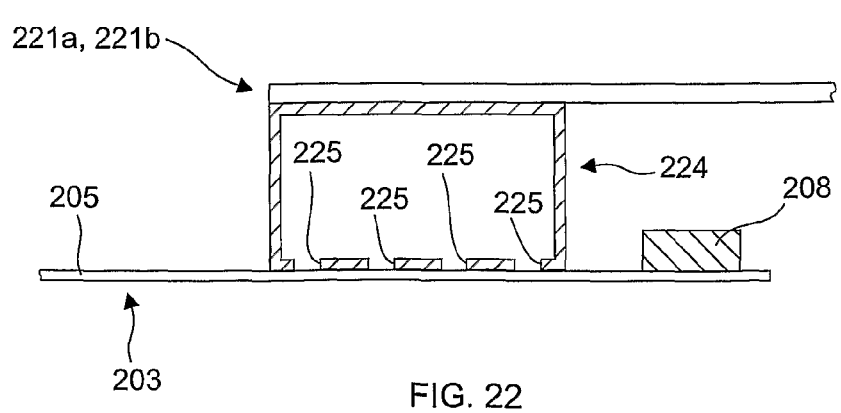
Figure 23:
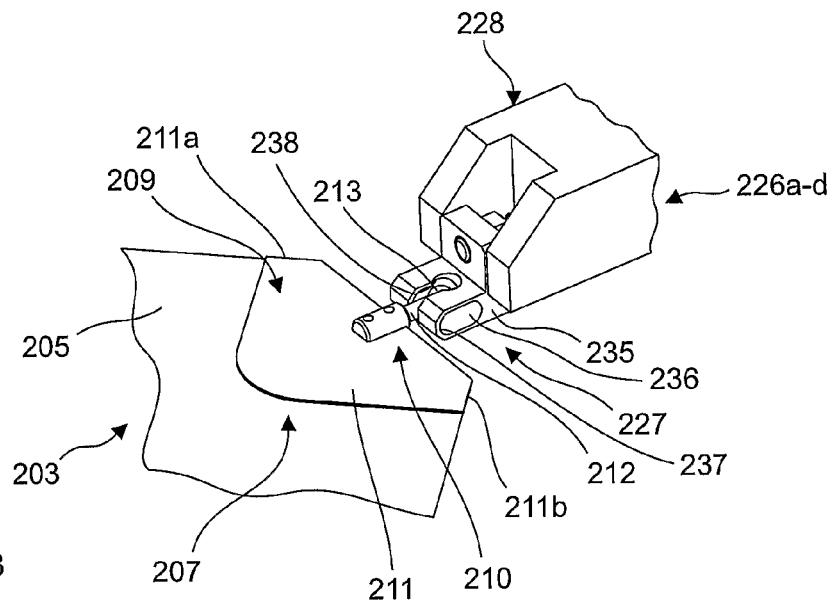
Figure 24:
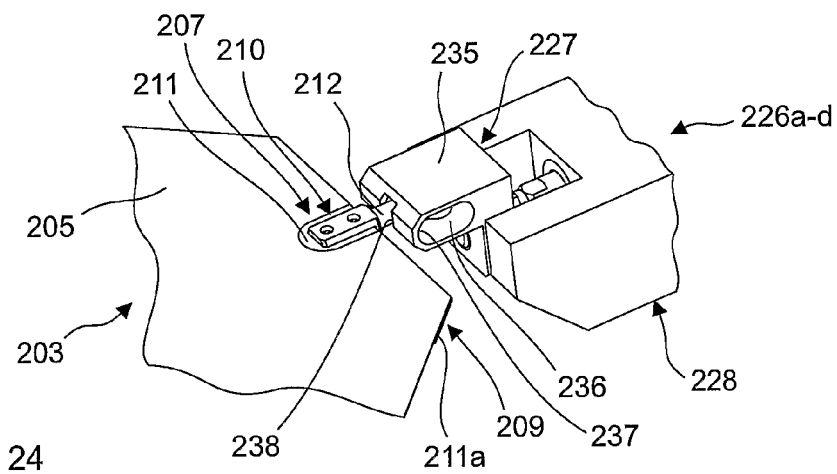
Figure 25:
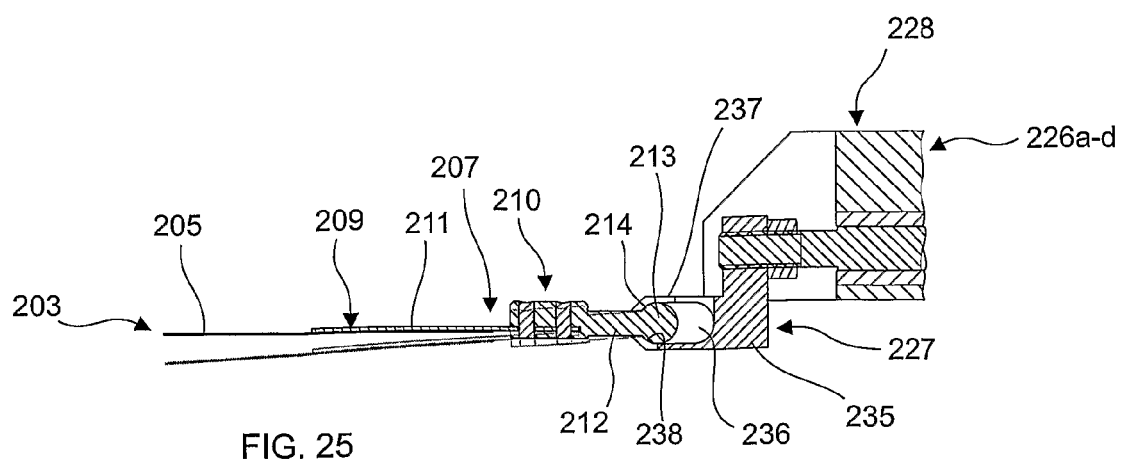
Figure 27C:
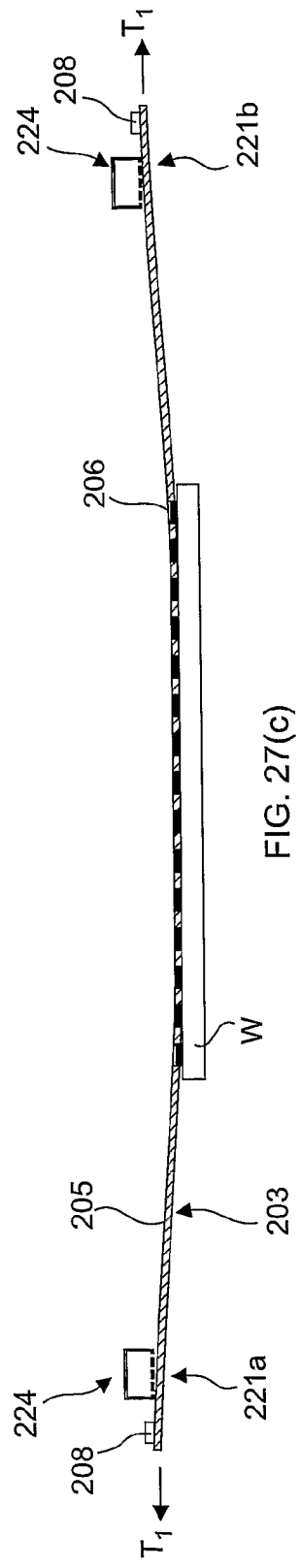
Figure 27D:
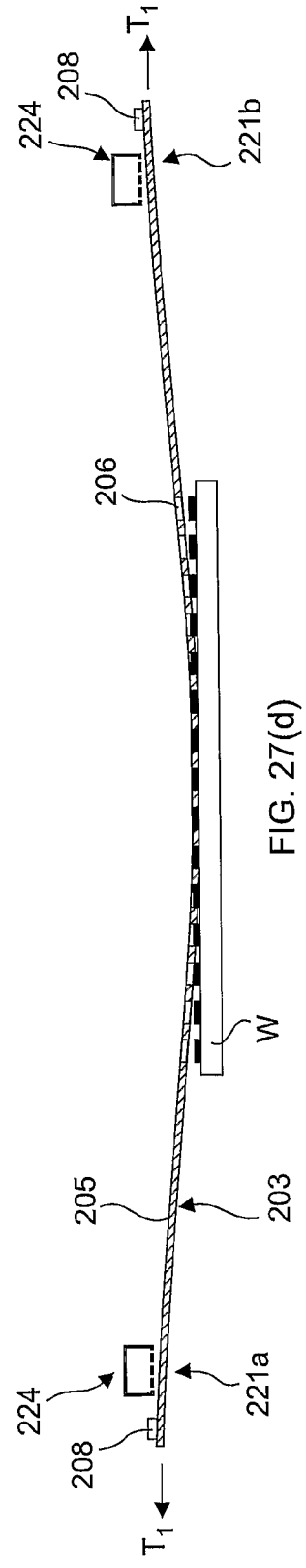
Figure 27E:
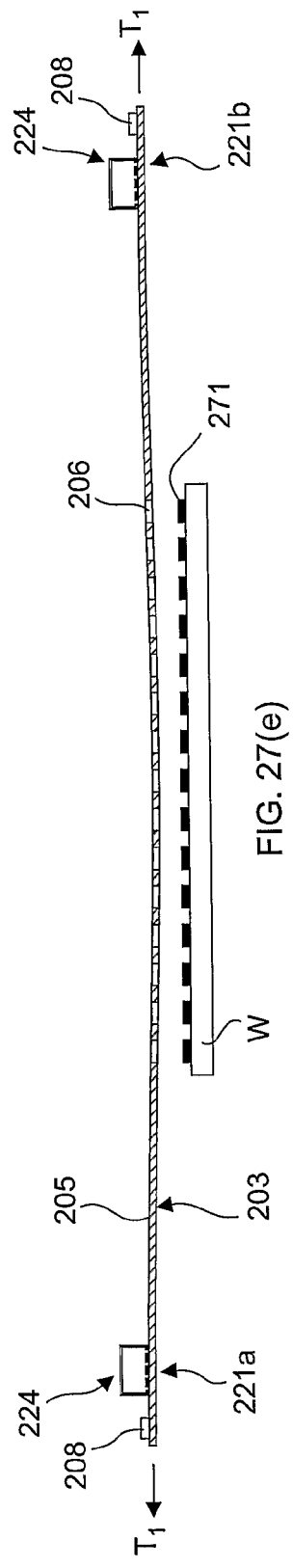
Figure 28:
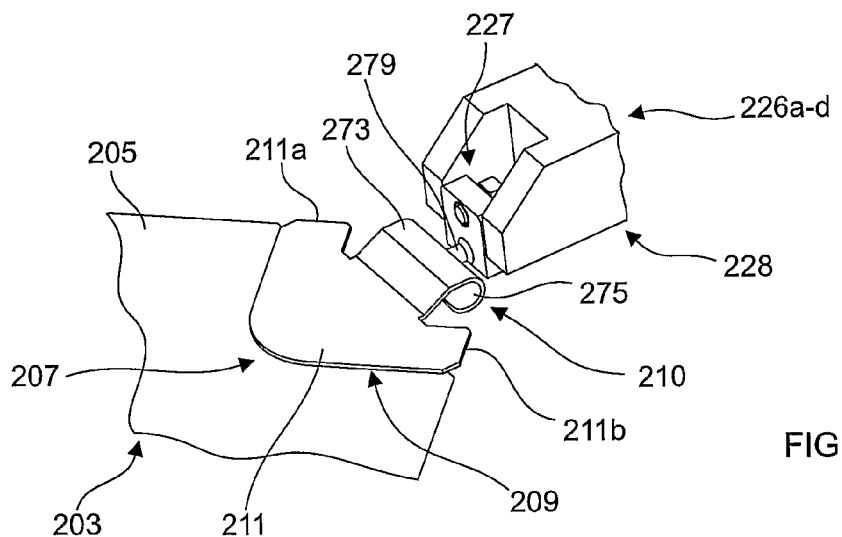
Figure 29:
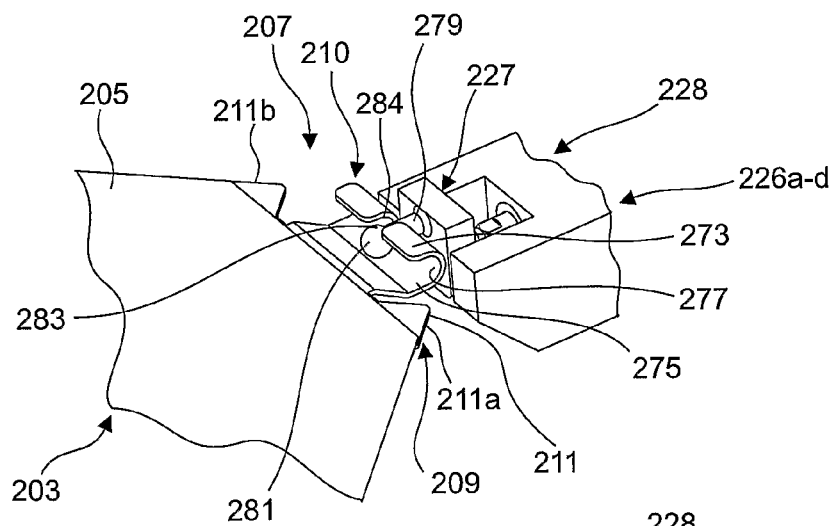
Figure 30:
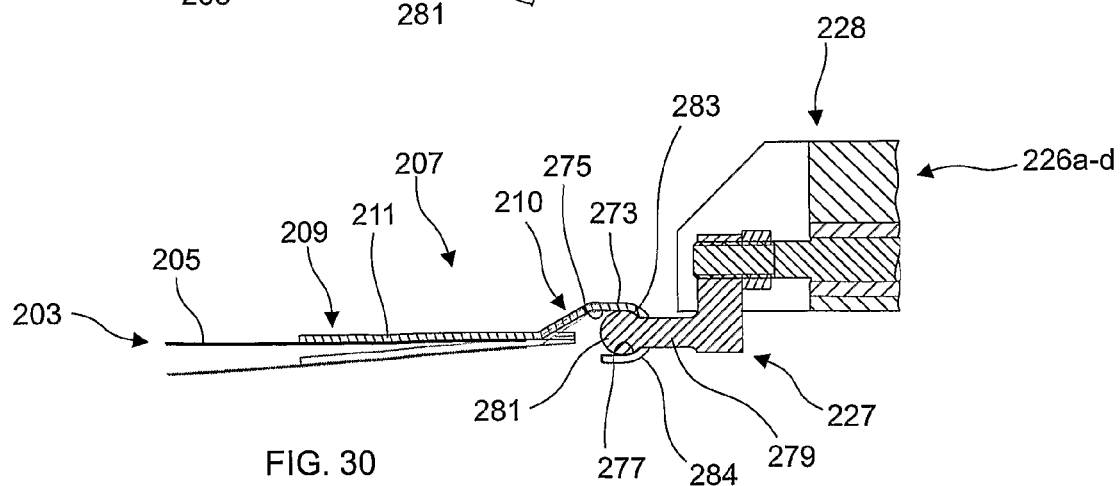
Figure 31:
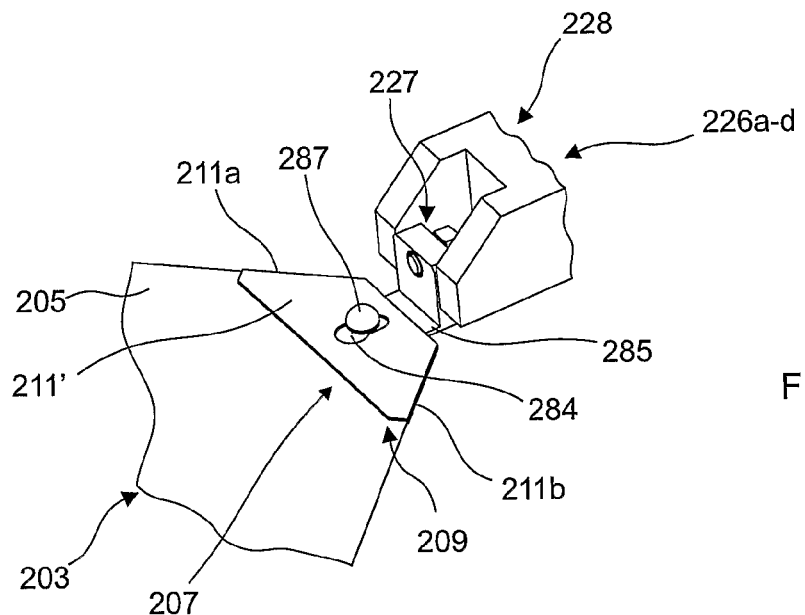
Figure 32:
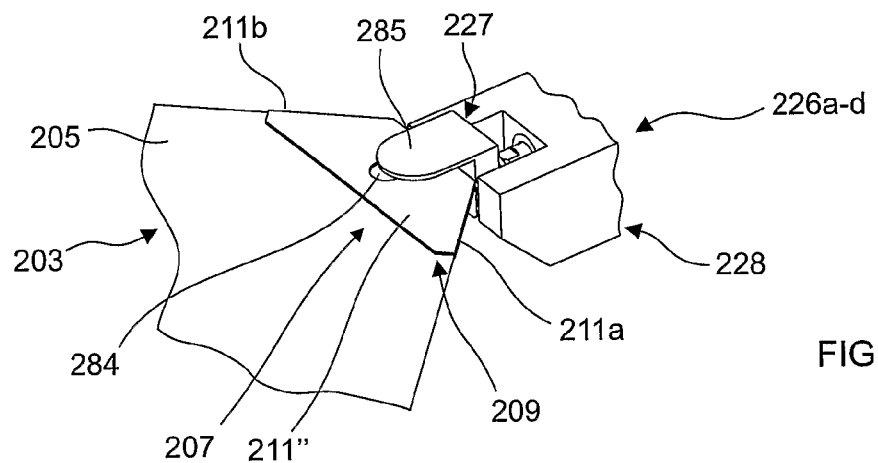
Figure 33:
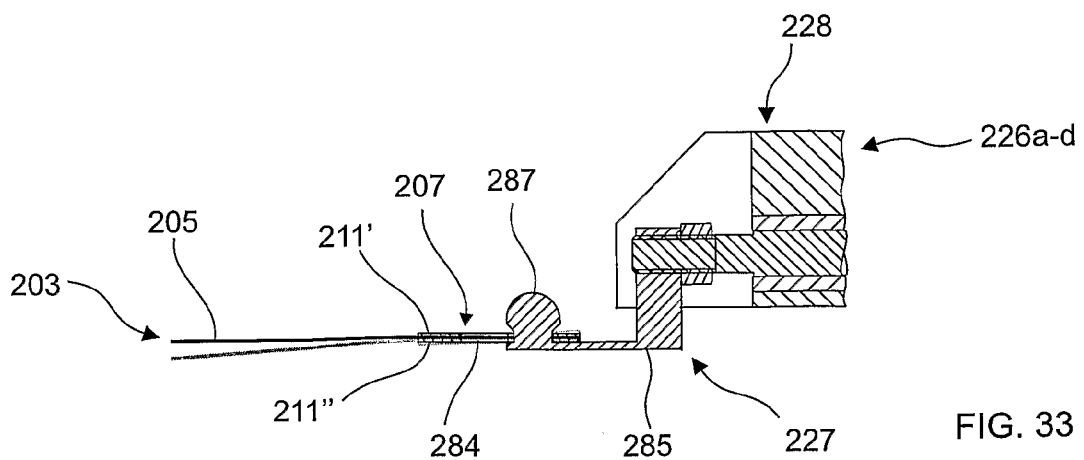
Figure 34:
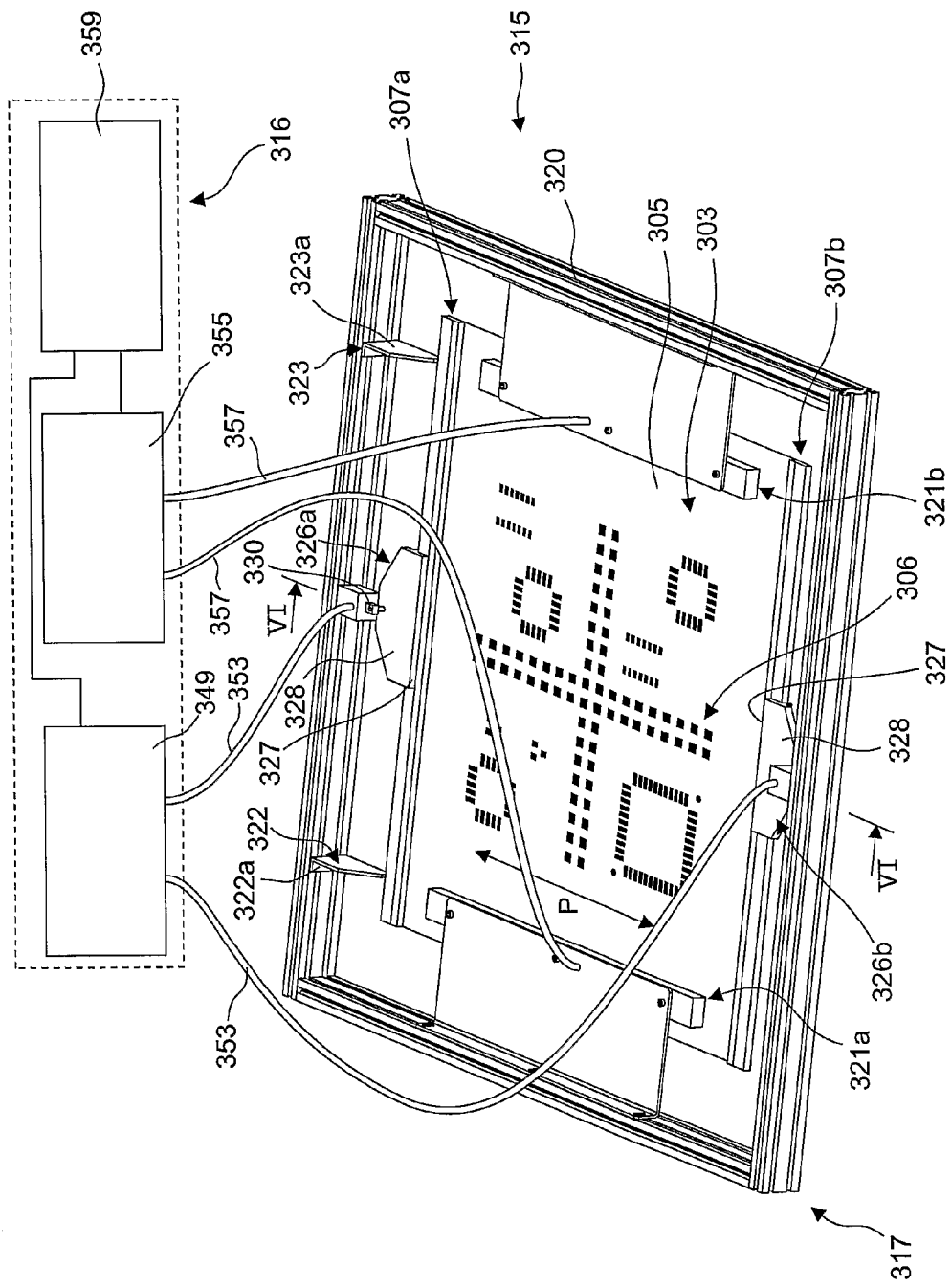
Figure 35:
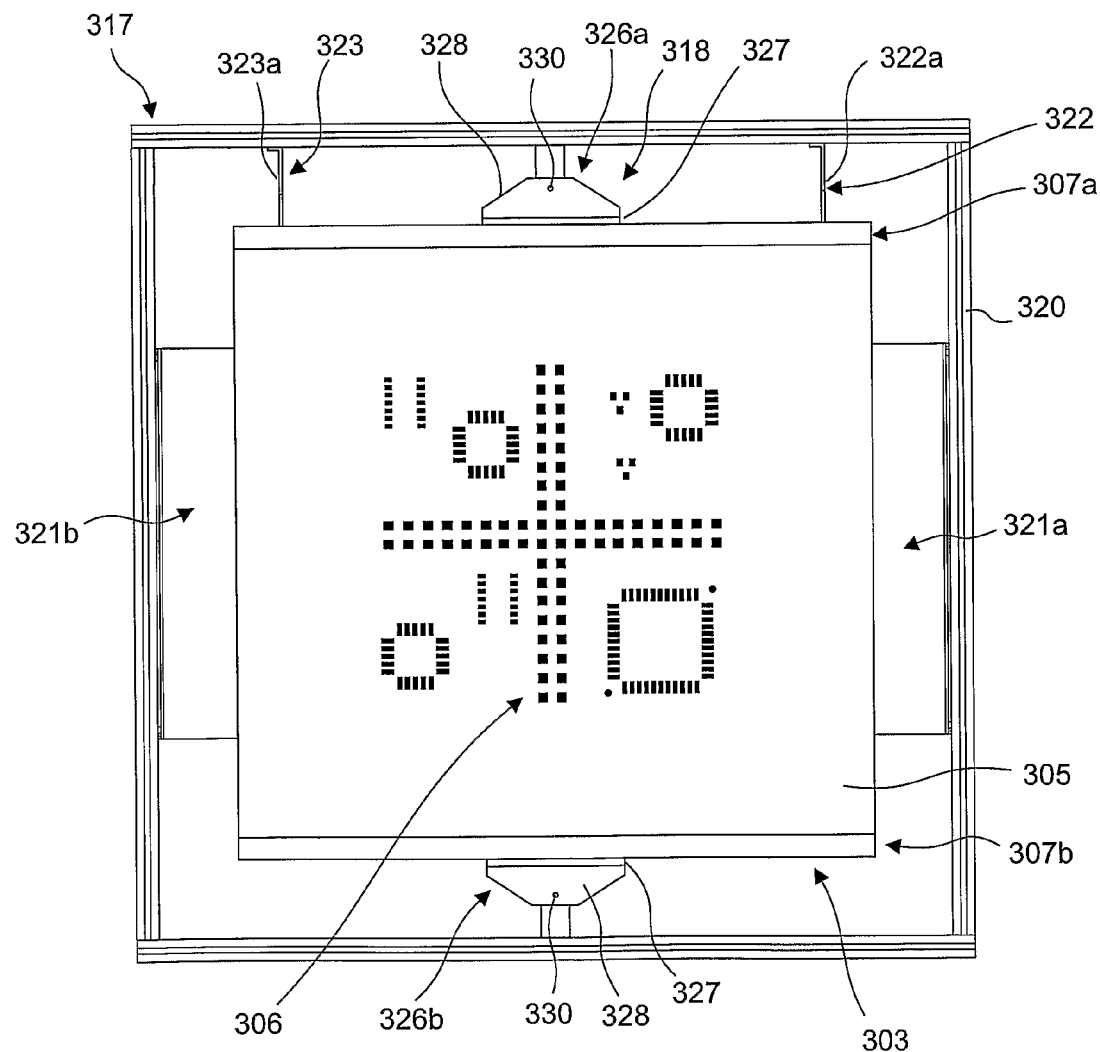
Figure 36:
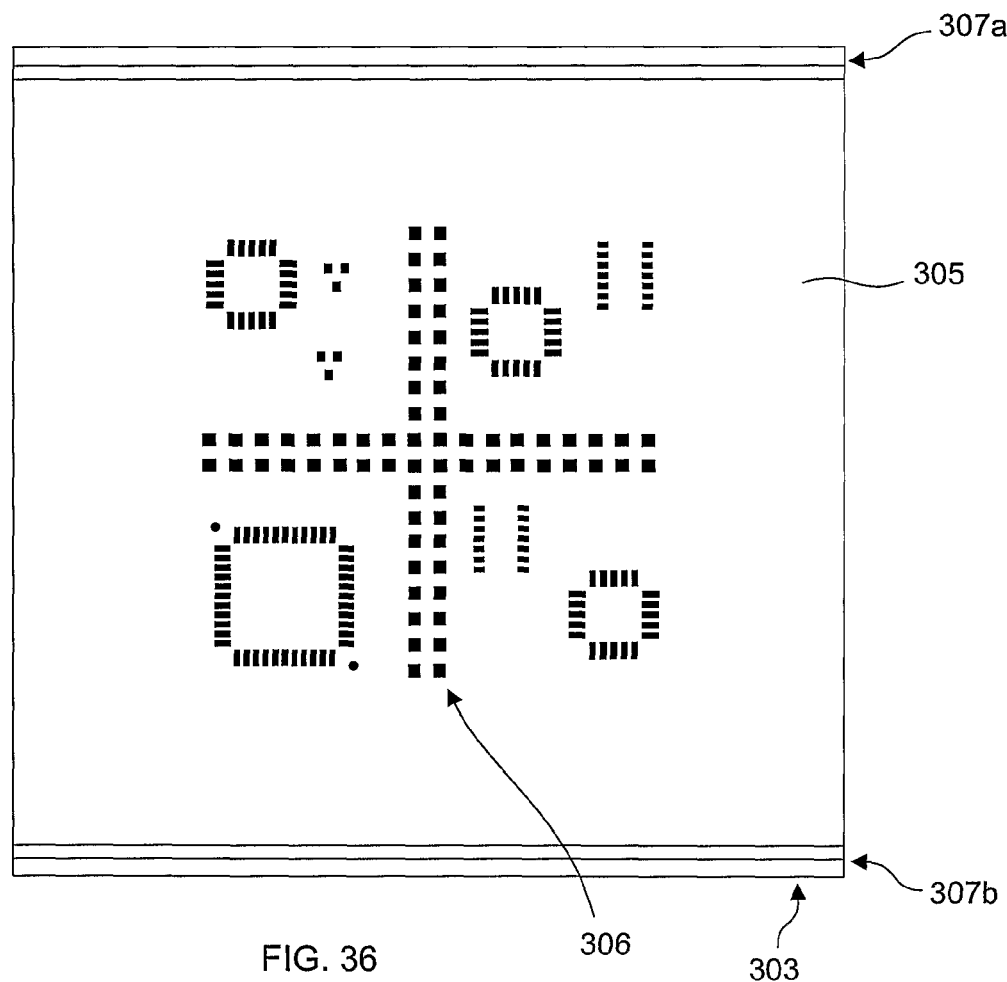
Figure 37:
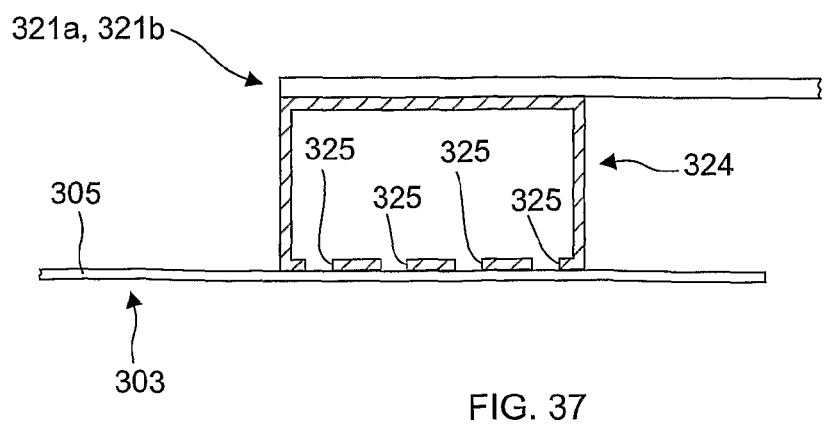
Figure 41:
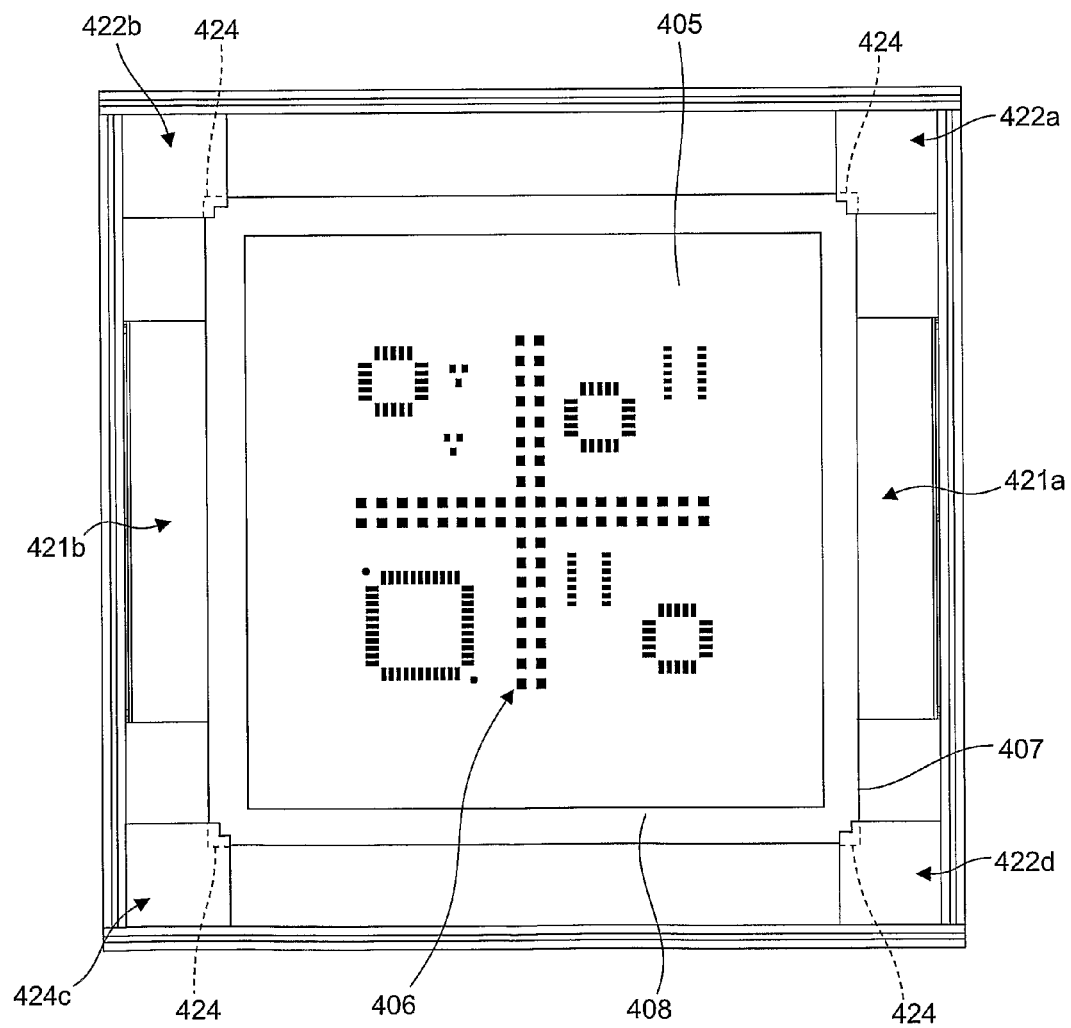
Figure 42:
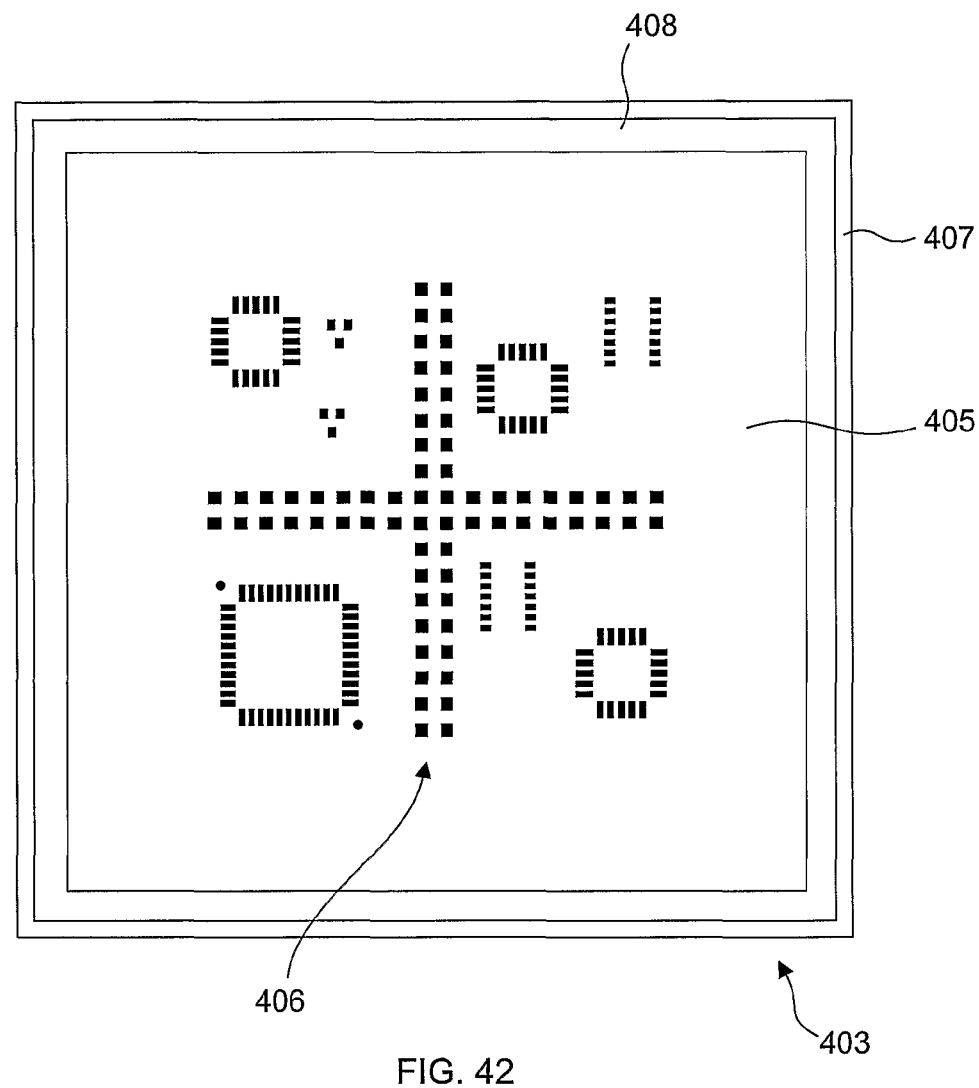
Figure 43:
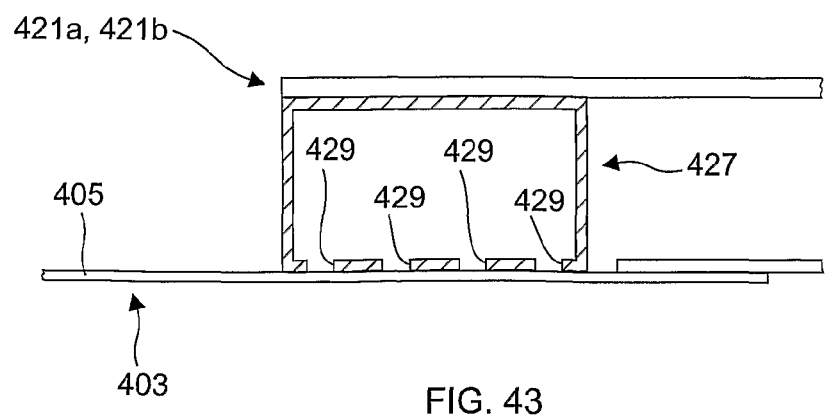
Figure 44C:
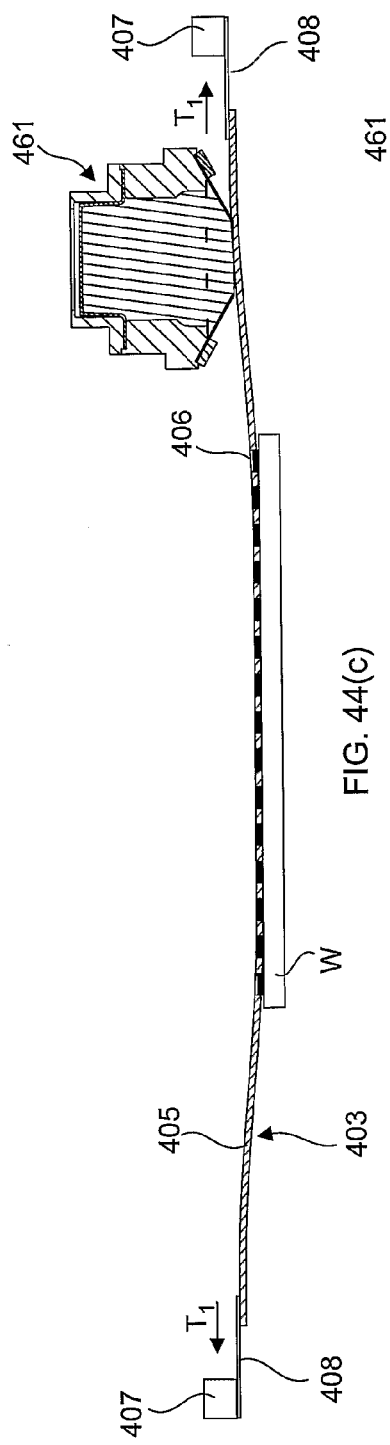
Figure 44D:
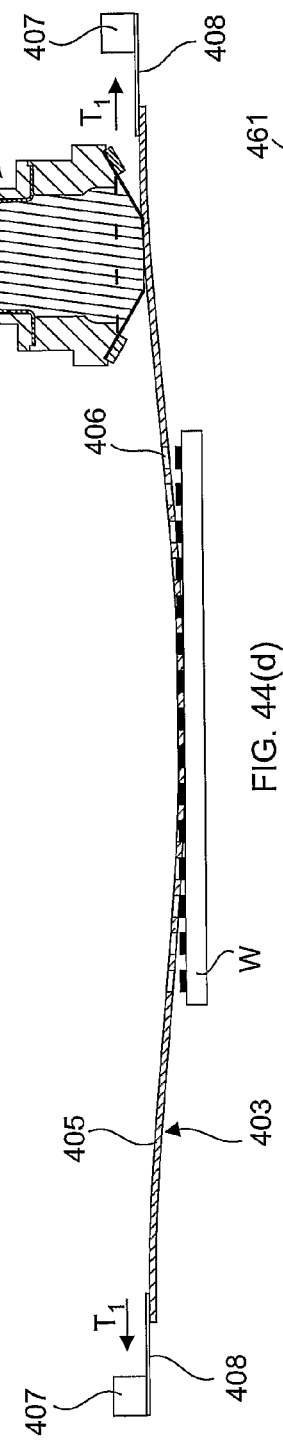
Figure 44E:
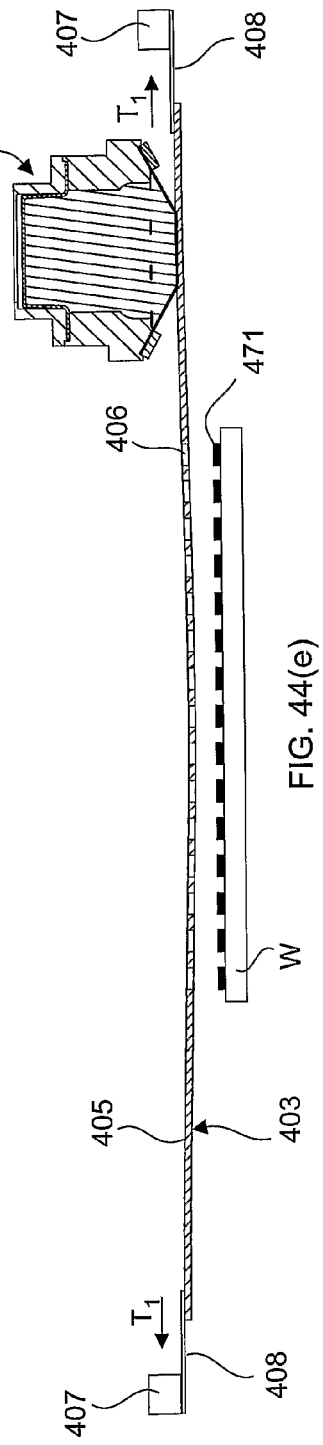

FIGS. 6(a) to (e) illustrate vertical sectional views (along section I-I in FIG. 1) of the printing screen unit in the support system of FIG. 1 at respective stages in the printing and separation phases of a screen printing operation in operation of the support system of FIG. 1;

FIG. 7 illustrates a support system in accordance with a second embodiment of the present invention;

FIG. 8 illustrates the underside of the support assembly of the support system of FIG. 7;

FIG. 9 illustrates the printing screen unit which is supported in the support assembly of the support system of FIG. 7;

FIG. 10 illustrates a vertical sectional view through one of the screen clamping units of the support assembly of the support system of FIG. 7;

FIG. 11 illustrates the attachment member of one of the tensioning units of the tensioning mechanism of the support system of FIG. 7;

FIGS. 12(a) to (e) illustrate vertical sectional views (along section II-II in FIG. 7) of the printing screen unit in the support system of FIG. 7 at respective stages in the printing and separation phases of a screen printing operation in one mode of operation of the support system of FIG. 7;

FIGS. 13(a) to (e) illustrate vertical sectional views (along section II-II in FIG. 7) of the printing screen unit in the support system of FIG. 7 at respective stages in the printing and separation phases of a screen printing operation in another mode of operation of the support system of FIG. 7;

FIG. 14 illustrates one modification of the screen clamping units of the support assembly of the support system of FIG. 7;

FIG. 15 illustrates another modification of the screen clamping units of the support assembly of the support system of FIG. 7;

FIG. 16 illustrates a support system in accordance with a third embodiment of the present invention;

FIGS. 17(a) to (e) illustrate vertical sectional views (along section III-III in FIG. 16) of the printing screen unit in the support system of FIG. 16 at respective stages in the printing and separation phases of a screen printing operation in one mode of operation of the support system of FIG. 16;

FIGS. 18(a) to (e) illustrate vertical sectional views (along section III-III in FIG. 16) of the printing screen unit in the support system of FIG. 16 at respective stages in the printing and separation phases of a screen printing operation in another mode of operation of the support system of FIG. 16;

FIG. 19 illustrates a support system in accordance with a fourth embodiment of the present invention;

FIG. 20 illustrates the underside of the support assembly of the support system of FIG. 19;

FIG. 21 illustrates the printing screen unit which is supported in the support assembly of the support system of FIG. 19;

FIG. 22 illustrates a vertical sectional view through one of the screen clamping units of the support assembly of the support system of FIG. 19;

FIG. 23 illustrates an upper perspective view of the connection of one of the attachment members of the printing screen unit and the attachment member of a respective one of the tensioning units of the support assembly of the support system of FIG. 19, where illustrated in the relaxed state;

FIG. 24 illustrates a lower perspective view of the connection of FIG. 23, where illustrated in the relaxed state;

FIG. 25 illustrates a vertical sectional view through the connection of FIG. 23, where illustrated in the tensioned state;

FIGS. 26(a) and (b) illustrate vertical sectional views (along section IV-IV in FIG. 19) of the printing screen unit in the support system of FIG. 19 at respective stages in the printing phase of a screen printing operation in one mode of operation of the support system of FIG. 19;

FIGS. 26(c) to (e) illustrate vertical sectional views (along section V-V in FIG. 19) of the printing screen unit in the support system of FIG. 19 at respective stages in the separation phase of a screen printing operation in the one mode of operation of the support system of FIG. 19;

FIGS. 27(a) and (b) illustrate vertical sectional views (along section IV-IV in FIG. 19) of the printing screen unit in the support system of FIG. 19 at respective stages in the printing phase of a screen printing operation in another mode of operation of the support system of FIG. 19;

FIGS. 27(c) to (e) illustrate vertical sectional views (along section V-V in FIG. 19) of the printing screen unit in the support system of FIG. 19 at respective stages in the separation phase of a screen printing operation in the other mode of operation of the support system of FIG. 19;

FIG. 28 illustrates an upper perspective view of the connection of one modified attachment member for the printing screen unit and one modified attachment member for the tensioning units of the support assembly of the support system of FIG. 19, where illustrated in the relaxed state;

FIG. 29 illustrates a lower perspective view of the modified connection of FIG. 28, where illustrated in the relaxed state;

FIG. 30 illustrates a vertical sectional view through the modified connection of FIG. 28, where illustrated in the tensioned state;

FIG. 31 illustrates an upper perspective view of the connection of another modified attachment member for the printing screen unit and another modified attachment member for the tensioning units of the support assembly of the support system of FIG. 19, where illustrated in the relaxed state;

FIG. 32 illustrates a lower perspective view of the modified connection of FIG. 31, where illustrated in the relaxed state;

FIG. 33 illustrates a vertical sectional view through the modified connection of FIG. 31, where illustrated in the tensioned state;

FIG. 34 illustrates a support system in accordance with a fifth embodiment of the present invention;

FIG. 35 illustrates the underside of the support assembly of the support system of FIG. 34;

FIG. 36 illustrates the printing screen unit which is supported in the support assembly of the support system of FIG. 34;

FIG. 37 illustrates a vertical sectional view through one of the screen clamping units of the support assembly of the support system of FIG. 34;

FIGS. 38(a) to (e) illustrate vertical sectional views (along section VI-VI in FIG. 34) of the printing screen unit in the support system of FIG. 34 at respective stages in the printing and separation phases of a screen printing operation in one mode of operation of the support system of FIG. 34;

FIGS. 39(a) to (e) illustrate vertical sectional views (along section VI-VI in FIG. 34) of the printing screen unit in the support system of FIG. 34 at respective stages in the printing and separation phases of a screen printing operation in another mode of operation of the support system of FIG. 34;

FIG. 40 illustrates a support system in accordance with a sixth embodiment of the present invention;

FIG. 41 illustrates the underside of the support assembly of the support system of FIG. 40;

FIG. 42 illustrates the printing screen unit which is supported in the support assembly of the support system of FIG. 40;

FIG. 43 illustrates a vertical sectional view through one of the screen clamping units of the support assembly of the support system of FIG. 40; and FIGS. 44(a) to (e) illustrate vertical sectional views (along section VII-VII in FIG. 40) of the printing screen unit in the support system of FIG. 40 at respective stages in the printing and separation phases of a screen printing operation in operation of the support system of FIG. 40.

FIGS. 1 to 6 illustrate a support system for supporting a printing screen unit 3 in a screen printing machine in accordance with a first embodiment of the present invention.

Figure 3:
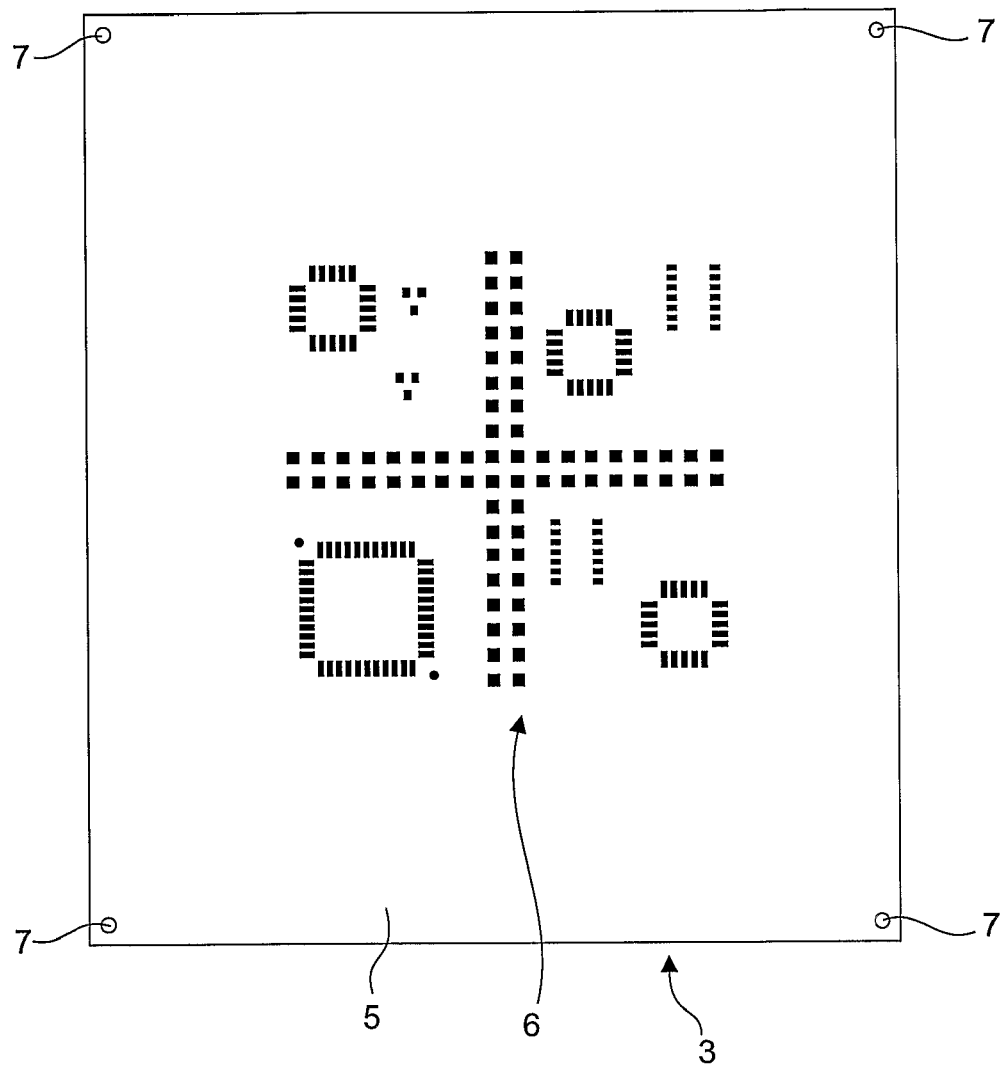
FIG. 3 illustrates the printing screen unit which is supported in the support assembly of the support system of FIG. 1.

In this embodiment, as illustrated in FIG. 3, the printing screen unit 3 comprises a printing screen 5, here rectangular in shape, which includes a pattern of printing apertures 6 which define the pattern of deposits to be printed, and attachment apertures 7 at the respective corners thereof to which attachment members 27 of a tensioning mechanism 18 are attached to provide for tensioning of the printing screen 5, as will be described in more detail hereinbelow. It will be appreciated that the embodied pattern of printing apertures 6 is given only for the purposes of exemplification, and the pattern of printing apertures 6 could have any desired configuration. The pattern of printing apertures 6 can be formed, for example, by laser cutting or etching, as is well known in the art. In preferred embodiments the printing screen 5 comprises a sheet of a metal, such as stainless steel, or a plastic.

The support system comprises a support assembly 15 in which the printing screen unit 3 is supported, and a control unit 16 for controlling the operation of the support assembly 15.

The support assembly 15 comprises a support unit 17 in which the printing screen unit 3 is supported, and a tensioning mechanism 18 for tensioning the printing screen 5 of the printing screen unit 3.

The support unit 17 comprises a support frame 20, in this embodiment rectangular in shape, and first and second screen guiding units 21a, 21b which are disposed to one pair of opposite edges of the support frame 20 such as to define a pre-defined plane in which the printing screen 5 of the printing screen unit 3 is to be tensioned. In this embodiment, as will be described in more detail hereinbelow, the support assembly 15 is configured such that the screen guiding units 21a, 21b are disposed at positions corresponding to the respective ends of the printing screen unit 3 in the printing direction P. In an alternative embodiment the support assembly 15 could be configured such that the screen guiding units 21a, 21b are disposed at positions corresponding to the respective sides of the printing screen unit 3 in the printing direction P.

In this embodiment the support frame 20 includes referencing elements 22a, 22b at first and second adjacent corners thereof such as to allow for referencing of the position of the printing screen 5 of the printing screen unit 3, as will be described in more detail hereinbelow.

Figure 4:
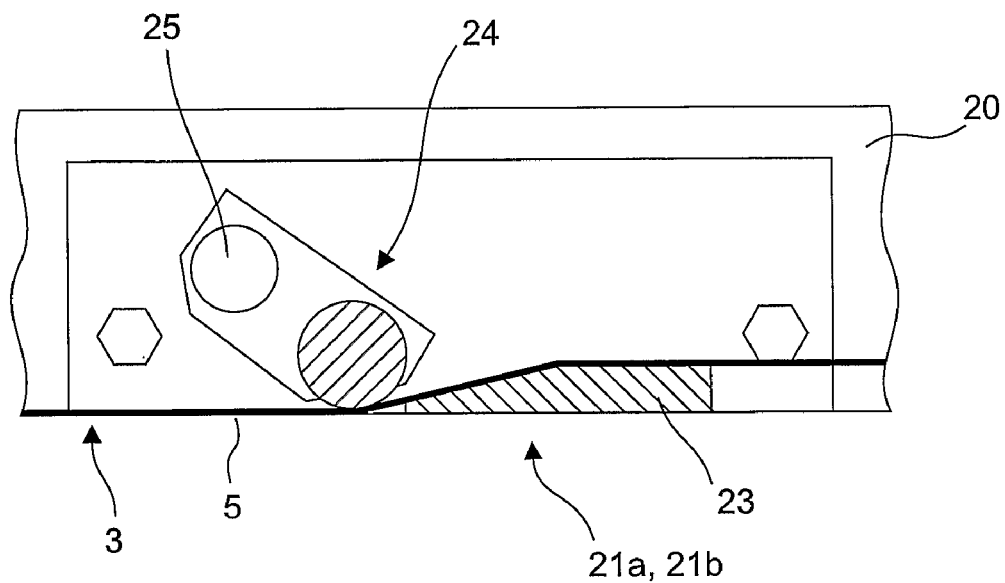
FIG. 4 illustrates a vertical sectional view through one of the screen guiding units of the support assembly of the support system of FIG. 1.

Referring particularly to FIG. 4, in this embodiment the screen guiding units 21a, 21b each comprise a first, lower guide member 23, in this embodiment an elongate element having a downwardly and inwardly tapering upper surface at the inner edge thereof over which the printing screen 5 extends and a planar lower surface, and a second, upper guide member 24, in this embodiment an elongate roller rotatable about the longitudinal axis thereof, which is hinged such as to allow for fitting of the printing screen unit 3 in the support assembly 15 and, on fitting of the printing screen unit 3, is locked in juxtaposed relationship to the tapered, upper edge surface of the lower guide member 23 at such a height as to fix the lower surface of the printing screen 5 in the same plane as the lower surface of the lower guide member 23. In this embodiment the upper guide member 24 is hinged about pivots 25, 25 at the ends thereof. With this configuration, the screen guiding units 21a, 21b provide that the upper guide members 24 thereof can be locked at a varying height in dependence upon the thickness of the printing screen 5, thereby allowing for the use of printing screen units 3 having printing screens 5 of different thickness.

The tensioning mechanism 18 comprises first to fourth tensioning units 26a-d for applying a tension to opposed corners of the printing screen 5 of the printing screen unit 3.

The tensioning units 26a-d each comprise an attachment member 27 for attachment to a respective corner of the printing screen unit 3, an actuator 28, in this embodiment a pneumatic actuator, for generating a tensioning force, and a coupling assembly 29 for coupling the attachment member 27 and the actuator 28 such as to provide for tensioning of the attachment member 27 with the tensioning force.

Figure 5:
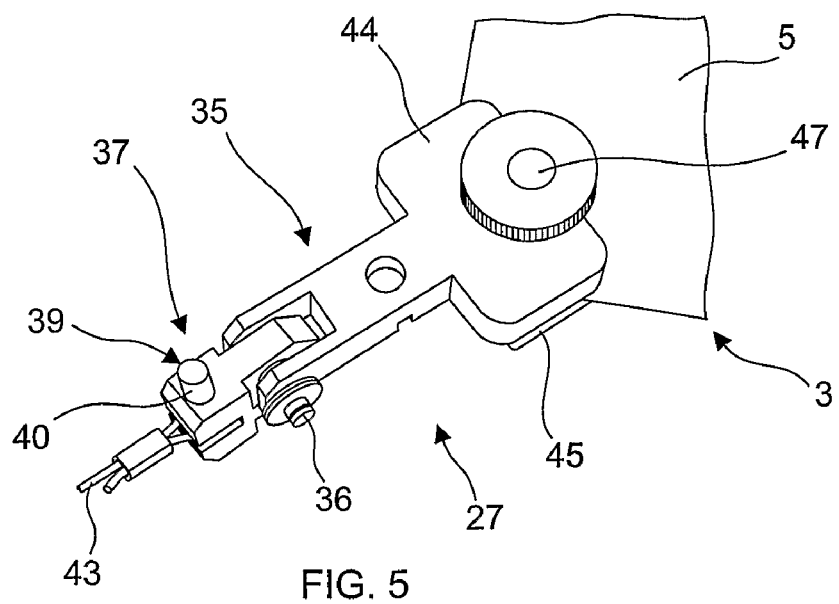
FIG. 5 illustrates the attachment member of one of the tensioning units of the tensioning mechanism of the support system of FIG. 1.

Referring particularly to FIG. 5, the attachment member 27, in this embodiment a screw clamp, comprises a first, clamp body 35 which is clamped to the respective corner of the printing screen unit 3 and includes a pivot 36 having an axis parallel to the plane of the printing screen 5, and a second, connector body 37 which is pivotally connected to the main clamp body 35 about the pivot 36 thereof and includes a pivot 39 having an axis orthogonal to the plane of the printing screen 5 to which the respective coupling assembly 29 is pivotally connected. In this embodiment the pivot 39 defines a referencing lug 40, which, where the attachment member 27 is of the first and second tensioning units 26a, 26b, provides for referencing of the attachment members 27 of the first and second tensioning units 26a, 26b to respective ones of the first and second referencing elements 22a, 22b of the support frame 20, as will be described in more detail hereinbelow.

In this embodiment the coupling assembly 29 comprises a pulley 41 which is disposed at a respective corner of the support frame 20 and a cable 43 which is connected to the pivot 39 of the connector body 37 of the respective attachment member 27 and the respective actuator 28.

In this embodiment the clamp body 35 comprises a first, upper clamping member 44 which is disposed to an upper surface of the printing screen 5, a second, lower clamping member 45 which is disposed to a lower surface of the printing screen 5, and a screw pin 47 which extends through the attachment aperture 7 in the respective corner of the printing screen 5 and is threadedly engaged with the upper and lower clamping members 44, 45 such as provide for clamping of the printing screen 5 therebetween.

The control unit 16 comprises a tensioning unit actuator 49, in this embodiment a pneumatic supply, which is operable to operate the tensioning units 26a-d of the tensioning mechanism 18. The tensioning unit actuator 49 is connected to the actuator 28 of each of the respective tensioning units 26a-d, in this embodiment by respective pneumatic lines 53, such as to provide for actuation of the actuators 28 of the tensioning units 26a-d.

In this embodiment the tensioning unit actuator 49 is configured such that the tensioning mechanism 18 applies a tension first to one, in this embodiment the first tensioning unit 26a such as to draw one corner of the printing screen unit 3 to a first reference position, as defined by the referencing lug 40 on the attachment member 27 of the first tensioning unit 26a abutting the first reference element 22a on the support frame 20, then a tension to the second tensioning unit 26b, which is adjacent the first tensioning unit 26a, such as to draw the adjacent corner of the printing screen unit 3 to a second reference position, as defined by the referencing lug 40 of the attachment member 27 of the second tensioning unit 26b abutting the second reference element 22b on the support frame 20, and subsequently to the pair of tensioning units 26c, 26d to the other, opposite side of the printing screen unit 3, thereby to achieve an even tension to the printing screen 5. In this embodiment the sequencing of the tensioning of the tensioning units 26a-d is provided by throttle valves, which act to throttle the rate of pressure increase to the actuators 28 of the tensioning units 26a-d.

The control unit 16 further comprises a controller 51 for controlling the tensioning unit actuator 49 in a screen printing operation.

With this configuration, the support system provides for the application of differing tensions to the printing screen 5 of the printing screen unit 3.

In this embodiment the controller 51 is configured to tension the printing screen 5 to one of a first, higher tension state during the printing phase such as to prevent lateral, in-plane movement of the printing screen 5, and a second, lower tension state during the separation phase in separating the printing screen 5 from a workpiece once printed.

The present inventors have recognized that the application of different tensions to the printing screen 5 in the different phases of the screen printing operation, namely, the printing and separation phases, allows for the use of a high tension, such as currently used, during the printing phase in tensioning the printing screen 5 so as to fix the lateral, in-plane position of the printing screen 5, and yet advantageously allows for the application of a lower tension, in one embodiment no tension, of the printing screen 5 during the separation phase. In tensioning the printing screen 5 to a much lower tension during the separation phase, the lower tensioning force enables the use of a lower separation force in separating the printing screen 5 from the workpiece. The use of a lower separation force is possible as the lower tensioning force provides for greater out-of plane deflection of the printing screen 5, which acts to promote the peeling action of the printing screen 5 in separating the printing screen 5 from a printed workpiece. In addition, in promoting the peeling action of the printing screen 5, a more regulated, progressive peeling action is achieved across the printing screen 5, with there being no high separation force acting to instantly separate the printing screen 5 from a printed workpiece, as would occur when such a high separation force exceeds the adhesive effect of the remaining printing medium in contact with both the printing screen 5 and the workpiece. In addition, in providing for a much lower tensioning force during the separation phase, the stresses caused by the out-of-plane deflection are so much lower than those created by the typical high tensioning force as not to cause any significant micro-displacement of the printing screen 5, and thereby provides for the printing of much improved deposits.

Operation of the support system will now be described hereinbelow with reference to FIGS. 6(a) and (e) of the accompanying drawings.

Prior to printing a workpiece W using a printing head 61, as illustrated in FIG. 6(a), the controller 51 acts to control the tensioning unit actuator 49 to tension the printing screen 5 to a first, high tension $T_1$, as currently employed in existing tensioning systems, such as to fix the lateral, in-plane position of the printing screen 5.

In this embodiment the printing head 61 comprises an elongate main body 62, and first and second wiper blades 63, 65, here elongate elements, which are attached to a lower surface of the main body 62. The wiper blades 63, 65 are inwardly and downwardly directed and define an outlet aperture 67 through which printing medium is delivered, and together with the main body 62 defines a chamber 69 which contains printing medium.

In a printing phase, as illustrated in FIG. 6(b), the high tension $T_1$ as applied to the printing screen 5 acts to maintain the laterals in-plane position of the printing screen 5 during traversal of the printing head 61 thereover, with the printing head 61 acting to force printing medium into the printing apertures 6 in the printing screen 5.

Following printing, and prior to commencement of the separation phase, the controller 51 acts to control the tensioning unit actuator 49 to tension the printing screen 5 to a second tension $T_2$ which is lower than the first, high tension $T_1$ as applied during the printing phase.

In the separation phase, as illustrated in FIGS. 6(c) and (d), the printing screen 5 is peeled away from the workpiece W in a controlled manner along advancing peeling fronts from opposite edges of the workpiece W to leave a pattern of printed deposits 71 having the same pattern as the pattern of printing apertures 6 in the printing screen 5.

In this embodiment, the screen guiding units 21a, 21b act to constrain the deflection of the printing screen 5 such that the deflection is uniform along the length of the advancing peeling fronts, thereby defining a flattened U-shape deflection profile. By constraining the axis of peeling in this manner, a more controlled peel is achieved as compared to arrangements where the peeling occurs along more then one axis and causes a "concave" deflection of the printing screen 5.

As described hereinabove, through tensioning the printing screen 5 to the second, lower tension $T_2$, the peeling effect in peeling the printing screen 5 from the workpiece W is promoted and provides for improved separation of the workpiece W from the printing screen 5, thereby providing printed deposits 71 of improved quality.

On completion of the separation phase, as illustrated in FIG. 6(c) the workpiece W is separated from the printing screen unit 3, and the above-described screen printing operation can be repeated in printing another workpiece W.

FIGS. 7 to 13 illustrate a support system for supporting a printing screen unit 103 in a screen printing operation in accordance with a second embodiment of the present invention.

Referring to FIG. 9, in this embodiment the printing screen unit 103 comprises a printing screen 105, here rectangular in shape, which includes a pattern of printing apertures 106 which define the pattern of deposits to be printed, attachment apertures 107 at the respective corners thereof to which attachment members 127 of a tensioning mechanism 118 are attached, as will be described in more detail hereinbelow, and first and second sets of clamping apertures 108a, 108b. The pattern of printing apertures 106 can be formed, for example, by laser cutting or etching, as is well known in the art. The attachment apertures 107 and the clamping apertures 108a, 108b can be formed, for example, by punching, laser cutting or etching, as is well known in the art. In preferred embodiments the printing screen 105 comprises a sheet of a metal, such as stainless steel, or a plastic.

The support system comprises a support assembly 115 in which the printing screen unit 103 is supported, and a control unit 116 for controlling the operation of the support assembly 115.

The support assembly 115 comprises a support unit 117 in which the printing screen unit 103 is supported, and a tensioning mechanism 118 for tensioning the printing screen 105 of the printing screen unit 103.

The support unit 117 comprises a support frame 120, in this embodiment rectangular in shape, first and second screen clamping units 121a, 121b which are disposed to one pair of opposite edges of the support frame 120 and operable to clamp the printing screen 105, when tensioned, in a predefined plane, as will be described in more detail hereinbelow. In this embodiment the support assembly 115 is configured such that the screen clamping units 121a, 121b are disposed at positions corresponding to the respective ends of the printing screen unit 103 in the printing direction P. In an alternative embodiment the support assembly 115 could be configured such that the screen clamping units 121a, 121b are disposed at positions corresponding to the respective sides of the printing screen unit 103 in the printing direction P.

In this embodiment the support frame 120 includes referencing elements 122a, 122b at first and second adjacent corners thereof such as to allow for referencing of the position of the printing screen 105 of the printing screen unit 103, as will be described in more detail hereinbelow.

Referring particularly to FIG. 10, in this embodiment the screen clamping units 121a, 121b each comprise a first, lower clamping member 123, in this embodiment an elongate member having a downwardly and inwardly tapering upper surface at the inner edge thereof over which the printing screen 105 extends and a planar lower surface, and a second, upper clamping member 124 which is operable such as to be clamped to the lower clamping member 123 and thereby clamp the printing screen 105 in a fixed lateral, in-plane position, with the lower surface of the printing screen 105 being in the same plane as the lower surface of the lower clamping member 123. In this embodiment the upper clamping member 124 comprises a hollow, elongate vacuum bar which includes vacuum apertures 125, here first and second slots, in the lower surface thereof which are configured such as to be in registration with a respective one of the sets of clamping apertures 108a, 108b in the printing screen 105, when tensioned. On applying a vacuum to the upper clamping member 124, the upper clamping member 124 is clamped against the lower clamping member 123, thereby clamping the printing screen 105 therebetween by virtue of the applied vacuum acting on the upper surface of the lower clamping member 123 which is exposed at the respective set of clamping apertures 108a, 108b. With this configuration, the screen-clamping units 121a, 121b allow for the use of printing screens 105 of different thickness.

The tensioning mechanism 118 comprises first to fourth tensioning units 126a-d for applying a tension to opposed corners of the printing screen 105.

The tensioning units 126a-d each comprise an attachment member 127 for attachment to a respective corner of the printing screen unit 103, an actuator 128, in this embodiment a pneumatic actuator, for generating a tensioning force, and a coupling assembly 129 for coupling the attachment member 127 and the actuator 128 such as to provide for tensioning of the attachment member 127 with the tensioning force.

Referring particularly to FIG. 11, the attachment member 127, in this embodiment a screw clamp, comprises a first, clamp body 135 which is clamped to the respective corner of the printing screen unit 103 and includes a pivot 136 having an axis parallel to the plane of the printing screen 105, and a second, connector body 137 which is pivotally connected to the clamp body 135 about the pivot 136 thereof and includes a pivot 139 having an axis orthogonal to the plane of the printing screen 105 to which the coupling assembly 129 is pivotally connected. In this embodiment the pivot 139 defines a referencing lug 140, which, where the attachment member 127 is of the first and second tensioning units 126a, 126b, provides for referencing of the attachment members 127 of the first and second tensioning units 126a, 126b to respective ones of the first and second referencing elements 122a, 122b of the support frame 120, as will be described in more detail hereinbelow.

In this embodiment the coupling assembly 129 comprises a pulley 141 which is disposed at a respective corner of the support frame 120 and a cable 143 which is connected to the pivot 139 of the connector body 137 of the respective attachment member 127 and the respective actuator 128.

In this embodiment the clamp body 135 comprises a first, upper clamping member 144 which is disposed to an upper surface of the printing screen 105, a second, lower clamping member 145 which is disposed to a lower surface of the printing screen 105, and a screw pin 147 which extends through the attachment aperture 107 in the respective corner of the printing screen 105 and is threadedly engaged with the upper and lower clamping members 144, 145 such as to provide for clamping of the printing screen 105 therebetween.

The control unit 116 comprises a tensioning unit actuator 149, in this embodiment a pneumatic supply, which is operable to actuate the actuators 128 of the tensioning units 126a-d to apply predeterminable tensions to the printing screen 105 of the printing screen unit 103. The tensioning unit actuator 149 is connected to the actuator 128 of each of the respective tensioning units 126a-d, in this embodiment by respective pneumatic lines 153, such as to provide for actuation of the actuators 128 of the tensioning units 126a-d.

In this embodiment the tensioning unit actuator 149 is configured such that the tensioning mechanism 118 applies a tension first to one, in this embodiment the first tensioning unit 126a such as to draw one corner of the printing screen unit 103 to a first reference position, as defined by the referencing lug 140 on the attachment member 127 of the first tensioning unit 126a abutting the first reference element 122a on the support frame 120, then a tension to the second tensioning unit 126b, which is adjacent the first tensioning unit 126a, such as to draw the adjacent corner of the printing screen unit 103 to a second reference position, as defined by the referencing lug 140 of the attachment member 127 of the second tensioning unit 126b abutting the second reference element 122b on the support frame 120, and subsequently to the pair of tensioning units 126c, 126d to the other, opposite side of the printing screen unit 103, thereby to achieve an even tension to the printing screen 105. In this embodiment the sequencing of the tensioning of the tensioning units 126a-d is provided by throttle valves, which act to throttle the rate of pressure increase to the actuators 128 of the tensioning units 126a-d.

The control unit 116 further comprises a clamping unit actuator 155, in this embodiment a vacuum supply, which is operable to actuate the screen clamping units 121a, 121b to clamp the printing screen 105 in a fixed lateral position. The clamping unit actuator 155 is connected to each of the screen clamping units 121a, 121b, in this embodiment by respective vacuum lines 157, such as to provide for actuation of the screen clamping units 121a, 121b.

The control unit 116 further comprises a controller 159 for controlling the tensioning unit actuator 149 and the clamping unit actuator 155 in a screen printing operation.

With this configuration, the support system enables the application of differing tensions to the printing screen 105 in a screen printing operation, and also provides for the clamping of the printing screen 105 in a fixed lateral, in-plane position during the printing phase.

In this embodiment, in one mode of operation, the controller 159 is configured, in the printing phase in printing a workpiece, to control the tensioning unit actuator 149 to actuate the tensioning units 126a-d to tension the printing screen 105 to a first, high tension state and the clamping unit actuator 155 to actuate the screen clamping units 121a, 121b to clamp the printing screen 105 such as to prevent lateral, in-plane movement of the printing screen 105, and, in the separation phase in separating the printing screen 105 from a workpiece once printed, to control the tensioning unit actuator 149 to actuate the tensioning units 126a-d to tension the printing screen 105 to a second, lower tension state and, here subsequently, the clamping unit actuator 155 to de-actuate the screen clamping units 121a, 121b to release the printing screen 105 from the clamped state.

The present inventors have recognized that the application of different tensions to the printing screen 105 in different phases of the screen printing operation, namely, the printing and separation phases, allows for the use of a high tension, such as currently used, during the printing phase in tensioning the printing screen 105 so as to fix the lateral, in-plane position of the printing screen 105, and yet advantageously allows for tensioning of the printing screen 105 to a lower tension in the separation phase. In tensioning the printing screen 105 to a much lower tension during the separation phase, the lower tensioning force enables the use of a lower separation force in separating the printing screen 105 from the workpiece. The use of a lower separation force is possible as the lower tensioning force provides for greater out-of plane deflection of the printing screen 105, which acts to promote the peeling action of the printing screen 105 in separating the printing screen 105 from a printed workpiece. In addition, in promoting the peeling action of the printing screen 105, a more regulated, progressive peeling action is achieved across the printing screen 105, with there being no high separation force acting to instantly separate the printing screen 105 from a printed workpiece as would occur when such a high separation force exceeds the adhesive effect of the remaining printing medium in contact with both the printing screen 105 and the workpiece. In addition, in providing for a much lower tensioning force during the separation phase, the stresses caused by the out-of-plane deflection of the printing screen 105 are so much lower than those created by the typical high tensioning force as not to cause any significant micro-displacement of the printing screen 105, and thereby provides for the printing of much improved deposits.

The present inventors have also recognized that, through clamping the printing screen 105 so as to prevent lateral, in-plane movement thereof during the printing phase, the tensioning force applied to the printing screen 105 during the printing phase can be reduced from that currently used in existing tensioning systems. Also, by maintaining the printing screen 105 in the clamped state when altering the tension thereof as applied by the tensioning units 126a-d, the tensioning force as applied by each of the tensioning units 126a-d can be allowed to equilibriate, thereby avoiding the possibility of different tensioning forces being applied by different ones of the tensioning units 126a-d, which could possibly lead to displacement of the printing screen 105.

In this embodiment, in another mode of operation, the controller 159 is configured to control the tensioning unit actuator 149 to actuate the tensioning units 126a-d to tension the printing screen 105 to one tension state during the screen printing operation, that is, both the printing and separation phases, and the clamping unit actuator 155 to actuate the screen clamping units 121a, 121b to clamp the printing screen 105 during the printing phase such as to prevent lateral movement of the printing screen and de-actuate the screen clamping units 121a, 121b prior to the separation phase to release the printing screen 105 from the clamped state.

The present inventors have recognized that, through clamping the printing screen 105 so as to prevent lateral movement thereof during the printing phase, the tensioning force applied to the printing screen 105 during the printing phase can be reduced from the high tension as currently used in existing tensioning systems. The tensioning force applied to printing screen 105 during the printing phase need only be sufficient to render the printing screen 105 in the planar configuration as required for printing, and need not approach the high tensioning force employed by the current tensioning systems to fix the lateral, in-plane position of the printing screen 105 during printing.

Operation of the support system will now be described hereinbelow.

In this embodiment the printing head 161 comprises an elongate main body 162, and first and second wiper blades 163, 165, here elongate elements, which are attached to a lower surface of the main body 162. The wiper blades 163, 165 are inwardly and downwardly directed and define an outlet aperture 167 through which printing medium is delivered, and together with the main body 162 define a chamber 169 which contains printing medium.

One mode of operation of the support system will now be described hereinbelow with reference to FIGS. 12(a) to (e) of the accompanying drawings.

Prior to printing a workpiece W using the printing head 161, as illustrated in FIG. 12(a), the controller 159 acts to control the tensioning unit actuator 149 to actuate the tensioning units 126a-d to tension the printing screen 105 to a first tension $T_1$, where the first tension $T_1$ is such as at least to render the printing screen 105 in a planar configuration, and the clamping unit actuator 155 to actuate the screen clamping units 121a, 121b to clamp the printing screen 105 and thereby fix the lateral, in-plane position thereof.

In a printing phase, as illustrated in FIG. 12(b), the screen clamping units 121a, 121b act to maintain the lateral, in-plane position of the printing screen 105 during traversal of the printing head 161 thereover, with the printing head 161 acting to force printing medium into the printing apertures 106 in the printing screen 105.

Following printing, and at the commencement of the separation phase, the controller 159 acts to control the tensioning unit actuator 149 to actuate the tensioning units 126a-d to tension the printing screen 105 to a second tension $T_2$ which is lower than the first tension $T_1$ as applied during the printing phase, and the clamping unit actuator 155 to de-actuate the screen clamping units 121a, 121b, and thereby release the printing screen 105 from the clamped state.

In the separation phase, as illustrated in FIGS. 12(c) and (d), the printing screen 105 is peeled away from the workpiece W in a controlled manner along advancing peeling fronts from opposite edges of the workpiece W to leave a pattern of printed deposits 171 having the same pattern as the pattern of printing apertures 106 in the printing screen 105.

In this embodiment, the screen clamping units 121a, 121b act to constrain the deflection of the printing screen 105 such that the deflection is uniform along the length of the advancing peeling fronts, thereby defining a flattened U-shape deflection profile. By constraining the axis of peeling in this manner, a more controlled peel is achieved as compared to arrangements where the peeling occurs along more than one axis and causes a "concave" deflection of the printing screen 105.

As described hereinabove, through tensioning the printing screen 105 to the second, lower tension $T_2$ during the separation phase, the peeling effect in peeling the printing screen 105 from the workpiece W is promoted and provides for improved separation of the workpiece W from the printing screen 105, thereby providing printed deposits 171 of improved quality.

On completion of the separation phase, as illustrated in FIG. 12(e), the workpiece W is separated from the printing screen unit 103, and the above-described screen printing operation can be repeated in printing another workpiece W.

Another mode of operation of the support system will now be described hereinbelow with reference to FIGS. 13(a) to (e) of the accompanying drawings.

Prior to printing a workpiece W using the printing head 161, as illustrated in FIG. 13(a), the controller 159 acts to control the tensioning unit actuator 149 to actuate the tensioning units 126a-d to tension the printing screen 105 to a predeterminable tension $T_1$, where the tension $T_1$ is such as at least to render the printing screen 105 in a planar configuration, and the clamping unit actuator 155 to actuate the screen clamping units 121a, 121b to clamp the printing screen 105 and thereby fix the lateral, in-plane position thereof.

In a printing phase, as illustrated in FIG. 13(b), the screen clamping units 121a, 121b act to maintain the lateral, in-plane position of the printing screen 105 during traversal of the printing head 161 thereover, with the printing head 161 acting to force printing medium into the printing apertures 106 in the printing screen 105.

Following printing, and at the commencement of the separation phase, the controller 159 acts to control the clamping unit actuator 155 to de-actuate the screen clamping units 121a, 121b, and thereby release the printing screen 105 from the clamped state.

In the separation phase, as illustrated in FIGS. 13(c) and (d), the printing screen 105 is peeled away from the workpiece W in a controlled manner along advancing peeling fronts from opposite edges of the workpiece W to leave a pattern of printed deposits 171 having the same pattern as the pattern of printing apertures 106 in the printing screen 105.

In this embodiment, the screen clamping units 121a, 121b act to constrain the deflection of the printing screen 105 such that the deflection is uniform along the length of the advancing peeling fronts, thereby defining a flattened U-shape deflection profile. By constraining the axis of peeling in this manner, a more controlled peel is achieved as compared to arrangements where the peeling occurs along more than one axis and causes a "concave" deflection of the printing screen 105.

As described hereinabove, through tensioning the printing screen 105 to a tension $T_1$ which is lower than that currently employed by existing tensioning systems, the peeling effect in peeling the printing screen 105 from the workpiece W is promoted and provides for improved separation of the workpiece W from the printing screen 105, thereby providing printed deposits 171 of improved quality.

On completion of the separation phase, as illustrated in FIG. 13(c), the workpiece W is separated from the printing screen unit 103, and the above-described screen printing operation can be repeated in printing another workpiece W.

In one modification, as illustrated in FIG. 14, the screen clamping clamp units 121a, 121b could comprise only one, upper clamping member 124 and the printing screen unit 103 modified such as to omit the sets of clamping apertures 108a, 108b from the printing screen 105. With this configuration, the printing screen 105 is clamped to the upper clamping members 124 of the screen clamping units 121a, 121b by the action of the vacuum on the exposed surfaces of the printing screen 105 at the vacuum apertures 125 in the respective upper clamping members 124, with the height of the printing screen 105 being fixed in a pre-defined plane by the planar lower surface of the upper clamping members 124. In one embodiment the clamping unit actuator 155 can be configured such as to apply a first vacuum to the upper clamping members 124 during the printing phase such as to clamp the printing screen 105 in a fixed lateral, in-plane position, and a second, lower vacuum to the upper clamping members 124 during the separation phase which is such as to allow for lateral movement of the printing screen 105 relative to the upper clamping members 124 and yet provide for the printing screen 105 at least initially to be drawn towards the respective upper clamping members 124 such as to allow for transmission of the separation force thereat.

In another modification, as illustrated in FIG. 15, the screen clamping units 121a, 121b could comprise only one clamping member 124, where comprising the above-described upper clamping member 124 in an inverted orient, which is disposed to a lower surface of the printing screen 105, and the printing screen unit 103 modified such as to omit the sets of clamping apertures 108a, 108b from the printing screen 105. With this configuration, the printing screen 105 is clamped to the clamping members 124 of the screen clamping units 121a, 121b by the action of the vacuum on the exposed surfaces of the printing screen 105 at the vacuum apertures 125 in the clamping members 124, with the height of the printing screen 105 being fixed in a pre-defined plane as defined by the planar upper surface of the clamping members 124.

FIGS. 16 to 18 illustrate a support system for supporting a printing screen unit 103 in a screen printing operation in accordance with a third embodiment of the present invention.

The support system is very similar to the support system of the above-described second embodiment, and thus, in order to avoid unnecessary duplication of description, only the differences will be described in detail.

The support system of this embodiment differs from that of the second-described embodiment in that the screen clamping units 121a, 121b are movable relative to one another in a vertical orient.

In this embodiment one, here the first screen clamping unit 121a is mounted to the support frame 120 by lifting jacks 173, in this embodiment pneumatically-operated, at the respective ends thereof, which provide for the first screen clamping unit 121a to be raised relative to the second screen clamping unit 121b in the separation phase, as will be described in more detail hereinbelow.

The control unit 116 further comprises a lifting jack actuator 175 which is operably connected to the controller 159 and is operable to actuate the lifting jacks 173 to raise the first screen clamping unit 121a relative to the second screen clamping unit 121b. The jack actuator 175 is connected to the lifting jacks 173, in this embodiment by respective pneumatic lines 177, such as to provide for actuation of the lifting jacks 173.

In this embodiment, in one mode of operation, the controller 159 is configured, in the printing phase, to control the tensioning unit actuator 149 to actuate the tensioning units 126a-d to tension the printing screen 105 to a first tension and the clamping unit actuator 155 to actuate the screen clamping units 121a, 121b to clamp the printing screen 105 such as to prevent lateral, in-plane movement of the printing screen 105, and, in the separation phase, to control the tensioning unit actuator 149 to actuate the tensioning units 126a-d to tension the printing screen 105 to a second tension lower than the first tension, the clamping unit actuator 155 to de-actuate the first clamping unit 121a to release the printing screen 105 from the clamped state thereat and the jack actuator 175 to raise the first screen clamping unit 121a to separate the printing screen 105 from a workpiece once printed.

The present inventors have recognized that the application of different tensions to the printing screen 105 in different phases of the screen printing operation, namely, the printing and separation phases, allows for the use of a high tension, such as currently used, during the printing phase in tensioning the printing screen 105 so as to fix the lateral, in-plane position of the printing screen 105, and yet advantageously allows for tensioning of the printing screen 105 to a lower tension in the separation phase. In tensioning the printing screen 105 to a much lower tension during the separation phase, the lower tensioning force enables the use of a lower separation force, as achieved by raising the first screen clamping unit 121a relative to the second screen clamping unit 121b in separating the printing screen 105 from a workpiece, which acts to promote the peeling action of the printing screen 105 in separating the printing screen 105 from a printed workpiece. In promoting the peeling action of the printing screen 105, a more regulated, progressive peeling action is achieved across the printing screen 105, with there being no high separation force acting to instantly separate the printing screen 105 from a printed workpiece as would occur when such a high separation force exceeds the adhesive effect of the remaining printing medium in contact with both the printing screen 105 and the workpiece. In addition, in providing for a much lower tensioning force during the separation phase, the stresses caused by the out-of-plane deflection of the printing screen 105 are so much lower than those created by the typical high tensioning force as not to cause any significant micro-displacement of the printing screen 105, and thereby provides for the printing of much improved deposits.

The present inventors have also recognized that, through clamping the printing screen 105 so as to prevent lateral, in-plane movement thereof during the printing phase, the tensioning force applied to the printing screen 105 during the printing phase can be reduced from that currently used in existing tensioning systems. Also, by maintaining the printing screen 105 in the clamped state when altering the tension thereof as applied by the tensioning units 126a-d, the tensioning force as applied by each of the tensioning units 126a-d can be allowed to equilibriate, thereby avoiding the possibility of different tensioning forces being applied by different ones of the tensioning units 126a-d, which could possibly lead to displacement of the printing screen 105.

In this embodiment, in another mode of operation, the controller 159 is configured to control the tensioning unit actuator 149 to actuate the tensioning units 126a-d to tension the printing screen 105 to one predeterminable tension during the entire screen printing operation, that is, both the printing and separation phases, the clamping unit actuator 155 to actuate the screen clamping units 121a, 121b to clamp the printing screen 105 in the printing phase such as to prevent lateral, in-plane movement of the printing screen 105 and de-actuate the first screen clamping unit 121a prior to the separation phase such as to allow for separation of the printing screen 105 from the workpiece by raising the first screen clamping unit 121a relative to the second screen clamping unit 121b, and the lifting jack actuator 175 to actuate the lifting jacks 173 to raise the first screen clamping unit 121a relative to the second screen clamping unit 121b.

The present inventors have recognized that, through clamping the printing screen 105 so as to prevent lateral, in-plane movement thereof during the printing phase, the tensioning force applied to printing screen 105 during the printing phase can be reduced from the high tensioning force as currently used in existing tensioning systems. The tensioning force applied to the printing screen 105 during the printing phase need only be sufficient to render the printing screen 105 in the planar configuration as required for printing, and need not approach the high tensioning force employed by the current tensioning systems to fix the lateral, in-plane position of the printing screen 105 during the printing phase. In tensioning the printing screen 105 to a much lower tension during the separation phase, the lower tensioning force enables the use of a lower separation force, as achieved by raising the first screen clamping unit 121a relative to the second screen clamping unit 121b in separating the printing screen 105 from the workpiece, which acts to promote the peeling action of the printing screen 105 in separating the printing screen 105 from a printed workpiece. In promoting the peeling action of the printing screen 105, a more regulated, progressive peeling action is achieved across the printing screen 105, with there being no high separation force acting to instantly separate the printing screen 105 from a printed workpiece as would occur when such a high separation force exceeds the adhesive effect of the remaining printing medium in contact with both the printing screen 105 and the workpiece. In addition, in providing for a much lower tensioning force during the separation phase, the stresses caused by the out-of-plane deflection of the printing screen 105 are so much lower than those created by the typical high tensioning force as not to cause any significant micro-displacement of the printing screen 105, and thereby provides for the printing of much improved deposits. Furthermore, in peeling the printing screen 105 from only one edge thereof, the other edge of the printing screen 105 remains stationary and can thus accommodate a printing head 161 following a screen printing operation.

Operation of the support system will now be described hereinbelow.

One mode of operation of the support system will now be described hereinbelow with reference to FIGS. 17(a) to (e) of the accompanying drawings.

Prior to printing a workpiece W using the printing head 161, as illustrated in FIG. 17(a), the controller 159 acts to control the tensioning unit actuator 149 to actuate the tensioning units 126a-d to tension the printing screen 105 to a first tension $T_1$, where the first tension $T_1$ is such as at least to render the printing screen 105 in a planar configuration, and the clamping unit actuator 155 to actuate the screen clamping units 121a, 121b to clamp the printing screen 105 and thereby fix the lateral, in-plane position thereof.

In a printing phase, as illustrated in FIG. 17(b), the screen clamping units 121a, 121b act to fix the lateral, in-plane position of the printing screen 105 during traversal of the printing head 161 thereover, with the printing head 161 acting to force printing medium into the printing apertures 106 in the printing screen 105.

Following printing, and at the commencement of the separation phase, the controller 159 acts first to control the tensioning unit actuator 149 to actuate the tensioning units 126a-d to tension the printing screen 105 to a second tension $T_2$ which is lower than the first tension $T_1$ as applied during the printing phase, subsequently to control the clamping unit actuator 155 to de-actuate the first screen clamping unit 121a and thereby release the printing screen 105 from the clamped state thereat, and then control the lifting jack actuator 175 to actuate the lifting jacks 173 to raise the first screen clamping unit 121a to separate the printing screen 105 from the workpiece W.

In the separation phase, as illustrated in FIGS. 17(c) and (d), by raising the first screen clamping unit 121a relative to the second screen clamping unit 121b, the printing screen 105 is peeled away from the workpiece W in a controlled manner along an advancing peeling front from one edge of the workpiece W adjacent the first screen clamping unit 121a to leave a pattern of printed deposits 171 having the same pattern as the pattern of printing apertures 106 in the printing screen 105.

In this embodiment the screen clamping units 121a, 121b act to constrain the deflection of the printing screen as such that the deflection is uniform along the length of the advancing peeling front, thereby defining a flattened and skewed U-shape deflection profile by constraining the axis of peeling, a more controlled peel is achieved as compared to arrangements where the peeling occurs along more than one axis and causes a "concave" deflection of the printing screen 105.

As described hereinabove, through tensioning the printing screen 105 to the second, lower tension $T_2$ during the separation phase, the peeling effect in peeling the printing screen 105 from the workpiece W is promoted and provides for improved separation of the workpiece W from the printing screen 105, thereby providing printed deposits 171 of improved quality.

On completion of the separation phase, as illustrated in FIG. 17(e), the workpiece W is separated from the printing screen unit 103, and the above-described screen printing operation can be repeated in printing another workpiece W.

Another mode of operation of the support system will now be described hereinbelow with reference to FIGS. 18(a) to (e) of the accompanying drawings.

Figure 18A:
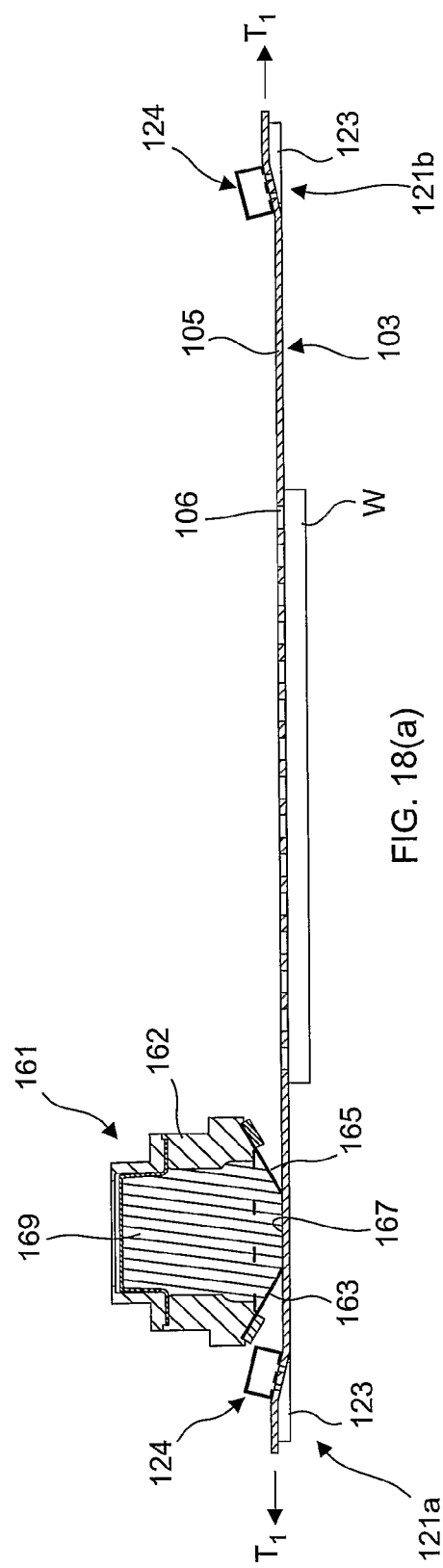

Prior to printing a workpiece W using the printing head 161, as illustrated in FIG. 18(a), the controller 159 acts to control the tensioning unit actuator 149 to actuate the tensioning units 126a-d to tension the printing screen 105 to a predeterminable tension $T_1$, where the tension $T_1$ is such as at least to render the printing screen 105 in a planar configuration, and the clamping unit actuator 155 to actuate the screen clamping units 121a, 121b to clamp the printing screen 105 and thereby fix the lateral, in-plane position thereof.

Figure 18B:
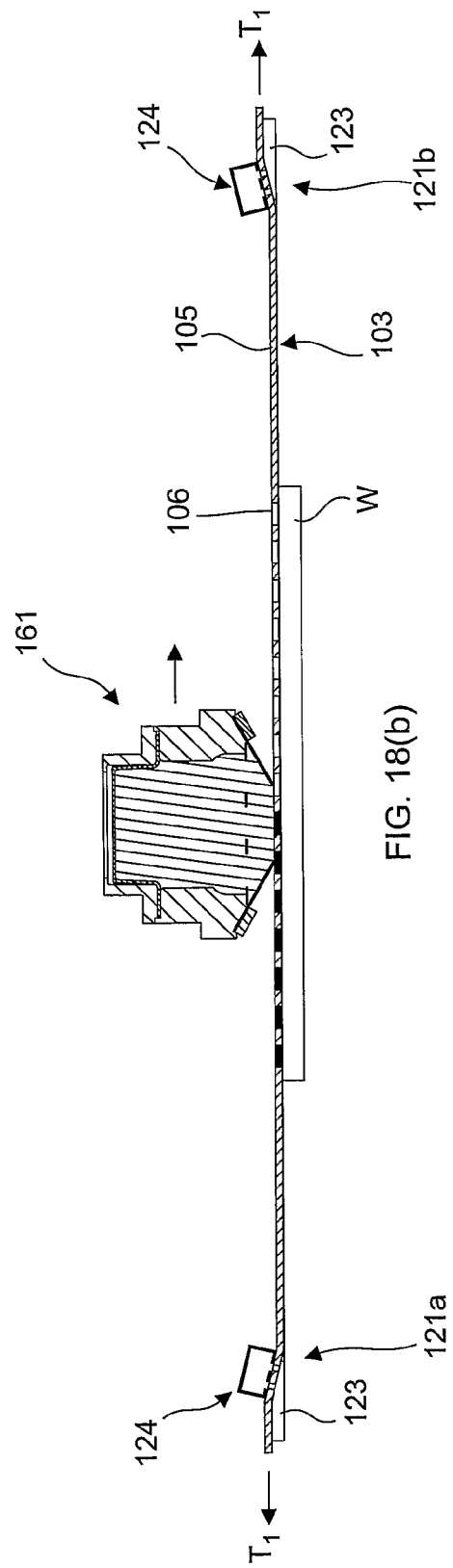

In a printing phase, as illustrated in FIG. 18(b), the screen clamping units 121a, 121b act to maintain the lateral, in-plane position of the printing screen 105 during traversal of the printing head 161 thereover, with the printing head 161 acting to force printing medium into the printing apertures 106 in the printing screen 105.

Following printing, and at the commencement of the separation phase, the controller 159 acts to control the clamping unit actuator 155 to de-actuate the first screen clamping unit

121*a* and thereby release the printing screen 105 from the clamped state thereat, and then control the jack actuator 175 to actuate the lifting jacks 173 to raise the first screen clamping unit 121*a* relative to the second screen clamping unit 121*b* and separate the printing screen 105 from the workpiece W.

In the separation phase, as illustrated in FIGS. 18(*c*) and (*d*), by raising the first screen clamping unit 121*a* relative to the second screen clamping unit 121*b*, the printing screen 105 is peeled away from the workpiece W in a controlled manner along an advancing peeling front from one edge of the workpiece W to leave a pattern of printed deposits 171 having the same pattern as the pattern of printing apertures 106 in the printing screen 105.

In this embodiment the screen clamping units 121*a*, 121*b* act to constrain the deflection of the printing screen 105 such that the deflection is uniform along the length of the advancing peeling front, thereby defining a flattened and skewed U-shape deflection profile. By constraining the axis of peeling in this manner, a more controlled peel is achieved as compared to arrangements where the peeling occurs along more than one axis and causes a "concave" deflection of the printing screen 105.

As described hereinabove, through tensioning the printing screen 105 to a tension $T_1$ which is lower than the high tension as currently employed by existing tensioning systems, the peeling effect in peeling the printing screen 105 from the workpiece W is promoted and provides for improved separation of the workpiece W from the printing screen 105, thereby providing printed deposits 171 of improved quality.

On completion of the separation phase, as illustrated in FIG. 18(*e*), the workpiece W is separated from the printing screen unit 103, and the above-described screen printing operation can be repeated in printing another workpiece W.

In one alternative embodiment the second screen clamping unit 121*b* could instead be configured to include lifting jacks 173 to provide for the second screen clamping unit 121*b* to be raised relative to the first screen clamping unit 121*a* where fixed to the support frame 120.

In another alternative embodiment both the first and second screen clamping units 121*a*, 121*b* could include lifting jacks 173 to provide for one of the screen clamping units 121*a*, 121*b* to be raised relative to the other of the screen clamping units 121*a*, 121*b*. In one embodiment the other of the screen clamping units 121*a*, 121*b* can be maintained at a fixed position while raising the one of the screen clamping units 121*a*, 121*b*. In another embodiment both the one and other of the screen clamping units 121*a*, 121*b* could be raised, where the one of the screen clamping units 121*a*, 121*b* is raised at a rate greater than the other of the screen clamping units 121*a*, 121*b*.

FIGS. 19 to 27 illustrate a support system for supporting a printing screen unit 203 in a screen printing operation in accordance with a fourth embodiment of the present invention.

Referring to FIG. 21, in this embodiment the printing screen unit 203 comprises a printing screen 205, here rectangular in shape, which includes a pattern of printing apertures 206 which define the pattern of deposits to be printed, attachment members 207 at the respective corners thereof to which attachment members 227 of a tensioning mechanism 218 are attached, as will be described in more detail hereinbelow and support elements 208, which are attached to one pair of opposite edges of the printing screen 205 to constrain deflection thereof, as will be described in more detail hereinbelow. It will be appreciated that the embodied pattern of printing apertures 206 is given only for the purposes of exemplification, and the pattern of printing apertures 206 could have any desired configuration. The pattern of printing apertures 206 can be formed, for example, by laser cutting or etching, as is well known in the art. In preferred embodiments the printing screen 205 comprises a sheet of a metal, such as stainless steel, or a respective plastic.

Referring to FIGS. 23 to 25, in this embodiment the attachment members 207 each comprise a re-inforcing element 209 for re-inforcing the respective corner of the printing screen 205, and a connector element 210 to which a tensioning unit 226*a*-*d* is connected, as will be described in more detail hereinbelow.

In this embodiment the reinforcing element 209 comprises a plate 211 which is attached, here bonded, to the upper surface of the printing screen 205 and includes first and second referencing surfaces 211*a*, 211*b* which provide for referencing of the position of the printing screen unit 203, as will be described in more detail hereinbelow.

In this embodiment the connector element 210 comprises an elongate rod 212 which extends along an axis extending through the center of the printing screen 205 and includes an enlarged head 213 which defines an engagement surface 214, in this embodiment a part-spherical surface.

In this embodiment the support elements 208 comprise elongate strips which extend along one pair of opposite edges of the printing screen 205, here the lateral edges of the printing screen 205 in the printing direction P. The support elements 208 act to constrain the deflection such that the deflection is uniform along the length of the advancing peeling fronts, thereby defining a flattened U-shape deflection profile. In a preferred embodiment the support elements 208 are configured to transmit in-plane tensioning forces, but resist axial bending thereof.

The support system comprises a support assembly 215 in which the printing screen unit 203 is supported, and a control unit 216 for controlling the operation of the support assembly 215.

The support assembly 215 comprises a support unit 217 in which the printing screen unit 203 is supported, and a tensioning mechanism 218 for tensioning the printing screen 205 of the printing screen unit 203.

The support unit 217 comprises a support frame 220, in this embodiment rectangular in shape, and first and second screen clamping units 221*a*, 221*b* which are disposed to one pair of opposite edges of the support frame 220 and operable to clamp the printing screen 205, when tensioned, in a predefined plane, as will be described in more detail hereinbelow. In this embodiment the support assembly 215 is configured such that the screen clamping units 221*a*, 221*b* are disposed at positions corresponding to the respective sides of the printing screen unit 203 in the printing direction P. In an alternative embodiment the support assembly 215 could be configured such that the screen clamping units 221*a*, 221*b* are disposed at positions corresponding to the respective ends of the printing screen unit 203 in the printing direction P.

In this embodiment the support frame 220 includes first and second referencing elements 222, 223 at respective ones of first and second adjacent corners thereof such as to allow for referencing of the position of the printing screen 205 of the printing screen unit 203, as will be described in more detail hereinbelow. In this embodiment the first referencing element 222 comprises first and second projections 222*a*, 222*b* which each define a reference position and are configured to engage respective ones of the reference surfaces 211*a*, 211*b* of the respective attachment member 207 in referencing the position of the same, and the second referencing element 223 comprises a projection 223*a* which defines a reference position and is configured to engage one of the reference surfaces 211a, 221b, here the first reference surface 211a, of the attachment member 207 at the adjacent corner of the support frame 220.

Referring particularly to FIG. 22, in this embodiment the screen clamping units 221a, 221b each comprise a screen clamping member 224, in this embodiment an elongate member having a planar lower surface which is operable to clamp the printing screen 205 in a fixed lateral, in-plane position, with the lower surface of the printing screen 205 being in the same plane as the lower edge of the support frame 220. In this embodiment the screen clamping member 224 comprises a hollow, elongate vacuum bar which includes vacuum apertures 225, here a plurality of elongate slots, in the lower surface thereof. On applying a vacuum to the screen clamping members 224, the screen clamping members 224 are clamped against the printing screen 205 by virtue of the applied vacuum acting on the surface of the printing screen 205 which is exposed at the vacuum apertures 225 in the respective screen clamping members 224.

The tensioning mechanism 218 comprises first to fourth tensioning units 226a-d for applying a tensioning force to opposed corners of the printing screen 205.

The tensioning units 226a-d each comprise an attachment member 227 which is attached to a respective one of the attachment members 207 of the printing screen unit 203, and an actuator 228, in this embodiment a pneumatic actuator, for generating a tensioning force which is connected to the attachment member 227, here fixedly, and a respective one of the corners of the support frame 220 about a pivot 230 to provide for tensioning of the respective attachment member 207 of the printing screen unit 203, and hence the printing screen 205, with the tensioning force.

Referring particularly to FIGS. 23 to 25, the attachment member 227 comprises a body 235 which includes a recess 236 for receiving the head 213 of the connector element 210 of a respective one of the attachment members 207 of the printing screen unit 203 and a slot 237 at the outer, forward edge thereof for receiving the elongate rod 212 of the connector element 210 of the respective attachment member 207. In this embodiment the recess 236 includes an engagement surface 238, here a part-cylindrical surface, at a forward, outer edge thereof which engages with the engagement surface 214, also here part-spherical, of the enlarged head 213 of the connector element 210 of the respective attachment member 207. With this configuration, each of the attachment members 207 of the printing screen unit 203 is pivotable relative to the respective attachment members 227 about axes parallel to the plane of the printing screen 205 such as to allow for free pivoting movement of the attachment members 207, and hence unrestrained deflection of the printing screen 205 when a central region of the printing screen 205 is deflected downwardly, as will be described in more detail hereinbelow.

The control unit 216 comprises a tensioning unit actuator 249, in this embodiment a pneumatic supply, which is operable to actuate the actuators 228 of the tensioning units 226a-d to apply predeterminable tensions to the printing screen 205 of the printing screen unit 203. The tensioning unit actuator 249 is connected to the actuator 228 of each of the respective tensioning units 226a-d, in this embodiment by respective pneumatic lines 253, such as to provide for actuation of the actuators 228 of the tensioning units 226a-d.

In this embodiment the tensioning unit actuator 249 is configured such that the tensioning mechanism 218 applies a tensioning force first to one, in this embodiment the first tensioning unit 226a such as to draw one corner of the printing screen unit 203 to a first reference position, as defined by the reference surfaces 211a, 221b of the attachment member 207 at the one corner of the printing screen unit 203 abutting the reference projections 222a, 222b at the one corner of the support frame 220, then a tensioning force to a second tensioning unit 226b which is adjacent the first tensioning unit 226a such as to draw the adjacent corner of the printing screen unit 203 to a second reference position, as defined by the one reference surface 211a of the adjacent attachment member 207 abutting the reference projection 223a at the adjacent corner of the support frame 220, and subsequently to the pair of tensioning units 226c, 226d to the other side of the printing screen unit 203, thereby to achieve an even tension to the printing screen 205. In this embodiment the sequencing of the tensioning of the tensioning units 226a-d is provided by throttle valves, which act to throttle the rate of pressure increase to the actuators 228 of the tensioning units 226a-d.

The control unit 216 further comprises a clamping unit actuator 255, in this embodiment a vacuum supply, which is operable to actuate the screen clamping units 221a, 221b to clamp the printing screen 205 in a fixed lateral, in-plane position. The clamping unit actuator 255 is connected to the screen clamping units 221a, 221b, in this embodiment by respective vacuum lines 257, such as to provide for actuation of the screen clamping units 221a, 221b.

The control unit 216 further comprises a controller 259 for controlling the tensioning unit actuator 249 and the clamping unit actuator 255 in a screen printing operation.

With this configuration, the support system enables for the application of differing tensions to the printing screen 205 of the printing screen unit 203.

In one embodiment the controller 259 is configured to control the tensioning unit actuator 249 to actuate the tensioning units 226a-d to tension the printing screen 205 to one tension during the entire screen printing operation, that is, both the printing and separation phases, and the clamping unit actuator 255 to actuate the screen clamping units 221a, 221b to clamp the printing screen 205 during the printing phase such as to prevent lateral, in-plane movement of the printing screen 205 and de-actuate the screen clamping units 221a, 221b prior to the separation phase such as to release the printing screen 205 from the clamped state.

In another embodiment the controller 259 is configured to tension the printing screen 205 to a first, high tension during the printing phase such as to prevent lateral, in-plane movement of the printing screen 205, and a second, lower tension during the separation phase in separating the printing screen 205 from a workpiece once printed, and the clamping unit actuator 255 to actuate the screen clamping units 221a, 221b to clamp the printing screen 205 during the printing phase such as to prevent lateral, in-plane movement of the printing screen 205 and de-actuate the screen clamping units 221a, 221b prior to the separation phase such as to release the printing screen 205 from the clamped state.

The present inventors have recognized that, through clamping the printing screen 205 so as to prevent lateral, in-plane movement thereof during the printing phase, the tensioning force applied to printing screen 205 during the printing phase can be reduced from the high tension currently used in existing tensioning systems. The tensioning force applied to the printing screen 205 during the printing phase need only be sufficient to render the printing screen 205 in the planar configuration as required for printing, and need not approach the high tensioning force employed by the current tensioning systems to fix the lateral, in-plane position of the printing screen 205.

In tensioning the printing screen 205 to a lower tension, the lower tensioning force enables the use of a lower separation force in separating the printing screen 205 from the workpiece. The use of a lower separation force is possible as the lower tensioning force provides for greater out-of plane deflection of the printing screen 205, which acts to promote the peeling action of the printing screen 205 in separating the printing screen 205 from a printed workpiece. In addition, in promoting the peeling action of the printing screen 205, a more regulated, progressive peeling action is achieved across the printing screen 205, with there being no high separation force acting to instantly separate the printing screen 205 from a printed workpiece as would occur when such a high separation force exceeds the adhesive effect of the remaining printing medium in contact with both the printing screen 205 and the workpiece. In addition, in providing for a much lower tensioning force during the separation phase, the stresses caused by the out-of-plane deflection of the printing screen 205 are so much lower than those created by the typical high tensioning force as not to cause any significant micro-displacement of the printing screen 205, and thereby provides for the printing of much improved deposits.

Operation of the support system will now be described hereinbelow.

In this embodiment the printing head 261 comprises an elongate main body 262, and first and second wiper blades 263, 265, here elongate elements, which are attached to a lower surface of the main body 262. The wiper blades 263, 265 are inwardly and downwardly directed and define an outlet aperture 267 through which printing material is delivered, and together with the main body 262 define a chamber 269 which contains printing medium.

One mode of operation of the support system will now be described hereinbelow with reference to FIGS. 26(a) to (e) of the accompanying drawings.

Prior to printing a workpiece W using the printing head 261, as illustrated in FIG. 26(a), the controller 259 acts to control the tensioning unit actuator 249 to actuate the tensioning units 226a-d to tension the printing screen 205 to a first tension $T_1$, where the first tension $T_1$ is such as at least to render the printing screen 205 in a planar configuration, and the clamping unit actuator 255 to actuate the screen clamping units 221a, 221b to clamp the printing screen 205 and thereby fix the lateral, in-plane position thereof.

In the printing phase, as illustrated in FIG. 26(b), the screen clamping units 221a, 221b act to maintain the lateral, in-plane position of the printing screen 205 during traversal of the printing head 261 thereover, with the printing head 261 acting to force printing medium into the printing apertures 206 in the printing screen 205.

Following printing, and at the commencement of the separation phase, the controller 259 acts to control the tensioning unit actuator 249 to actuate the tensioning units 226a-d to tension the printing screen 205 to a second tension $T_2$ which is lower than the first tension $T_1$ as applied during the printing phase, and the clamping unit actuator 255 to de-actuate the screen clamping units 221a, 221b, and thereby release the printing screen 205 from the clamped state.

In the separation phase, as illustrated in FIGS. 26(c) and (d), the printing screen 205 is peeled away from the workpiece W in a controlled manner along advancing peeling fronts from opposite edges of the workpiece W to leave a pattern of printed deposits 271 having the same pattern as the pattern of printing apertures 206 in the printing screen 205.

As described hereinabove, through tensioning the printing screen 205 to the second, lower tension $T_2$ during the separation phase, the peeling effect in peeling the printing screen 205 from the workpiece W is promoted and provides for improved separation of the workpiece W from the printing screen 205, thereby providing printed deposits 271 of improved quality.

On completion of the separation phase, as illustrated in FIG. 26(e), the workpiece W is separated from the printing screen unit 203, and the screen printing operation can be repeated in printing another workpiece W.

Another mode of operation of the support system will now be described hereinbelow with reference to FIGS. 27(a) to (e) of the accompanying drawings.

Prior to printing a workpiece W using the printing head 261, as illustrated in FIG. 27(a), the controller 259 acts to control the tensioning unit actuator 249 to actuate the tensioning units 226a-d to tension the printing screen 205 to a pre-determinable tension $T_1$, where the tension $T_1$ is such as at least to render the printing screen 205 in a planar configuration, and the clamping unit actuator 255 to actuate the screen clamping units 221a, 221b to clamp the printing screen 205 and thereby fix the lateral, in-plane position thereof.

In the printing phase, as illustrated in FIG. 27(b), the screen clamping units 221a, 221b act to maintain the lateral, in-plane position of the printing screen 205 during traversal of the printing head 261 thereover, with the printing head 261 acting to force printing medium into the printing apertures 206 in the printing screen 205.

Following printing, and at the commencement of the separation phase, the controller 259 acts to control the clamping unit actuator 255 to de-actuate the screen clamping units 221a, 221b, and thereby release the printing screen 205 from the clamped state.

In the separation phase, as illustrated in FIGS. 27(c) and (d), the printing screen 205 is peeled away from the workpiece W in a controlled manner along advancing peeling fronts from opposite edges of the workpiece W to leave a pattern of printed deposits 271 having the same pattern as the pattern of printing apertures 206 in the printing screen 205.

As described hereinabove, through tensioning the printing screen 205 to a tension $T_1$ which is lower than the high tension currently employed by existing tensioning systems, the peeling effect in peeling the printing screen 205 from the workpiece W is promoted and provides for improved separation of the workpiece W from the printing screen 205, thereby providing printed deposits 271 of improved quality.

On completion of the separation phase, as illustrated in FIG. 27(e), the workpiece W is separated from the printing screen unit 203, and the screen printing operation can be repeated in printing another workpiece W.

FIGS. 28 to 30 illustrate one modified connection for the attachment members 207 of the printing screen unit 203 and the attachment members 227 of the tensioning units 226a-d of the support assembly 215 for the support system of FIG. 19.

In this embodiment the attachment members 207 each similarly comprise a re-inforcing element 209 for re-inforcing the respective corner of the printing screen 205, and a connector element 210 to which a tensioning unit 226a-d is connected.

In this embodiment the re-inforcing element 209 again similarly comprises a plate 211 which is attached, here bonded, to the upper surface of the printing screen 205 and includes first and referencing surfaces 211a, 211b which provide for the referencing of the position of the printing screen unit 203.

In this embodiment the connector element 210 comprises an arcuate, hook element 273, here formed from a rolled sheet, which defines a recess 275 for receiving the attachment member 227 of the respective tensioning unit 226a-d which defines an engagement surface 277, here a part-cylindrical surface, which is disposed in the plane of the printing screen 205 and extends orthogonally to a tensioning axis extending from the respective corner of the printing screen 205 and through the center of the printing screen 205, and includes a slot 278 located on the tensioning axis for receiving the respective attachment member 227.

The attachment member 227 of each tensioning unit 226a-d comprises an elongate rod 279 which extends along the tensioning axis and includes an enlarged head 281 which defines an engagement surface 283, in this embodiment a part-spherical spherical surface, which engages the engagement surface 277 of the recess 275 in the hook element 273 of the connector element 210.

With this configuration, each of the attachment members 207 of the printing screen 203 is pivotable relative to the respective attachment members 227 of the tensioning units 226a-d about axes parallel to the plane of the printing screen 205 such as to allow for free pivoting movement of the attachment members 207, and hence unrestrained deflection of the printing screen 205 when a central region of the printing screen 205 is deflected downwardly.

FIGS. 31 to 33 illustrate another modified connection for the attachment members 207 of the printing screen unit 203 and the attachment members 227 of the tensioning units 226a-d of the support assembly 215 for the support system of FIG. 19.

In this embodiment the attachment members 207 of the printing screen unit 203 each comprise a re-inforcing element 209 for reinforcing the respective corner of the printing screen 205 which includes a connector aperture 284, here of key hole shape, to which the attachment member 227 of a respective one of the tensioning units 226a-d is connected.

In this embodiment the re-inforcing element 209 comprises first and second plates 211', 211" between which the printing screen 205 is attached, here bonded, and define first and second referencing surfaces 211a, 211b which provide for the referencing of the position of the printing screen unit 203.

In this embodiment the attachment member 227 comprises a body 285 which includes an upstanding lug 287 for engagement in the connector aperture 284 in the reinforcing element 209 of the respective attachment member 207. In this embodiment the lug 285 extends along an axis orthogonal to the plane of the printing screen 205 and includes an enlarged head 287 for captively retaining the respective attachment member 207 thereon.

With this configuration, the attachment members 227 of the respective tensioning units 226a-d provide for some pivoting movement of the respective attachment members 207 of the printing screen unit 203 thereto, and hence accommodate deflection of the printing screen 205 when a central region of the printing screen 205 is deflected downwardly in the separation phase in separating the printing screen 205 from a workpiece.

FIGS. 34 to 39 illustrate a support system for supporting a printing screen unit 303 in a screen printing operation in accordance with a fifth embodiment of the present invention.

Referring to FIG. 36, in this embodiment the printing screen unit 303 comprises a printing screen 305, here rectangular in shape, which includes a pattern of printing apertures 306 which define the pattern of deposits to be printed, and first and second attachment members 307a, 307b, here elongate elements, attached to one pair of opposite edges of the printing screen 305 to which attachment members 328 of a tensioning mechanism 318 are attached, as will be described in more detail hereinbelow. It will be appreciated that the embodied pattern of printing apertures 306 is given only for the purposes of exemplification, and the pattern of printing apertures 306 could have any desired configuration. The pattern of printing apertures 306 can be formed, for example, by laser cutting or etching, as is well known in the art. In preferred embodiments the printing screen 305 comprises a sheet of a metal, such as stainless steel, or a plastic.

The support system comprises a support assembly 315 in which the printing screen unit 303 is supported, and a control unit 316 for controlling the operation of the support assembly 315.

The support assembly 315 comprises a support unit 317 in which the printing screen unit 303 is supported, and a tensioning mechanism 318 for tensioning the printing screen 305 of the printing screen unit 303.

The support unit 317 comprises a support frame 320, in this embodiment rectangular in shape, and first and second screen clamping units 321a, 321b which are disposed to one pair of opposite edges of the support frame 320 and operable to clamp the printing screen 305, when tensioned, in a predefined plane, as will be described in more detail hereinbelow. In this embodiment the support assembly 315 is configured such that the screen clamping units 321a, 321b are disposed at positions corresponding to the respective sides of the printing screen unit 303 in the printing direction P. In an alternative embodiment the support assembly 315 could be configured such that the screen clamping units 321a, 321b are disposed at positions corresponding to the respective ends of the printing screen unit 303 in the printing direction P.

In this embodiment the support frame 320 includes first and second referencing elements 322, 323 at respective ones of first and second adjacent corners thereof such as to allow for referencing of the position of the printing screen 305 of the printing screen unit 303, as will be described in more detail hereinbelow. In this embodiment the first referencing element 322 comprises a projection 322' which defines a reference position and is configured to engage one end of one, in this embodiment the first attachment member 307a of the printing screen unit 303 in referencing the position of the same, and the second referencing element 323 comprises a projection 323' which defines a reference position and is configured to engage the other end of the one, that is, first, attachment member 307a of the printing screen unit 303 in referencing the position of the same.

Referring particularly to FIG. 37, in this embodiment the screen clamping units 321a, 321b each comprise a screen clamping member 324, in this embodiment an elongate member having a planar lower surface which is operable to clamp the printing screen 305 in a fixed lateral, in-plane position, with the lower surface of the printing screen 305 being in the same plane as the lower edge of the support frame 320. In this embodiment the screen clamping member 324 comprises a hollow, elongate vacuum bar which includes vacuum apertures 325, here a plurality of elongate slots, in the lower surface thereof. On applying a vacuum to the screen clamping members 324, the screen clamping members 324 are clamped against the printing screen 305 by virtue of the applied vacuum acting on the surface of the printing screen 305 which is exposed at the vacuum apertures 325 in the respective screen clamping members 324.

The tensioning mechanism 318 comprises first and second tensioning units 326a, 326b for applying a tensioning force to respective ones of the attachment members 307a, 307b of the printing screen unit 303, in this embodiment in the direction of printing.

The tensioning units 326a, 326b each comprise an attachment member 327 which is attached to a respective one of the attachment members 307a, 307b of the printing screen unit 303, and an actuator 328, in this embodiment a pneumatic actuator, for generating a tensioning force which is connected to the attachment member 327, here fixedly, and to a respective one of opposing sides of the support frame 320 about a pivot 330 to provide for tensioning of the respective attachment member 307a, 307b of the printing screen unit 303, and hence the printing screen 305, with the tensioning force.

The control unit 316 comprises a tensioning unit actuator 349, in this embodiment a pneumatic supply, which is operable to actuate the actuators 328 of the tensioning units 326a, 326b to apply predeterminable tensions to the printing screen 305 of the printing screen unit 303. The tensioning unit actuator 349 is connected to the actuator 328 of each of the respective tensioning units 326a, 326b, in this embodiment by respective pneumatic lines 353, such as to provide for actuation of the actuators 328 of the tensioning units 326a, 326b.

In this embodiment the tensioning unit actuator 349 is configured such that the tensioning mechanism 318 applies a tensioning force first to one, in this embodiment the first tensioning unit 326a such as to draw one, in this embodiment the first attachment member 307a of the printing screen unit 303 to a reference position, as defined by one end of the first attachment member 307a of the printing screen unit 303 abutting the reference projection 322' at the one corner of the support frame 320 and the other end of the first attachment member 307a abutting the reference projection 323' at the other adjacent corner of the support frame 320, and then a tensioning force to the other, second tensioning unit 326b to the other side of the printing screen unit 303, thereby to achieve an even tension to the printing screen 305. In this embodiment the sequencing of the tensioning of the tensioning units 326a, 326b is provided by throttle valves, which act to throttle the rate of pressure increase to the actuators 328 of the tensioning units 326a, 326b.

The control unit 316 further comprises a clamping unit actuator 355, in this embodiment a vacuum supply, which is operable to actuate the screen clamping units 321a, 321b to clamp the printing screen 305 in a fixed lateral, in-plane position. The clamping unit actuator 355 is connected to the screen clamping units 321a, 321b, in this embodiment by respective vacuum lines 357, such as to provide for actuation of the screen clamping units 321a, 321b.

The control unit 316 further comprises a controller 359 for controlling the tensioning unit actuator 349 and the clamping unit actuator 355 in a screen printing operation.

With this configuration, the support system enables for the application of differing tensions to the printing screen 305 of the printing screen unit 303.

In one embodiment the controller 359 is configured to control the tensioning unit actuator 349 to actuate the tensioning units 326a, 326b to tension the printing screen 305 to one pre-determinable tension during the entire screen printing operation, that is, both the printing and separation phases, and the clamping unit actuator 355 to actuate the screen clamping units 321a, 321b to clamp the printing screen 305 during the printing phase such as to prevent lateral, in-plane movement of the printing screen 305 and de-actuate the screen clamping units 321a, 321b prior to the separation phase such as to release the printing screen 305 from the clamped state.

In another embodiment the controller 359 is configured to tension the printing screen 305 to a first tension during the printing phase such as to prevent lateral, in-plane movement of the printing screen 305, and a second tension lower than the first tension during the separation phase in separating the printing screen 305 from a workpiece once printed, and the clamping unit actuator 355 to actuate the screen clamping units 321a, 321b to clamp the printing screen 305 during the printing phase such as to prevent lateral, in-plane movement of the printing screen 305 and de-actuate the screen clamping units 321a, 321b prior to the separation phase such as to release the printing screen 305 from the clamped state.

The present inventors have recognized that, through clamping the printing screen 305 so as to prevent lateral, in-plane movement thereof during the printing phase, the tensioning force applied to printing screen 305 during the printing phase can be reduced from the high tension currently used in existing tensioning systems. The tensioning force applied to the printing screen 305 during the printing phase need only be sufficient to render the printing screen 305 in the planar configuration as required for printing, and need not approach the high tensioning force employed by the current tensioning systems to fix the lateral, in-plane position of the printing screen 305.

In tensioning the printing screen 305 to a much lower tension, the lower tensioning force enables the use of a lower separation force in separating the printing screen 305 from the workpiece. The use of a lower separation force is possible as the lower tensioning force provides for greater out-of plane deflection of the printing screen 305, which acts to promote the peeling action of the printing screen 305 in separating the printing screen 305 from a printed workpiece. In addition, in promoting the peeling action of the printing screen 305, a more regulated, progressive peeling action is achieved across the printing screen 305, with there being no high separation force acting to instantly separate the printing screen 305 from a printed workpiece as would occur when such a high separation force exceeds the adhesive effect of the remaining printing medium in contact with both the printing screen 305 and the workpiece. In addition, in providing for a much lower tensioning force during the separation phase, the stresses caused by the out-of-plane deflection of the printing screen 305 are so much lower than those created by the typical high tensioning force as not to cause any significant micro-displacement of the printing screen 305, and thereby provides for the printing of much improved deposits.

Operation of the support system will now be described hereinbelow.

In this embodiment the printing head 361 comprises an elongate main body 362, and first and second wiper blades 363, 365, here elongate elements, which are attached to a lower surface of the main body 362. The wiper blades 363, 365 are inwardly and downwardly directed and define an outlet aperture 367 through which printing medium is delivered, and together with the main body 362 define a chamber 369 which contains printing medium.

One mode of operation of the support system will now be described hereinbelow with reference to FIGS. 38(a) to (e) of the accompanying drawings.

Prior to printing a workpiece W using the printing head 361, as illustrated in FIG. 38(a), the controller 359 acts to control the tensioning unit actuator 349 to actuate the tensioning units 326a, 326b to tension the printing screen 305 to a first tension $T_1$, where the first tension $T_1$ is such as at least to render the printing screen 305 in a planar configuration, and the clamping unit actuator 355 to actuate the screen clamping units 321a, 321b to clamp the printing screen 305 and thereby fix the lateral, in-plane position thereof.

In the printing phase, as illustrated in FIG. 38(b), the screen clamping units 321a, 321b act to maintain the lateral, in-plane position of the printing screen 305 during traversal of the printing head 361 thereover, with the printing head 361 acting to force printing medium into the printing apertures 306 in the printing screen 305.

Following printing, and at the commencement of the separation phase, the controller 359 acts to control the tensioning unit actuator 349 to actuate the tensioning units 326a, 326b to tension the printing screen 305 to a second tension $T_2$ which is lower than the first tension $T_1$ as applied during the printing phase, and the clamping unit actuator 355 to de-actuate the screen clamping units 321a, 321b, and thereby release the printing screen 305 from the clamped state.

Figure 38C:
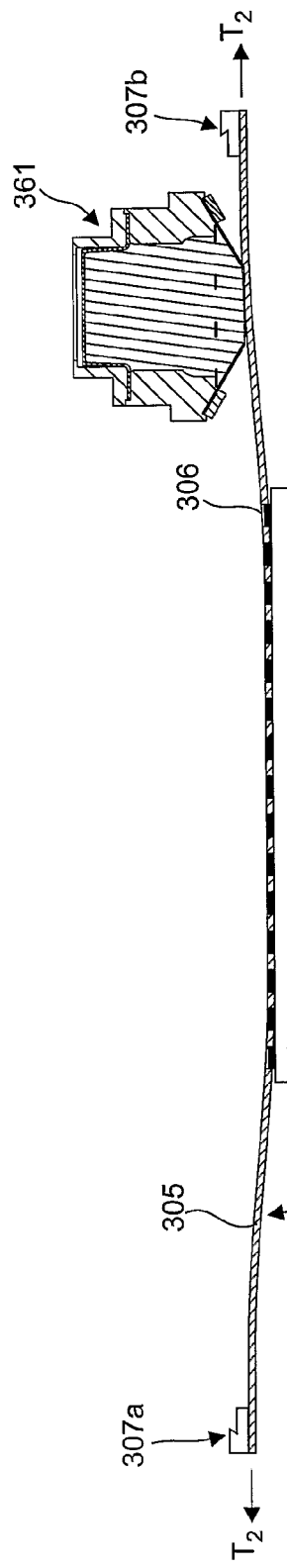
Figure 38D:
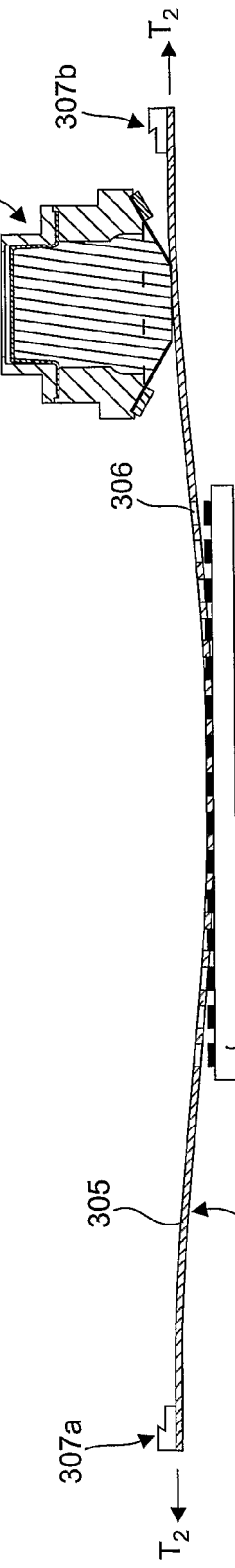

In the separation phase, as illustrated in FIGS. 38(c) and (d), the printing screen 305 is peeled away from the workpiece W in a controlled manner along advancing peeling fronts from opposite edges of the workpiece W to leave a pattern of printed deposits 371 having the same pattern as the pattern of printing apertures 306 in the printing screen 305.

In this embodiment, the attachments members 307a, 307b of the printing screen unit 303 act to constrain the deflection of the printing screen 305 such that the deflection is uniform along the length of the advancing peeling fronts, thereby defining a flattened U-shape deflection profile. By constraining the axis of peeling in this manner, a more controlled peel is achieved as compared to arrangements where the peeling occurs along more than one and causes a "concave" deflection of the printing screen 305.

As described hereinabove, through tensioning the printing screen 305 to the second, lower tension $T_2$ during the separation phase, the peeling effect in peeling the printing screen 305 from the workpiece W is promoted and provides for improved separation of the workpiece W from the printing screen 305, thereby providing printed deposits 371 of improved quality.

Figure 38E:
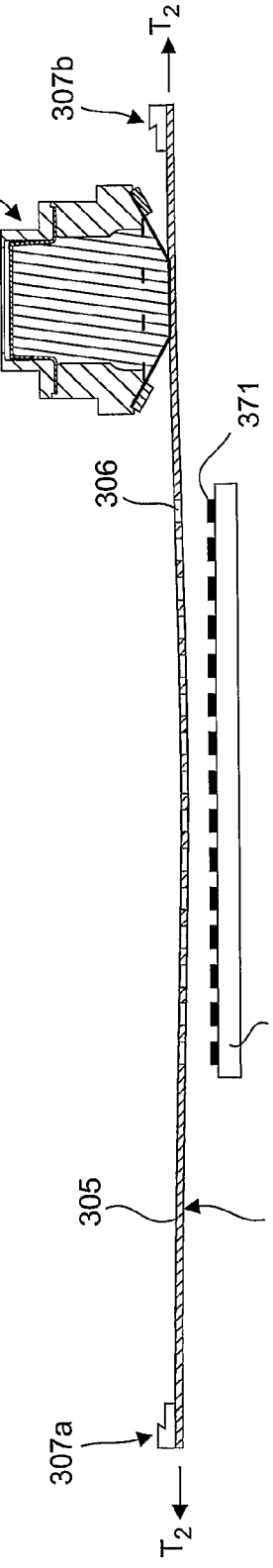

On completion of the separation phase, as illustrated in FIG. 38(e), the workpiece W is separated from the printing screen unit 303, and the above-described screen printing operation can be repeated in printing another workpiece W.

Another mode of operation of the support system will now be described hereinbelow with reference to FIGS. 39(a) to (e) of the accompanying drawings.

Prior to printing a workpiece W using the printing head 361, as illustrated in FIG. 39(a), the controller 359 acts to control the tensioning unit actuator 349 to actuate the tensioning units 326a, 326b to tension the printing screen 305 to a predeterminable tension $T_1$, where the tension $T_1$ is such as at least to render the printing screen 305 in a planar configuration, and the clamping unit actuator 355 to actuate the screen clamping units 321a, 321b to clamp the printing screen 305 and thereby fix the lateral, in-plane position thereof.

In the printing phase, as illustrated in FIG. 39(b), the screen clamping units 321a, 321b act to maintain the lateral, in-plane position of the printing screen 305 during traversal of the printing head 361 thereover, with the printing head 361 acting to force printing medium into the printing apertures 306 in the printing screen 305.

Following printing, and at the commencement of the separation phase, the controller 359 acts to control the clamping unit actuator 355 to de-actuate the screen clamping units 321a, 321b, and thereby release the printing screen 305 from the clamped state.

In the separation phase, as illustrated in FIGS. 39(c) and (d), the printing screen 305 is peeled away from the workpiece W in a controlled manner along advancing peeling fronts from opposite edges of the workpiece W to leave a pattern of printed deposits 371 having the same pattern as the pattern of printing apertures 306 in the printing screen 305.

In this embodiment, the attachment members 307a, 307b of the printing screen unit 303 act to constrain the deflection of the printing screen 305 such that the deflection is uniform along the length of the advancing peeling fronts, thereby defining a flattened U-shape deflection profile. By constraining the axis of peeling in this manner, a more controlled peel is achieved as compared to arrangements where the peeling occurs along more than one axis and causes a "concave" deflection of the printing screen 305.

As described hereinabove, through tensioning the printing screen 305 to a tension $T_1$ which is lower than the high tension currently employed by existing tensioning systems, the peeling effect in peeling the printing screen 305 from the workpiece W is promoted and provides for improved separation of the workpiece W from the printing screen 305, thereby providing printed deposits 371 of improved quality.

On completion of the separation phase, as illustrated in FIG. 39(e), the workpiece W is separated from the printing screen unit 303, and the above-described screen printing operation can be repeated in printing another workpiece W.

FIGS. 40 to 44 illustrate a support system for supporting a printing screen unit 403 in a screen printing operation in accordance with a sixth embodiment of the present invention.

Referring to FIG. 42, in this embodiment the printing screen unit 403 comprises a printing screen 405, here rectangular in shape, which includes a pattern of printing apertures 406 which define the pattern of deposits to be printed, a rigid screen frame 407, here rectangular in shape, to which the printing screen 405 is tensioned, and at least one tensioning element 408, in this embodiment a sheet of woven fabric, which connects the printing screen 405 to the screen frame 407 and maintains the printing screen 405 at a fixed, predeterminable tension $T_1$. It will be appreciated that the embodied pattern of printing apertures 406 is given only for the purposes of exemplification, and the pattern of printing apertures 406 could have any desired configuration. The pattern of printing apertures 406 can be formed, for example, by laser cutting or etching, as is well known in the art. In preferred embodiments the printing screen 405 comprises a sheet of a metal, such as stainless steel, or a plastic.

The support system comprises a support assembly 415 in which the printing screen unit 403 is supported, and a control unit 416 for controlling the operation of the support assembly 415.

The support assembly 415 comprises a support unit 417 in which the printing screen unit 403 is supported.

The support unit 417 comprises a support frame 420, in this embodiment rectangular in shape, and first and second screen clamping units 421a, 421b which are disposed to one pair of opposite edges of the support frame 420 and operable to clamp the printing screen 405 in a pre-defined plane, as will be described in more detail hereinbelow. In this embodiment the support assembly 415 is configured such that the screen clamping units 421a, 421b are disposed at positions corresponding to the respective sides of the printing screen unit 403 in the printing direction P. In an alternative embodiment the support assembly 415 could be configured such that the screen clamping units 421a, 421b are disposed at positions corresponding to the respective ends of the printing screen unit 403 in the printing direction P.

In this embodiment the support frame 420 includes first to fourth referencing elements 422a-d at respective ones of the corners thereof such as to allow for referencing of the position of the printing screen 405 of the printing screen unit 403. In this embodiment the referencing elements 422a-d each comprise a referencing block 423 which includes a cut-out 424 which receives the respective corner of the screen frame 407, such that the printing screen unit 403 is referenced when the corners of the screen frame 407 are each located in respective ones of the cut-outs 424 in the referencing blocks 423. In this embodiment the referencing units 422*a-d* each include a clamp 425 for clamping the printing screen unit 403 to the support frame 420.

Referring particularly to FIG. 43, in this embodiment the screen clamping units 421*a*, 421*b* each comprise a screen clamping member 427, in this embodiment an elongate member having a planar lower surface which is operable to clamp the printing screen 405 in a fixed lateral, in-plane position. In this embodiment the screen clamping member 427 comprises a hollow, elongate vacuum bar which includes vacuum apertures 429, here a plurality of elongate slots, in the lower surface thereof. On applying a vacuum to the screen clamping members 427, the screen clamping members 427 are clamped against the printing screen 405 by virtue of the applied vacuum acting on the surface of the printing screen 405 which is exposed at the vacuum apertures 429 in the respective screen clamping members 427.

The control unit 416 comprises a clamping unit actuator 455, in this embodiment a vacuum supply, which is operable to actuate the clamping units 421*a*, 421*b* to clamp the printing screen 405 in a fixed lateral, in-plane position. The clamping unit actuator 455 is connected to the screen clamping units 421*a*, 421*b*, in this embodiment by respective vacuum lines 457, such as to provide for actuation of the screen clamping units 421*a*, 421*b*.

The control unit 416 further comprises a controller 459 for controlling the clamping unit actuator 455 in a screen printing operation.

In this embodiment the controller 459 is configured to control the clamping unit actuator 455 to actuate the screen clamping units 421*a*, 421*b* to clamp the printing screen 405 during the printing phase such as to prevent lateral, in-plane movement of the printing screen 405 during the printing phase, with the screen clamping units 421*a*, 421*b* being de-actuated prior to the separation phase such as to release the printing screen 405 from the clamped state.

The present inventors have recognized that, through clamping the printing screen 405 so as to prevent lateral, in-plane movement thereof during the printing phase, the tensioning force applied to printing screen 405 can be reduced from the high tension currently used in existing tensioning systems. The tensioning force applied to the printing screen 405 need only be sufficient to render the printing screen 405 in the planar configuration as required for printing, and need not approach the high tensioning force employed by the current tensioning systems to fix the lateral, in-plane position of the printing screen 405.

In tensioning the printing screen 405 to a much lower tension, the lower tensioning force enables the use of a lower separation force in separating the printing screen 405 from the workpiece. The use of a lower separation force is possible as the lower tensioning force provides for greater out-of-plane deflection of the printing screen 405, which acts to promote the peeling action of the printing screen 405 in separating the printing screen 405 from a printed workpiece. In addition, in promoting the peeling action of the printing screen 405, a more regulated, progressive peeling action is achieved across the printing screen 405, with there being no high separation force acting to instantly separate the printing screen 405 from a printed workpiece as would occur when such a high separation force exceeds the adhesive effect of the remaining printing medium in contact with both the workpiece and the printing screen 405. In addition, in providing for a much lower tensioning force during the separation phase, the stresses caused by the out-of-plane deflection of the printing screen 405 are so much lower than those created by the typical high tensioning force as not to cause any significant micro-displacement of the printing screen 405, and thereby provides for the printing of much improved deposits.

Operation of the support system will now be described hereinbelow with reference to FIGS. 44(*a*) to (*e*) of the accompanying drawings.

In this embodiment the printing head 461 comprises an elongate main body 462, and first and second wiper blades 463, 465, here elongate elements, which are attached to a lower surface of the main body 462. The wiper blades 463, 465 are inwardly and downwardly directed and define an outlet aperture 467 through which printing material is delivered, and together with the main body 462 define a chamber 469 which contains printing medium.

Prior to printing a workpiece W using the printing head 461, as illustrated in FIG. 44(*a*), the controller 459 acts to control the tensioning unit actuator 449 to actuate the clamping unit actuator 455 to actuate the screen clamping units 421*a*, 421*b* to clamp the printing screen 405 and thereby fix the lateral, in-plane position thereof.

In the printing phase, as illustrated in FIG. 44(*b*), the clamping units 421*a*, 421*b* act to fix the lateral, in-plane position of the printing screen 405 during traversal of the printing head 461 thereover, with the printing head 461 acting to force printing medium into the printing apertures 406 in the printing screen 405.

Following printing, and at the commencement of the separation phase, the controller 459 acts to control the clamping unit actuator 455 to de-actuate the screen clamping units 421*a*, 421*b*, and thereby release the printing screen 405 from the clamped state.

In the separation phase, as illustrated in FIGS. 44(*c*) and (*d*), the printing screen 405 is peeled away from the workpiece W in a controlled manner along advancing peeling fronts from opposite edges of the workpiece W to leave a pattern of printed deposits 471 having the same pattern as the pattern of printing apertures 406 in the printing screen 405.

As described hereinabove, by virtue of the printing screen 405 being tensioned to a lower tension $T_1$ during the separation phase, the peeling effect in peeling the printing screen 405 from the workpiece W is promoted and provides for improved separation of the workpiece W from the printing screen 405, thereby providing printed deposits 471 of improved quality.

On completion of the separation phase, as illustrated in FIG. 44(*e*), the workpiece W is separated from the printing screen unit 403, and the above-described screen printing operation can be repeated in printing another workpiece W.

Finally, it will be understood that the present invention has been described in its preferred embodiments and can be modified in many different ways without departing from the scope of the invention as defined by the appended claims.

For example, in the first-described embodiment the screen guiding units 21*a*, 21*b* could be omitted. Although in this embodiment the axis in which the printing screen 5 of the printing screen unit 3 is peeled from the workpiece W is not constrained, the support assembly 15 still advantageously provides for improved peeling of the printing screen 5 through the reduced tensioning of the printing screen 5 in the separation phase.

Also, the printing head 61, 161, 261, 361, 461 of the above-described embodiments could be replaced by any printing head which has a construction capable of forcing printing material into the printing apertures 6, 106, 206, 306, 406 in the printing screens 5, 105, 205, 305, 405 of the printing screen units 3, 103, 203, 303, 403, and indeed could be a conventional squeegee.

Further, in other embodiments the screen clamping units 121*a, b*, 221*a, b*, 321*a, b*, 421*a, b* could be configured to provide for clamping of the lateral, in-plane position of the printing screen 105, 205, 305, 405 by other means, such as mechanical or electromagnetic clamping.

In the above-described embodiments separation of a workpiece W from the printing screen 5, 105, 205, 305, 405 is achieved by lowering the workpiece W from the printing screen 5, 105, 205, 305, 405. In other embodiments separation of a workpiece W from the printing screen 5, 105, 205, 305, 405 could be achieved by raising the printing screen 5, 105, 205, 305, 405 from a workpiece W, or indeed raising the printing screen 5, 105, 205, 305, 405 and lowering a workpiece W.

The invention claimed is:

1. A support system for supporting a printing screen unit in a screen printing machine, the support system including:
   a support assembly comprising a support unit for supporting a printing screen unit, the printing screen unit comprising a printing screen including printing apertures through which printing medium is printed onto a workpiece, a tensioning mechanism for tensioning the printing screen, and a clamping mechanism for clamping the printing screen; and
   a control unit for controlling operation of the support assembly, wherein the control unit is configured (i) to actuate the tensioning mechanism to tension the printing screen, and (ii) to actuate the clamping mechanism to clamp the printing screen in a printing phase in printing printing medium onto a workpiece so as to fix the lateral, in-plane position of the printing screen, and to de-actuate the clamping mechanism to release clamping of the printing screen in a separation phase in separating the printing screen unit and the workpiece.

2. The support system of claim 1, wherein the tensioning mechanism is configured to tension the printing screen to one predeterminable tension in a screen printing operation.

3. The support system of claim 1, wherein the tensioning mechanism is configured to tension the printing screen to a first tension in a printing phase in printing printing medium onto a workpiece, and a second tension, which is lower than the first tension, in a separation phase in separating the printing screen unit and a workpiece.

4. The support system of claim 1, wherein the tensioning mechanism comprises at least first and second tensioning units for tensioning the printing screen.

5. The support system of claim 4, wherein the tensioning units are configured to apply the tensioning forces along intersecting axes, and preferably the axes intersect at a center of the printing screen.

6. The support system of claim 1, wherein the support unit further comprises first and second screen guiding units for guiding the printing screen which are disposed to opposite edges of the printing screen.

7. The support system of claim 6, wherein the screen guiding units act to constrain deflection of the printing screen.

8. The support system of claim 6, wherein the screen guiding units are disposed to ends of the printing screen in the direction of screen printing.

9. The support system of claim 6, wherein the screen guiding units are disposed to sides of the printing screen in the direction of screen printing.

10. The support system of claim 1, wherein the clamping mechanism comprises first and second screen clamping units disposed to opposite edges of the printing screen.

11. The support system of claim 10, wherein the screen clamping units are disposed to opposite ends of the printing screen in the direction of screen printing.

12. The support system of claim 10, wherein the screen clamping units are disposed to opposite sides of the printing screen in the direction of screen printing.

13. The support system of claim 10, wherein the screen clamping units comprise elongate units which extend along the respective ones of the edges of the printing screen.

14. The support system of claim 10, wherein the screen clamping units comprise vacuum clamping units.

15. The support system of claim 1, further comprising:
   a printing screen unit, the printing screen unit including a pattern of apertures through which printing medium is printed onto a workpiece in a printing phase.

16. The support system of claim 15, wherein the printing screen unit includes first and second attachment members attached to opposite edges of the printing screen.

17. The support system of claim 16, wherein the attachment members each extend along a length of the respective edge of the printing screen.

18. The support system of claim 16, wherein the attachment members are attached to opposite ends of the printing screen in the direction of screen printing.

19. The support system of claim 16, wherein the attachment members are attached to opposite sides of the printing screen in the direction of screen printing.

20. The support system of claim 15, wherein the printing screen unit includes first and second support elements disposed to opposed edges of the printing screen such as to constrain deflection of the printing screen.

21. The support system of claim 20, wherein the support elements each extend along a length of a respective edge of the printing screen.

22. The support system of claim 20, wherein the support elements are disposed to opposite ends of the printing screen in the direction of screen printing.

23. The support system of claim 20, wherein the support elements are disposed to opposite sides of the printing screen in the direction of screen printing.

24. A method of supporting a printing screen unit in a screen printing machine, the method comprising the steps of:
   providing a printing screen unit, the printing screen unit comprising a printing screen including a pattern of printing apertures through which printing medium is printed onto a workpiece;
   actuating a tensioning mechanism to tension the printing screen;
   actuating a clamping mechanism to clamp the printing screen so as to fix the lateral, in-plane position of the printing screen;
   printing printing medium through the pattern of apertures in the printing screen;
   de-actuating the clamping mechanism to release clamping of the printing screen; and
   separating the printing screen unit from the workpiece.

25. The method of claim 24, wherein the step of actuating the tensioning mechanism comprises the step of:
   tensioning the printing screen to one predeterminable tension in a screen printing operation.

26. The method of claim 25, wherein the tensioning forces are applied along intersecting axes, and preferably the axes intersect at a center of the printing screen.

27. The method of claim 24, wherein the step of actuating the tensioning mechanism comprises the steps of:

tensioning the printing screen to a first tension prior to the step of printing printing medium onto the workpiece; and tensioning the printing screen to a second tension, which is lower than the first tension, prior to the step of separating the printing screen unit from the workpiece.

28. The method of claim 27, wherein the tensioning forces are applied along intersecting axes, and preferably the axes intersect at a center of the printing screen.

29. The method of claim 24, wherein the step of actuating the clamping mechanism to clamp the printing screen comprises the step of:

clamping the printing screen at opposite edges of the printing screen.

30. The method of claim 29, wherein the printing screen is clamped at opposite ends in the direction of screen printing.

31. The method of claim 29, wherein the printing screen is clamped at opposite sides in the direction of screen printing.

32. The method of claim 29, wherein the printing screen is clamped along the respective ones of the edges of the printing screen.

* * * * *